(12) United States Patent
Lam et al.

(10) Patent No.: US 6,452,802 B2
(45) Date of Patent: Sep. 17, 2002

(54) SYMMETRICAL PACKAGE FOR SEMICONDUCTOR DIE

(75) Inventors: Allen K. Lam, Fremont; Richard K. Williams; Alex K. Choi, both of Cupertino, all of CA (US)

(73) Assignee: Advanced Analogic Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/898,212

(22) Filed: Jul. 2, 2001

Related U.S. Application Data

(63) Continuation of application No. 09/322,124, filed on May 27, 1999, now Pat. No. 6,256,200.

(51) Int. Cl.[7] .............................................. H05K 7/20
(52) U.S. Cl. ...................... 361/704; 257/669; 257/694; 361/773; 361/813
(58) Field of Search .............................. 257/666, 668, 257/675–676, 669, 690, 692–697, 734–735, 737, 747, 361, 700–708, 710, 717–718, 722–723, 772–776, 813

(56) References Cited

U.S. PATENT DOCUMENTS 5,545,921 A * 8/1996 Conru et al. ................. 257/669
5,554,885 A * 9/1996 Yamasaki et al. ............ 257/666
6,005,286 A * 12/1999 Kinsman ...................... 257/669

* cited by examiner

Primary Examiner—Gregory Thompson
(74) Attorney, Agent, or Firm—Silicon Valley Patent Group LLP; David E. Steuber

(57) ABSTRACT

A semiconductor package contains a plurality of sheet metal leads that are attached to one or more terminals on a top side of a semiconductor die. A heat sink is attached to a terminal on a bottom side of the die. Each of the leads extends across the die and beyond opposite edges of the die and is symmetrical about an axis of the die. At the locations where the leads pass over the edges of the die notches are formed on the sides of the leads which face the die, thereby assuring that there is no contact between the leads and the peripheral portion of the top surface of the die. Particularly in power MOSFETs the peripheral portion of the top surface normally contains an equipotential ring which is directly connected to the backside (drain) of the MOSFET, and hence a short between the leads on the top of the die and the equipotential ring would destroy the device. The result is a package that is extremely rugged and that is symmetrical about the axis of the die. To avoid shorting between adjacent leads, moats are formed in the leads where they face the die to prevent liquid epoxy or solder from spreading between the leads. Since no central tie bar is required, multiple dice can readily be packaged in a single plastic capsule.

7 Claims, 60 Drawing Sheets

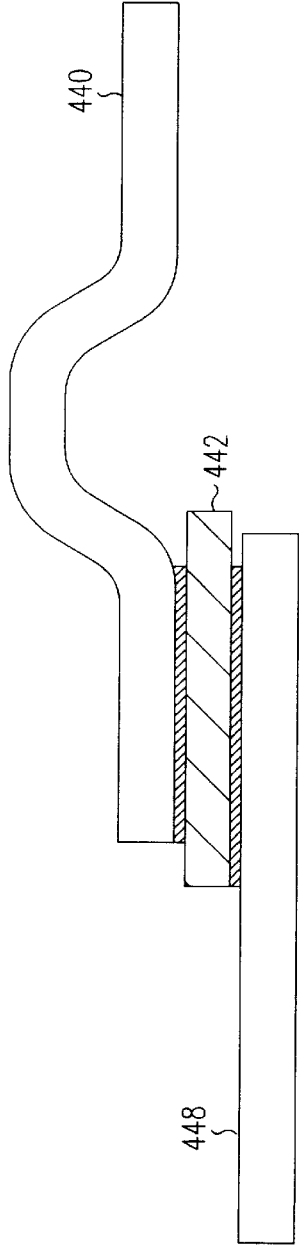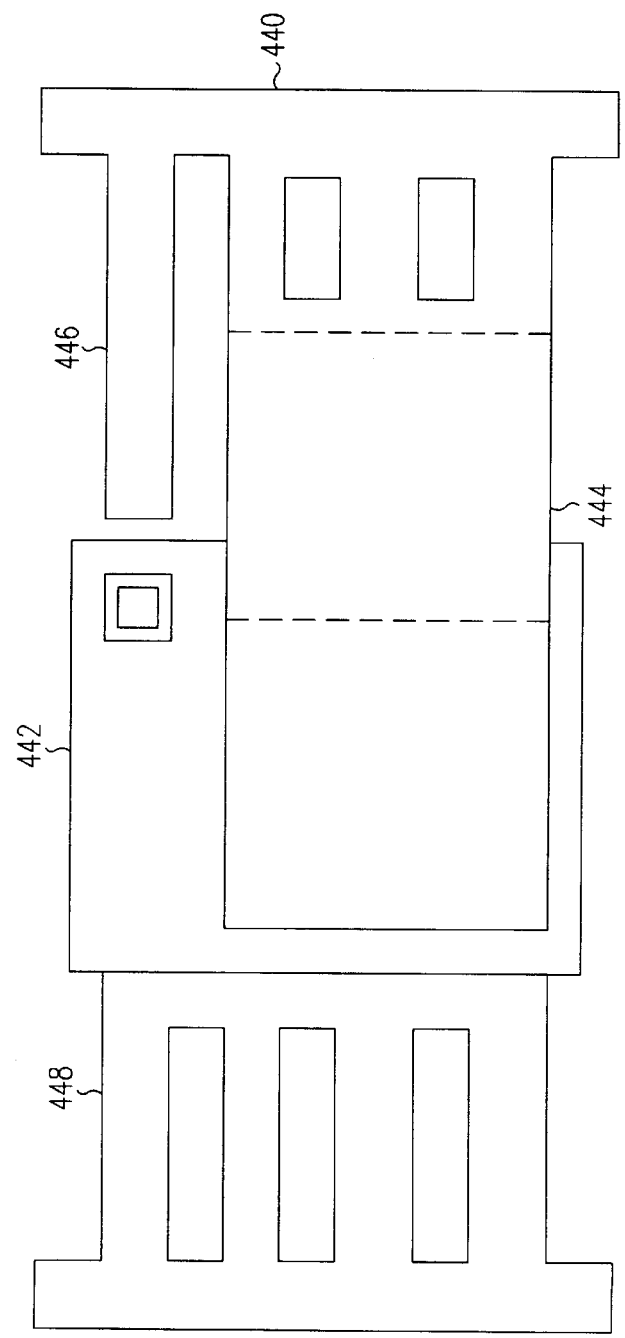
FIG. 1D (PRIOR ART)
FIG. 1E (PRIOR ART)

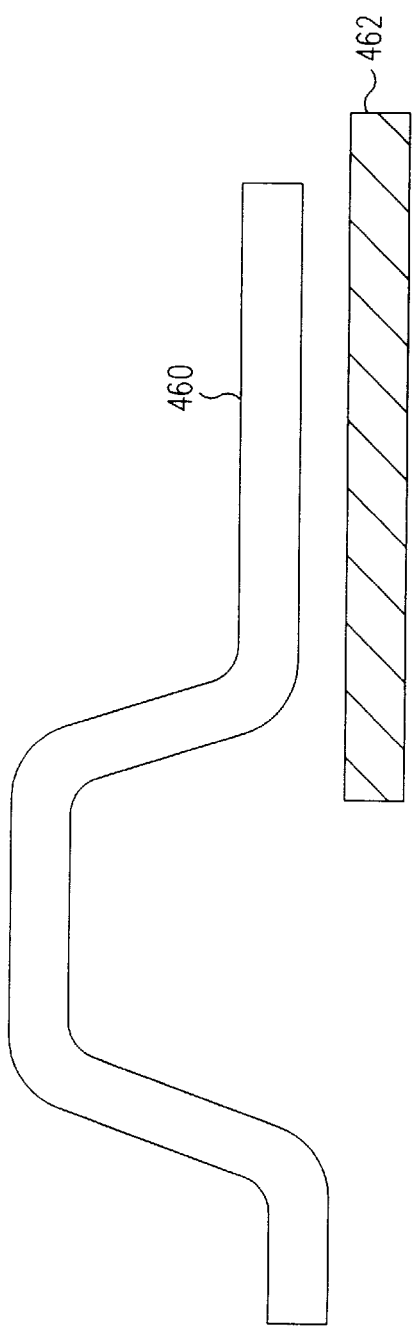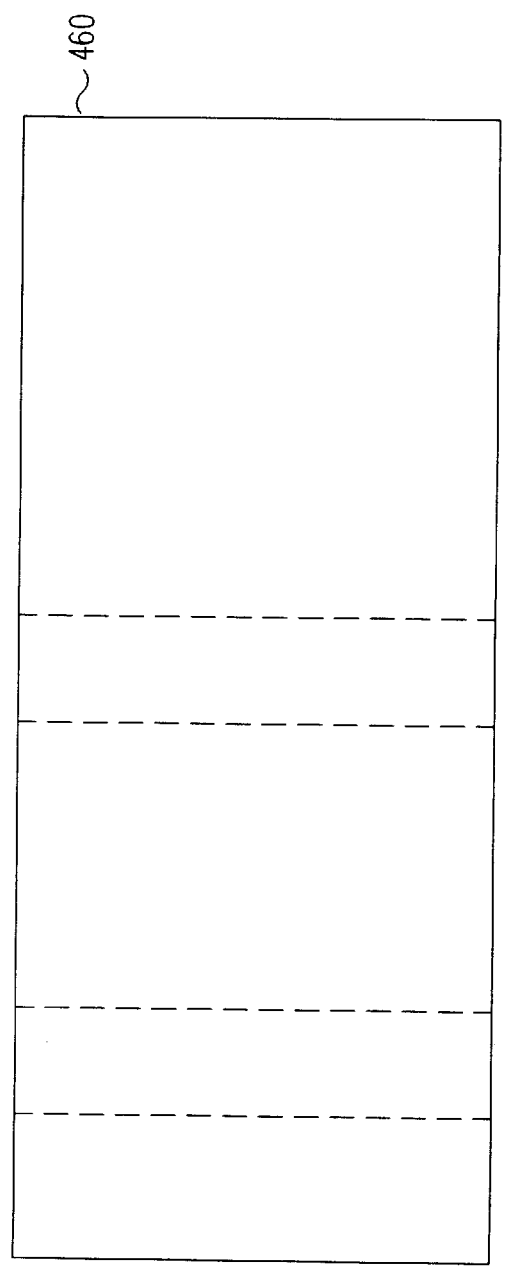
FIG. 2B (PRIOR ART)
FIG. 2C (PRIOR ART)

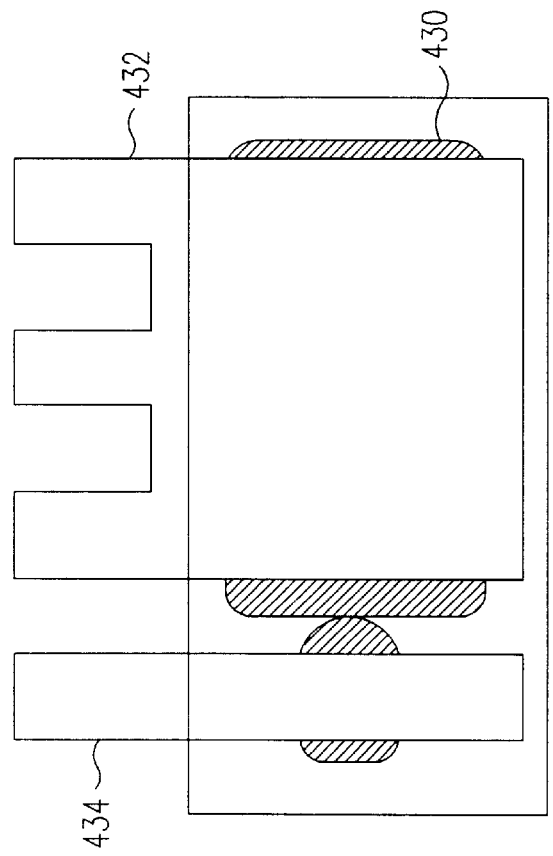
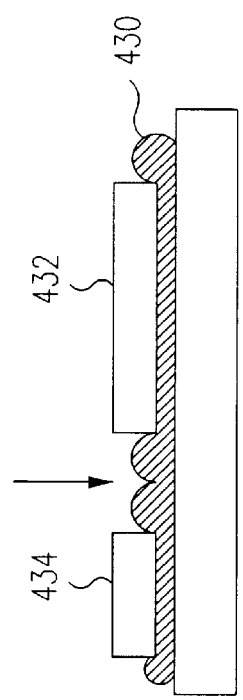
FIG. 4A (PRIOR ART)
FIG. 4B (PRIOR ART)

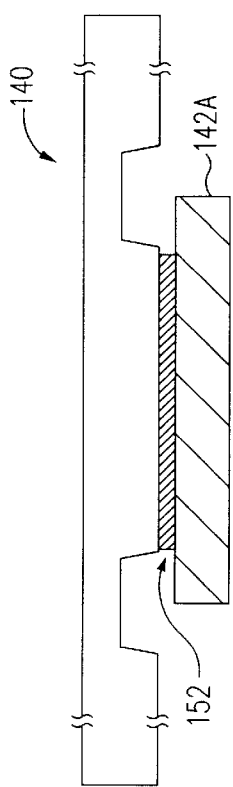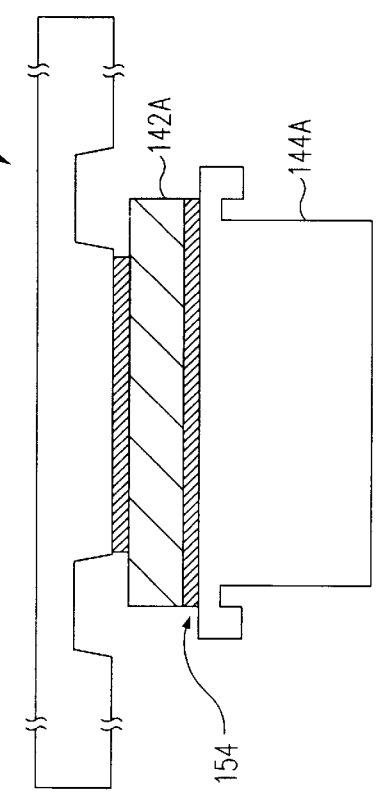
FIG. 8B
FIG. 8D
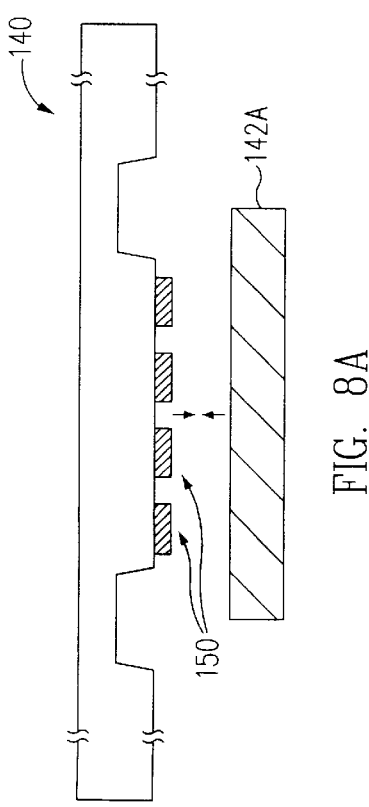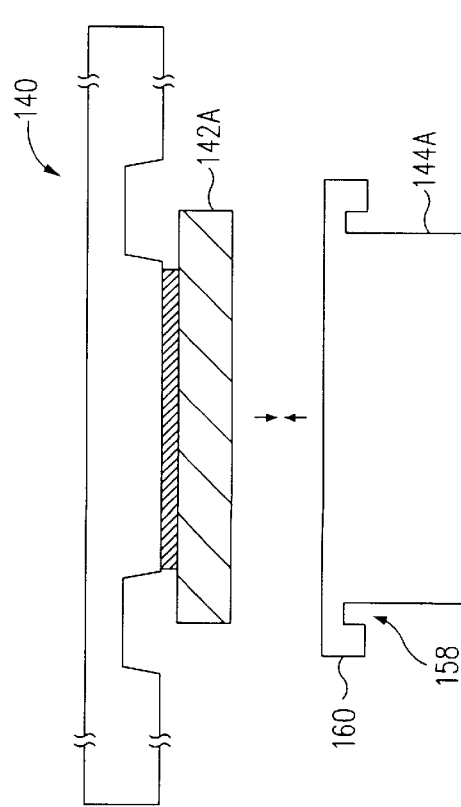
FIG. 8A
FIG. 8C

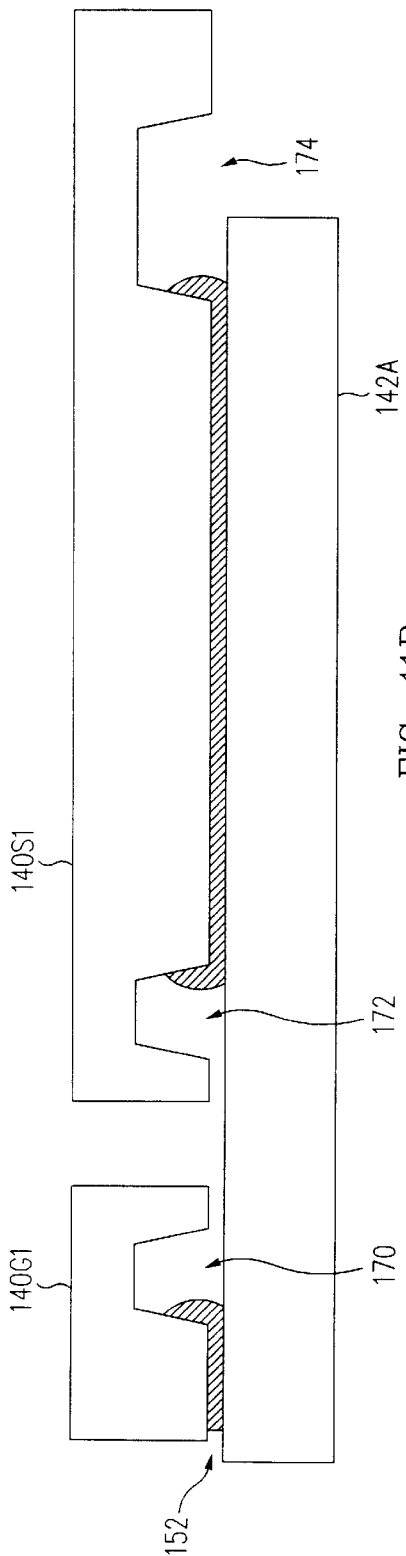
FIG. 11B
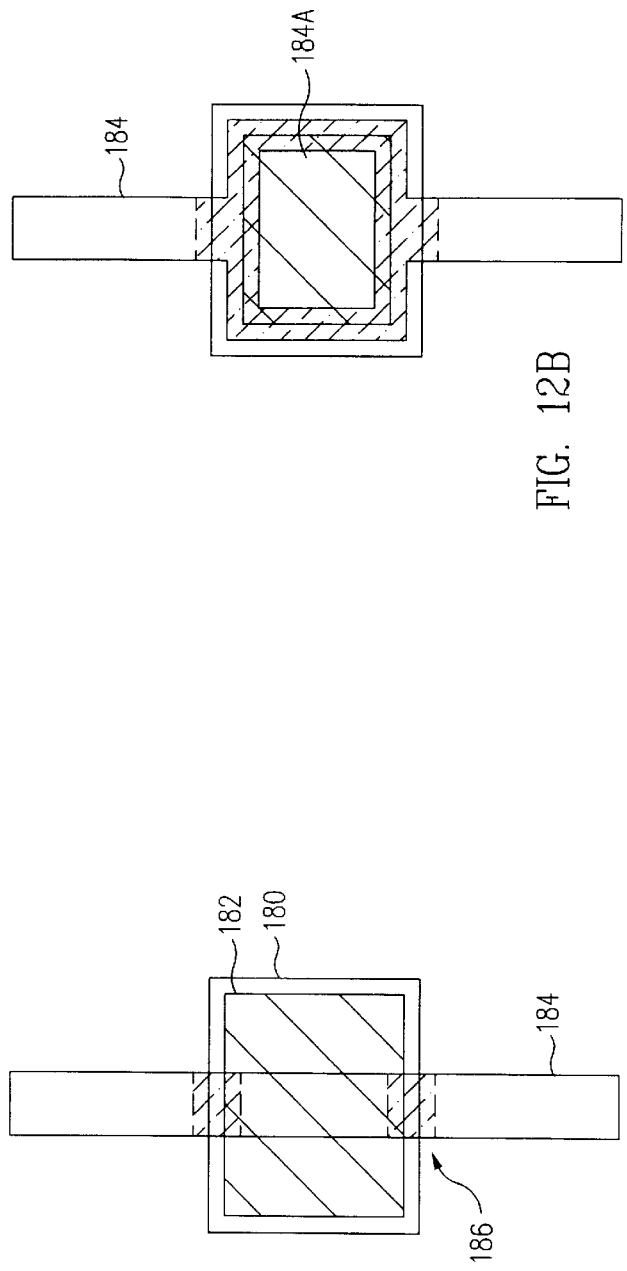
FIG. 12B
FIG. 12A

SYMMETRICAL PACKAGE FOR SEMICONDUCTOR DIE

This application is a continuation of application Ser. No. 09/322,124, filed May 27, 1999 U.S. Pat. No. 6,256,200, and is related to application Ser. No. 09/322,127, each of which is incorporated herein by reference in its entirety.

BACKGROUND OF THE INVENTION

Semiconductor devices in the form of integrated circuit chips (ICs) must typically be mounted on a flat surface such as a printed circuit board when they are incorporated into a product such as a computer or cellular phone. No surface-mount semiconductor packaging technology exists today that is capable of meeting the needs of the next-generation of discrete power semiconductor devices and ICs.

Such surface-mount power packages should include at least the following features:

1. A low electrical resistance.
2. The capability of shunting current and reducing the lateral resistance in a device's metal interconnect.
3. A low thermal resistance.
4. The capability of achieving high currents vertically (through backside) or laterally (topside).
5. High manufacturability.
6. A low intrinsic material cost.
7. A low manufacturing cost.
8. Reliable operation in power applications.
9. The ability to facilitate at least three (and preferably more) isolated connections to the semiconductor.
10. A low profile (height) and small footprint.

Power semiconductor devices and ICs come in two types, those that conduct high currents because they exhibit low on-state voltage drops (and hence low power dissipation) and those that conduct "high" currents because they dissipate large amounts of power. Because of the varied use, construction, and operation of such power devices, the first two features listed (i.e. low electrical resistance) can be achieved in lieu of the third feature (low thermal resistance), but ideally one package should offer both low electrical and thermal resistance.

The fourth feature, a high current flow laterally or vertically, specifies that a power package should ideally be applicable to both lateral and vertical power devices, but at least one of the two orientations should be high current capable.

Of course, the package must be highly manufacturable since power transistors are used in high quantities, billions of units yearly, worldwide. Any intrinsic manufacturing repeatability or yield problem would have dire consequences for the supplier and likely the user of such devices.

Another feature is low cost, including the package material cost and the cost of its manufacture. Of these, the material cost is fundamental since the prices of certain materials such as gold wire, plastic molding, copper leadframes, etc., are based on the world market for the raw material and cannot be substantially changed through simple increases in semiconductor product volume. Package designs using smaller amounts of material are inherently cheaper to produce.

The reliability of a package in a power application means it must survive operating conditions commonly encountered in power device use, such as current spikes, higher ambient temperatures than normally encountered, significant self heating, thermal shock from repeated thermal transients, etc. Repeated pulses of current or heating can provoke fatigue-related failures, particularly at metallurgical junctions and interfaces. Fewer interfaces are preferable.

Two-terminal packages are needed for diodes, transient suppressors, and fuses, while packages supporting at least three connections are useful for discrete transistors. Four connections up to eight connections are extremely valuable for a variable of smarter power semiconductor components. Beyond eight distinct connections, the use of such power package technology is concentrated on power integrated circuits.

Low profile surface mount packages, while not universally required, make it convenient for PC board manufacturing since power devices packaged in low profile packages have the same characteristics of other ICs on the same board and hence avoid the need for special handling. In some cases like battery packs, PCMCIA cards and cell phones, the low profile package may be crucial in meeting a critical thickness in the final end product.

Small footprint is generally a matter of overall product size, especially in portable electronics where size is an important consumer buying criteria—the smaller the better.

In a related consideration, the smaller the package footprint is on the board and the larger the semiconductor die it contains, the performance for a given size is greater.

While these goals may seem obvious, the fact is that today's power semiconductor-packaging technology does not meet these needs adequately, cost effectively, and in some cases, at all. Many of the disadvantages of the conventional packages are a consequence of the use of bond wires. Bond wires contribute added resistance and are ineffective in their conduction of heat, especially wires that are connected to the topside source pad in a power MOSFET, insulated gate bipolar transistor, or bipolar transistor. Several firms have attempted to develop a bond-wireless connection to the gate, but these attempts have been unsuccessful and the firms have had to revert to a wire-bonded gate connection.

One such attempt at a process flow for fabricating a power MOSFET containing a bond-wireless source connection combined with a gate bond wire is shown in FIG. 1A. In this flow, an epoxy die attach (and partial cure) between the die and the top leadframe is then followed by flipping the die over and attaching it via epoxy to the bottom leadframe. Because of the torque applied by the tie bars to the die attach portion of the leadframe, maintaining a uniform interfacial epoxy layer is difficult at best. Moreover, in this flow, wire bonding must occur after the bond-wireless die-attach. After the wire-bond is made, molding, trimming and forming still must occur.

FIG. 1B illustrates a top leadframe 440 epoxy-attached to die 442. The curved-metal "camel hump" leadframe 440 (i.e. the step-up and down-set leadframe) makes a uniform die attach operation difficult. After die attach, the plan view of FIG. 1C illustrates the bond-wireless portion 444 of the top leadframe 440 and the shorter "diving board" piece 446 used for wire bonding the gate. Even with a tie bar tied to one side, holding leadframe 440 stable during wire bonding is difficult.

After the top leadframe 440 is attached to the die 442, the bottom leadframe 448 is die-attached using conductive epoxy, as shown in the cross-sectional view of FIG. 1D and the plan view of FIG. 1E. Controlling the torque and pressure during die attach and curing is critical to a reliable product. The gate lead 446 is then wired-bonded, using a bonding wire 450, as shown in the perspective drawing of FIG. 1F. Mixing bonding wire and bond-wireless methods in the same package has a disadvantage in cost since the die-leadframe or die-strap assembly must be moved to a different machine to perform wire bonding. Handling the product takes time and costs money. In fact, this method has so many problems in achieving manufacturability that it may never be used commercially and may be abandoned altogether despite years of investment within the industry. Die-cracking, variable on-resistance, and on-resistance that changes during operation or burn-in are all symptomatic of this approach.

Notice that gate lead 446 is mechanically analogous to a diving board with little support of its free end during wire-bonding. Its movement makes the quality of the gate bond 452 questionable and variable. FIG. 1G shows another perspective drawing after plastic molding (shown as a dotted line 454). The asymmetry of the design renders manufacturing of this approach challenging and irreproducible.

Another approach is shown in the flow diagram of FIG. 2A. In this approach, the die is first attached to a copper strap layer to form a die and strap assembly, then subsequently the die and strap assembly is attached to a conventional leadframe. After this second attachment, the part still must be wire bonded to connect the gate of the device. Thereafter the structure is molded, trimmed and formed.

In FIG. 2B, again a camel hump piece of metal, in this case the "strap" 460 is aligned to the die 462. The strap 460 has a uniform width (see FIG. 2C) and therefore must be positioned so as to not cover the gate bonding pad 464 (see FIG. 2E) yet still contact the source. Strap 460 is shown in the cross-sectional view of FIG. 2D and the plan view of FIG. 2E as a source lead epoxy-attached to die 462 to form a die and strap assembly 461. It is critical that bottom surfaces of the foot 466 of the camel hump leadframe 460 and the die 462 be perfectly coplanar to avoid problems later in the process.

The bottom leadframe 470, shown in the cross-sectional view of FIG. 2F and the plan view in FIG. 2G, looks like a ordinary leadframe. Note that while lead frame is drawn as separate parts in FIGS. 2F–2R, in reality the parts are connected by a tie bar (not shown). Leadframe 470 is typically flat before it is attached to the die, although conceivably it could be preformed (i.e., already bent), which makes it even more difficult to handle.

In FIGS. 2H and 2I, the die and strap assembly 461, comprising the die 462 and copper strap 460, is aligned to the bottom leadframe 470, which is coated with epoxy "dots" 472. At this point, the epoxy dots 472 have no correspondence with surface features of the die, such as the gate pad 464. FIG. 2J is a view of the die and strap assembly 461 pushed onto the bottom leadframe 470, taken at cross-section J—J shown in FIG. 2I. As is evident, the coplanarity of the bottom surfaces of die 460 and the foot 466 of strap 460 are crucial in achieving two good, low-resistance epoxy joints simultaneously, the one under the die 460 and the other under the foot 466. Since the second joint is of limited area, this region contributes to an increased resistance compared to the three-terminal bond-wireless package shown in FIG. 1G. A view of the gate bonding area, taken at cross-section K—K in FIG. 2I, is shown in FIG. 2K.

After squeezing the epoxy by pressure, the epoxy should ideally redistribute evenly across the bottom of the metal strap and under the die as shown in FIG. 2L. Since the assembly is asymmetrical, however, uniform pressure is difficult to achieve reproducibly. As shown in the cross-sectional view of FIG. 2M and the plan view of FIG. 2N, a wire bond 480 is then made, followed by injection molding to form the plastic capsule 482 shown in FIGS. 2O and 2P.

Clearly the number of epoxy layers carrying high currents is greater than other packaging approaches—three in the design shown in FIG. 2Q, i.e., epoxy layers 484, 486 and 488. An option to introduce a heat sink 492 under the leadframe 470, as shown in FIG. 2R involves another epoxy layer 490. The design relies completely on the epoxy layer 490 to hold the heat sink 492 against the leadframe 470, without any mechanism to "lock" it in place. Furthermore, this design has the disadvantage that the many leads attached to the die pad and to the heat sink are all shorted together. The leads are in essence "wasted" because the heat sink is capable of carrying current without them.

Again the asymmetry of the design, especially during the many epoxy die attach steps, make the high volume manufacturability of this design suspect. Clearly, the large number of processing steps makes it expensive. The non-planar surface of the split leadframe (i.e. the leadframe comprising gate and source connections) is especially problematic since any downset exacerbates the coplanarity problem during top-side die attach.

In both attempts at bond-wireless techniques shown above, the gate pad must be attached electrically to the lead frame via bond wires rather than through a bond-wireless connection, ideally made at the same time as the source connection. The reason bond-wireless gate contacts have been unsuccessful is the lack of coplanarity between the gate and source leads. FIGS. 3A–3H illustrate the problem of coplanarity in three-terminal bond-wireless packaging. In FIG. 3A, a downset leadframe 402 and a silicon die 404 (with conductive epoxy dots 406 applied) are aligned and brought in contact as in FIG. 3B. Ideally constant pressure and minimal torque will squeeze both the gate lead 408 (the thin isolated lead) and the wider source metal 410 onto the die surface with equal force. But in fact it is difficult to guarantee that attach surfaces of the two leads 408 and 410 are coplanar, meaning at the same level. It is easy for the tie bar (not shown) to bend a small amount so that the attach surface of the gate lead 408 may, for example, be located slightly above the attach surface of the source lead 410. As shown in FIG. 3C, the consequence of this coplanarity problem is the gate lead 408 does not press onto the die 404 with sufficient force to redistribute the epoxy. As a result the gate lead 408 will exhibit a poor (or no) contact to the gate pad 412 (shown in FIG. 3A).

To further clarify this issue, FIG. 3D illustrates a downset lead 414 pressed properly onto the epoxy interlayer 416 to make good contact with a pad 418. In FIG. 3E, the downset lead 420 is parallel to the surface of the pad 418 but never touches, resulting in open circuit and a failed device. In FIG. 3F, the lead 422 is twisted touching only on its heal while in FIG. 3G, only the toe of lead 424 touches epoxy 416. In FIG. 3H lead 426 barely touches the epoxy 416, but the contact is so light that it does not redistribute the epoxy 416 properly, resulting in a poor electrical contact.

Another problem that occurs in bond-wireless packages is short-circuiting between adjacent leads as a result of the spreading of the liquid epoxy or solder used to make the die-leadframe attachment. As shown in the cross section of FIG. 4A, the epoxy 430 is squeezed with too much force (or too much epoxy was applied), resulting in a lateral short between the source leadframe 432 and the gate leadframe 434, shown in plan view in FIG. 4B.

Another problem occurs particularly with packages for vertical planar or trench-gated DMOSFETs. Most of the top surface of the device is covered by a source metal layer, while the gate pad is electrically isolated from the source metal, typically by a gap 2 to 15 μm wide. The outer edge of the top surface typically includes a metal ring shorted to the drain on the bottom surface, referred to as an equipotential ring or EQR, primarily introduced for purposes of achieving improved reliability against ionic migration. This outer ring is a source of risk for an accidental short between the source or gate connections during assembly. The silicon extends beyond this ring by another 20 to 70 μm. The protruding silicon varies in dimension due to the sawing process when the wafer is cut into separate dice. This area of the die is also biased at the drain potential and may short to a source or gate connected bond wire during packaging.

SUMMARY OF THE INVENTION

A semiconductor package in accordance with this invention includes a semiconductor die having first and second principal surfaces, a heat sink electrically attached to a first terminal on the first principal surface of the die, and at least one lead electrically attached to at least one terminal on the second principal surface of the die. The lead is formed of a flat sheet of metal and extends laterally over opposite edges of the die. At the location where the lead passes over each of the opposite edges of the die, a notch is formed in the lead on the side of the lead that faces the die, thereby assuring that the lead does not come into electrical contact with a portion of the second principal surface adjacent the edge of the die. The die and at least a portion of the heat sink are encased in a conductive material such as plastic.

Typically, the leads are symmetrical about an axis of the die. The opposite ends of the lead are normally bent, preferably at the end of the manufacturing process, to form surfaces that can be electrically mounted to a flat object such as a printed circuit board.

Because the leads are symmetrical about the die, there is often no need for a central tie bar connecting the leads in the leadframe. Instead, the leads may be connected together in the leadframe by a pair of tie bars located on opposite sides of the leadframe.

In one group of embodiments the die includes a power MOSFET, and at least two, electrically isolated leads are in electrical contact with the second principal surface of the die, a first lead making contact with a source terminal and a second lead making contact with a gate terminal. The heat sink is in electrical contact with a drain terminal of the die. In some embodiments, a plurality of leads are in contact with the source terminal. The individual leads of the plurality may merge in the region where they contact the source terminal. The leads and heat sink are attached to the die with conductive epoxy or solder.

The heat sink may include a rim and one or more notches to establish a firm connection between the heat sink and the plastic capsule. The capsule may be held back from a portion of one or more edges of the heat sink.

An array of holes may be formed in a surface of the heat sink that is attached to the first principal surface of the die.

In a group of alternative embodiments, the leads are bent away from the die so as to create a clearance between the leads and the portion of the second principal surface adjacent the edge of the die, in lieu of or in combination with, notches on the leads.

According to another aspect of the invention, a semiconductor package contains at least one sheet metal lead in contact with a surface of semiconductor die. A moat is formed on a side of the lead that is in contact with the die, the moat running parallel to an edge of the lead. The moat inhibits a die-attach material such as epoxy or solder (which is liquid while it is hot) from spreading out so as to create at short circuit. In many embodiments at least two adjacent leads are in contact with the die, and each of the leads contains a moat to prevent a short circuit from developing between the adjacent leads.

This invention also includes a method of fabricating a lead frame for use in a semiconductor package. The process includes patterning a sheet of metal to form the lead frame and forming a notch in a surface of at least one of the leads. The notch can be formed by etching or stamping the metal. The notch typically has a depth that is equal to from 10% to 80% of the thickness of the metal sheet. The process also can include attaching the leadframe to a first principal surface of a semiconductor die such that the notch overlies at least one edge of the die. In many embodiments at least two notches are formed in the leadframe and the leadframe is attached to the die such that the at least two notches overlie opposite edges of the die. The process can also include attaching a heat sink to a second surface of the die.

This invention also includes packages which contain more than one die, an arrangement that is made particularly achievable where the leadframe contains no central tie bar.

BRIEF DESCRIPTION OF THE DRAWINGS

FIGS. 1B–1G are views illustrating the process of FIG. 1A.

FIGS. 4A and 4B illustrate the manner by which the epoxy or solder used in making a connection can spread outward and thereby cause a short between adjacent leads.

FIGS. 8A–8F illustrate the steps of a process wherein the die is initially attached to the lead frame and then to the heat sink.

FIGS. 11A and 11B illustrate top and cross-sectional views, respectively, of a lead frame which includes moats to prevent the epoxy or solder from creating a short between adjacent leads.

FIGS. 12A–12F illustrate plan views of various shapes of leads that may be formed in accordance with this invention.

DESCRIPTION OF THE INVENTION

Figure 1A:
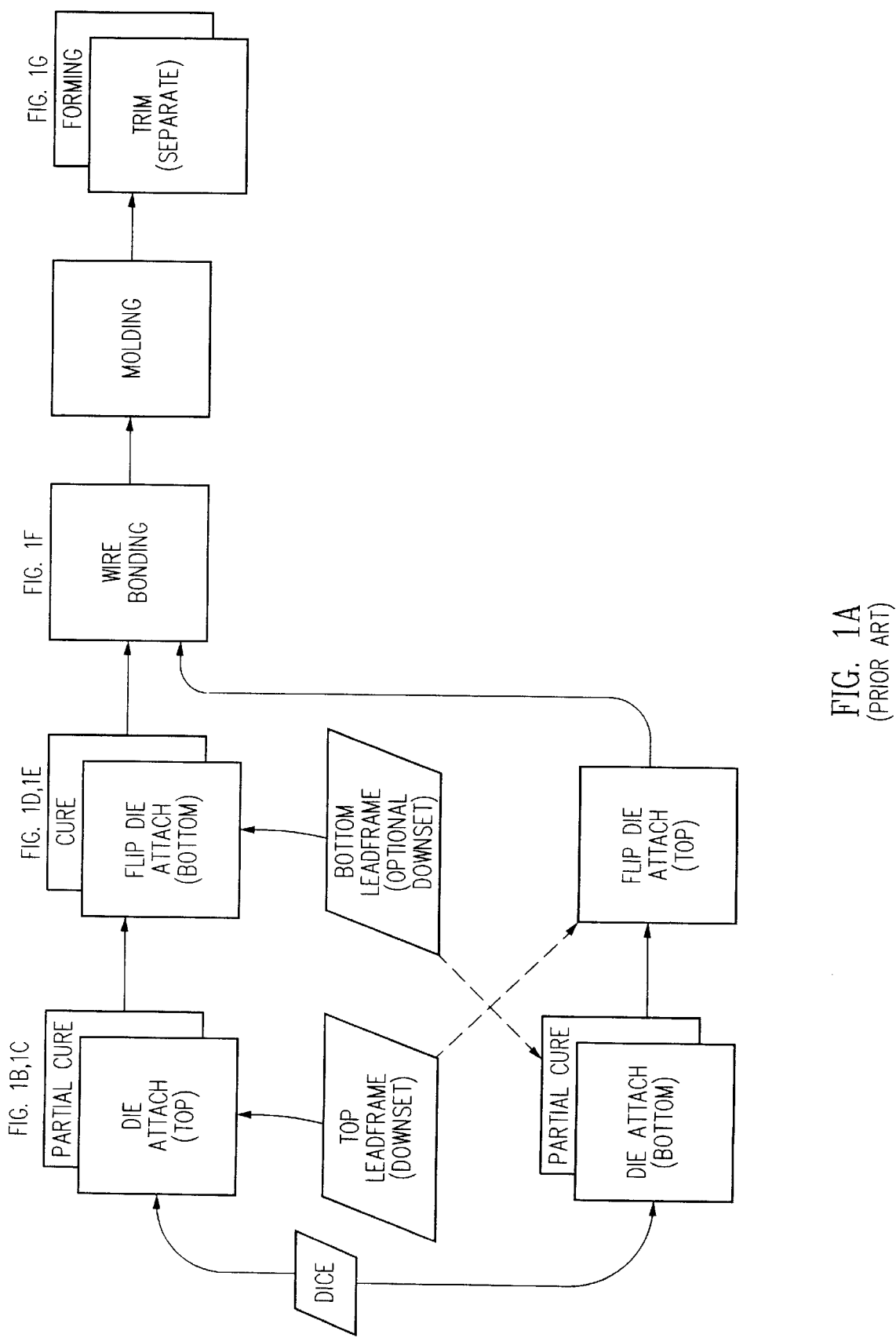
FIG. 1A is a flow diagram of a known process for fabricating a power MOSFET package containing a bond-wireless source connection and a bond wire gate connection.
Figure 1B:
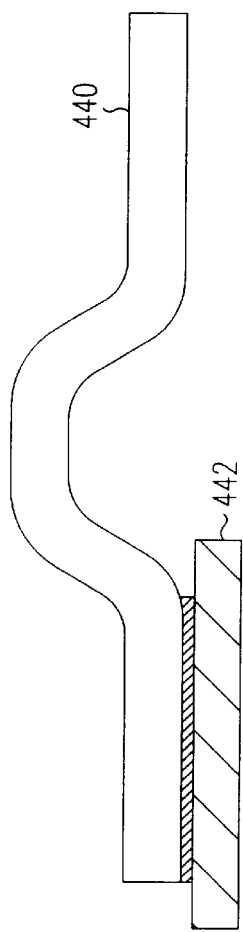
Figure 1C:
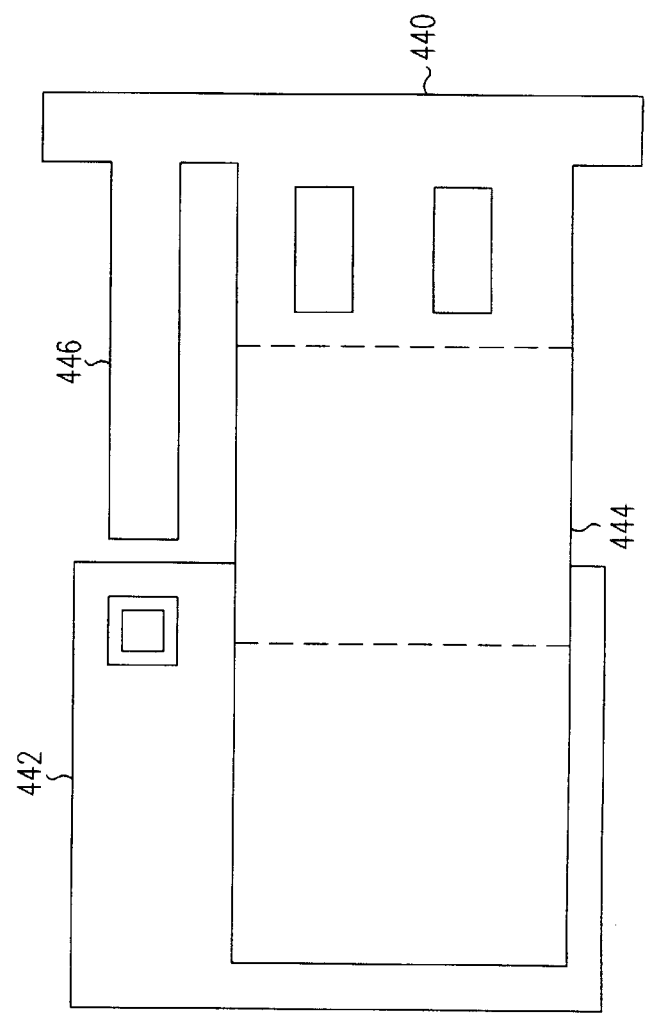
Figure 1F:
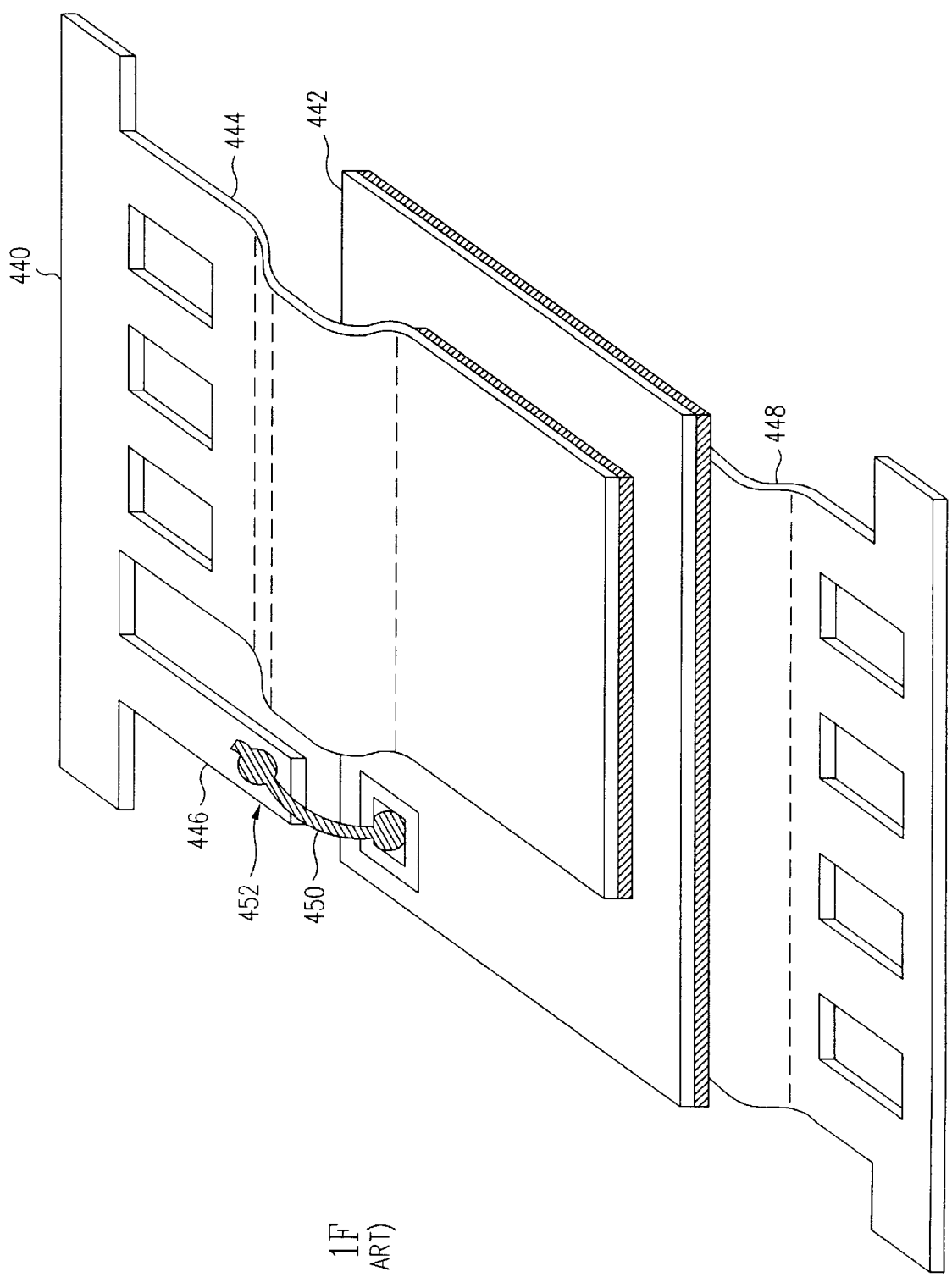
Figure 1G:
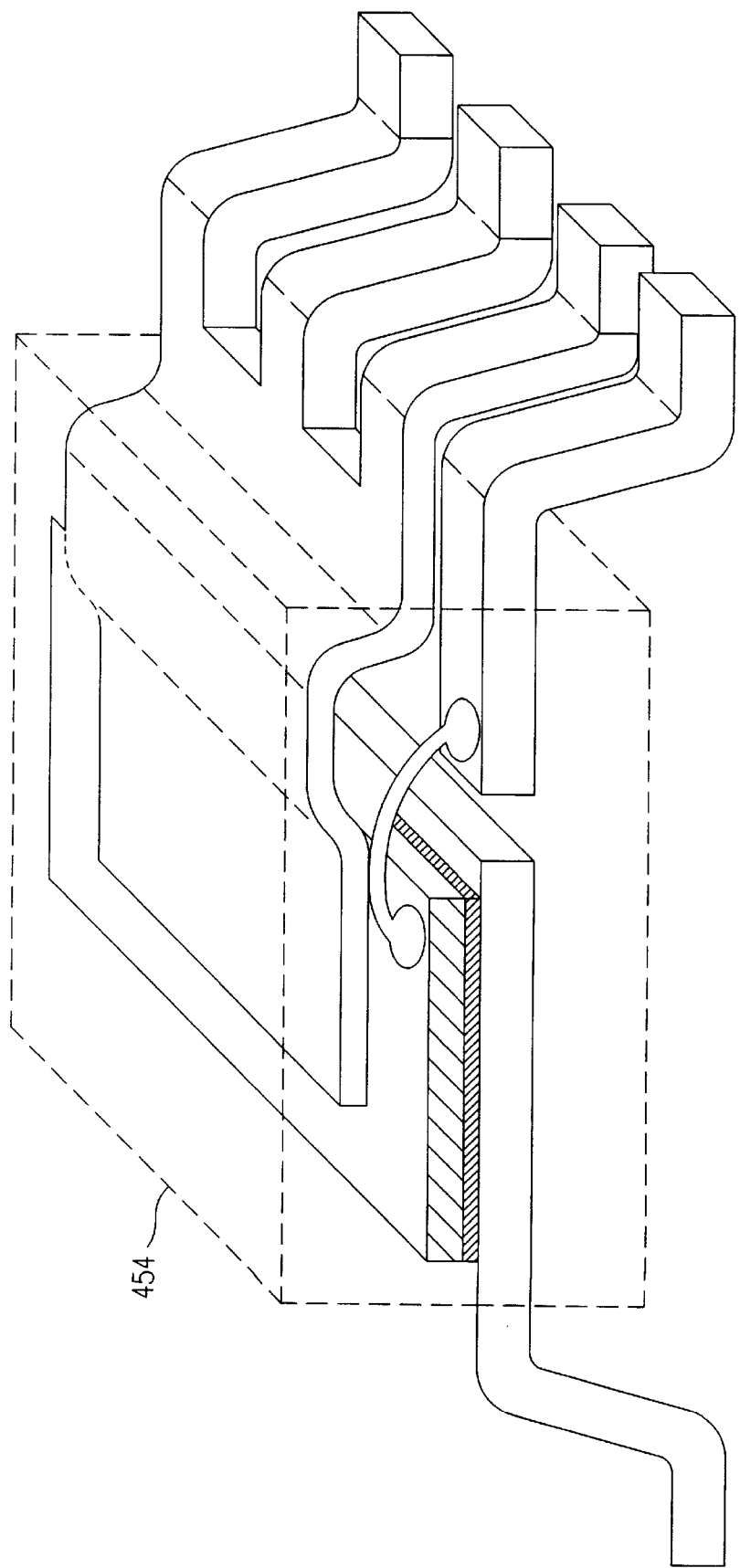
Figure 2A:
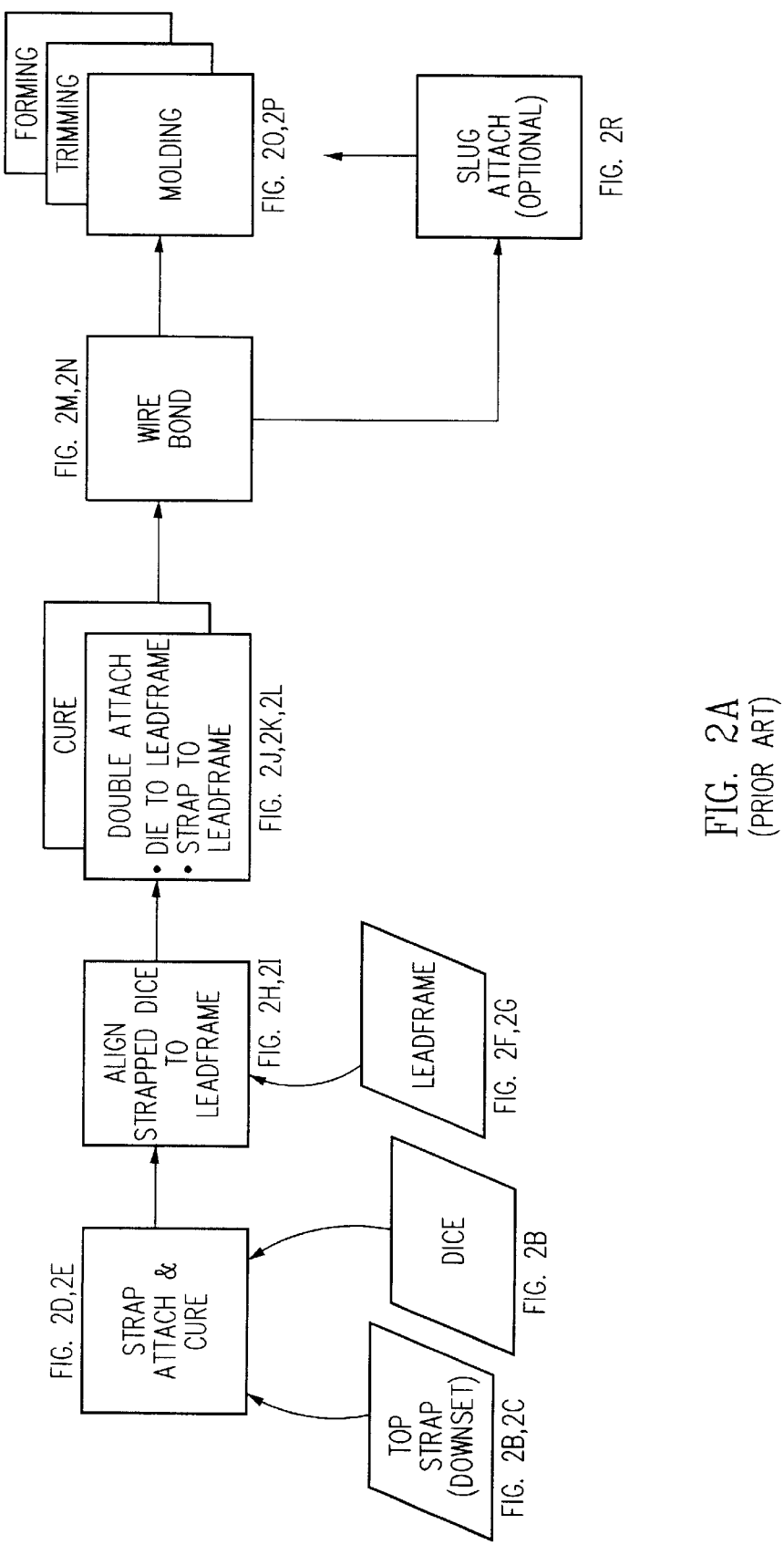
FIG. 2A is a flow diagram of a known process for fabricating a power MOSFET package containing a die-and-strap assembly.
Figure 2D:
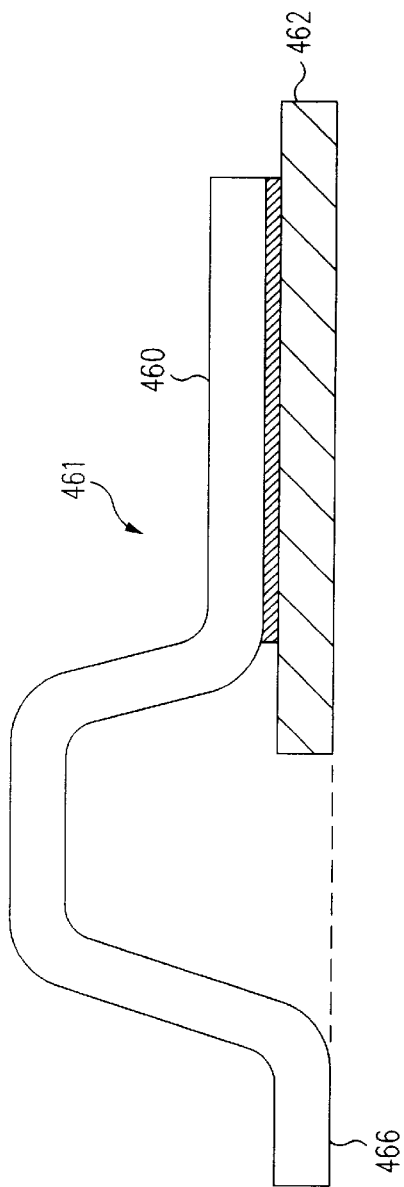
FIGS. 2B–2R are views illustrating the process of FIG. 2A.
Figure 2E:
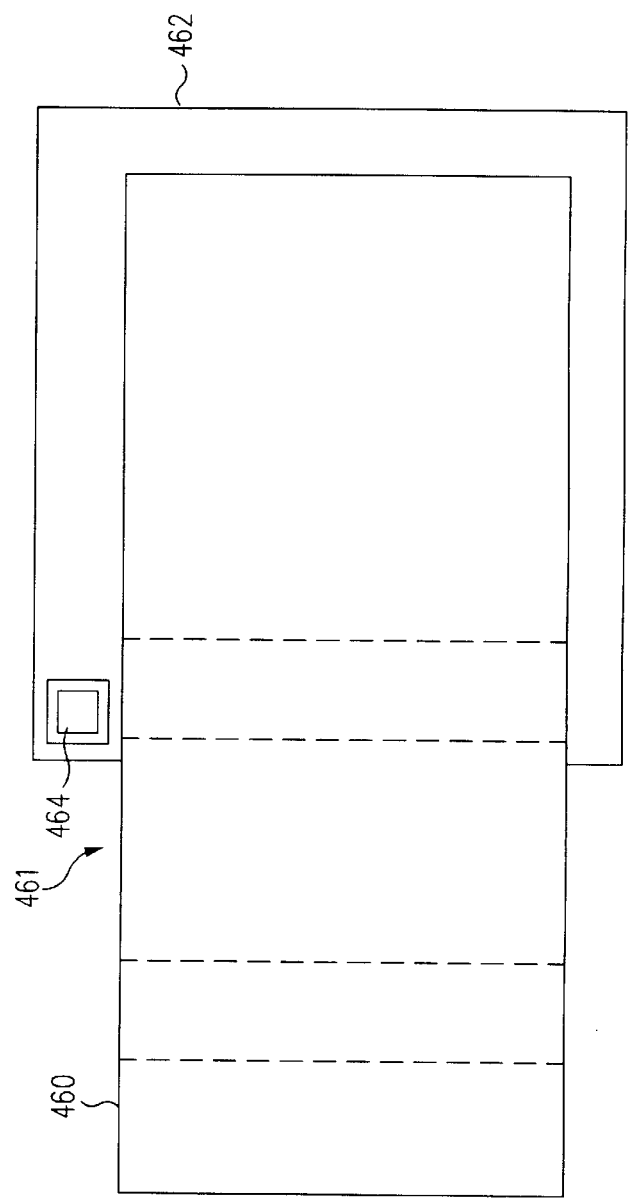
Figure 2F:
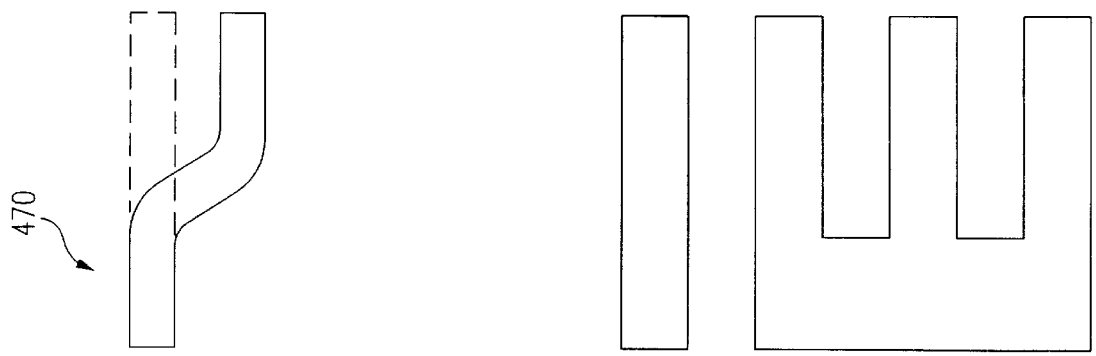
Figure 2G:
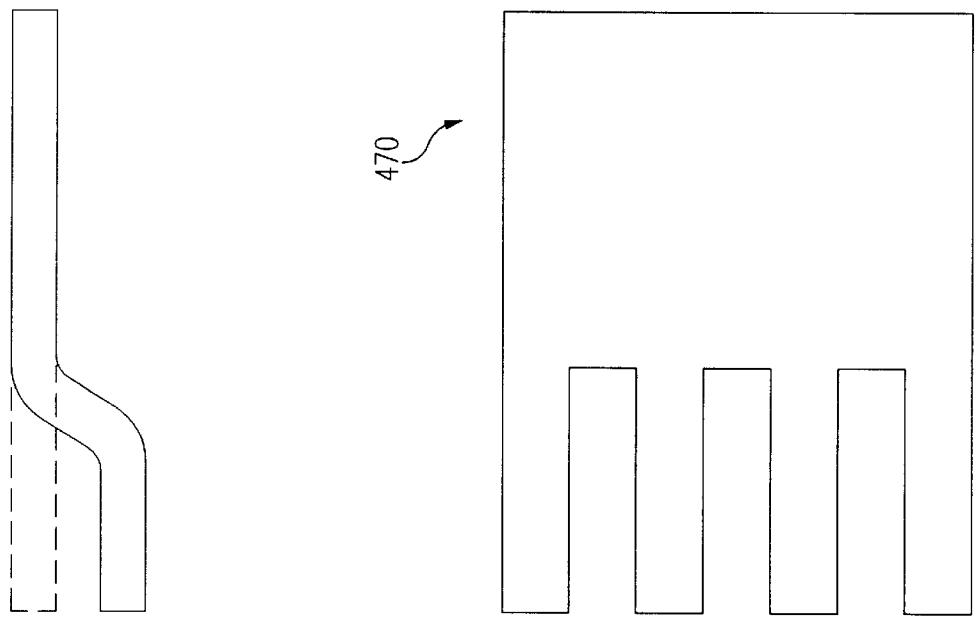
Figure 2H:
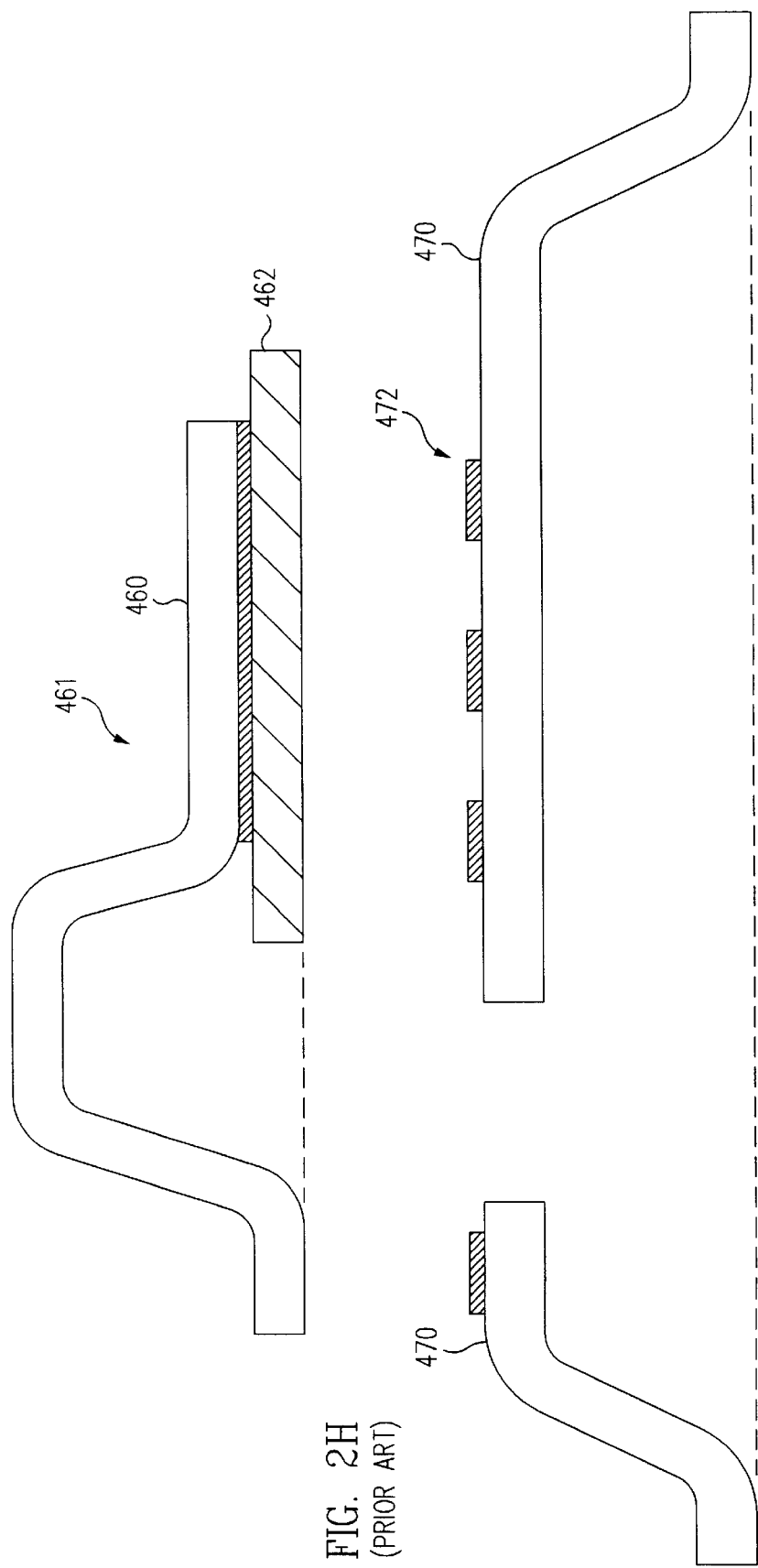
Figure 2I:
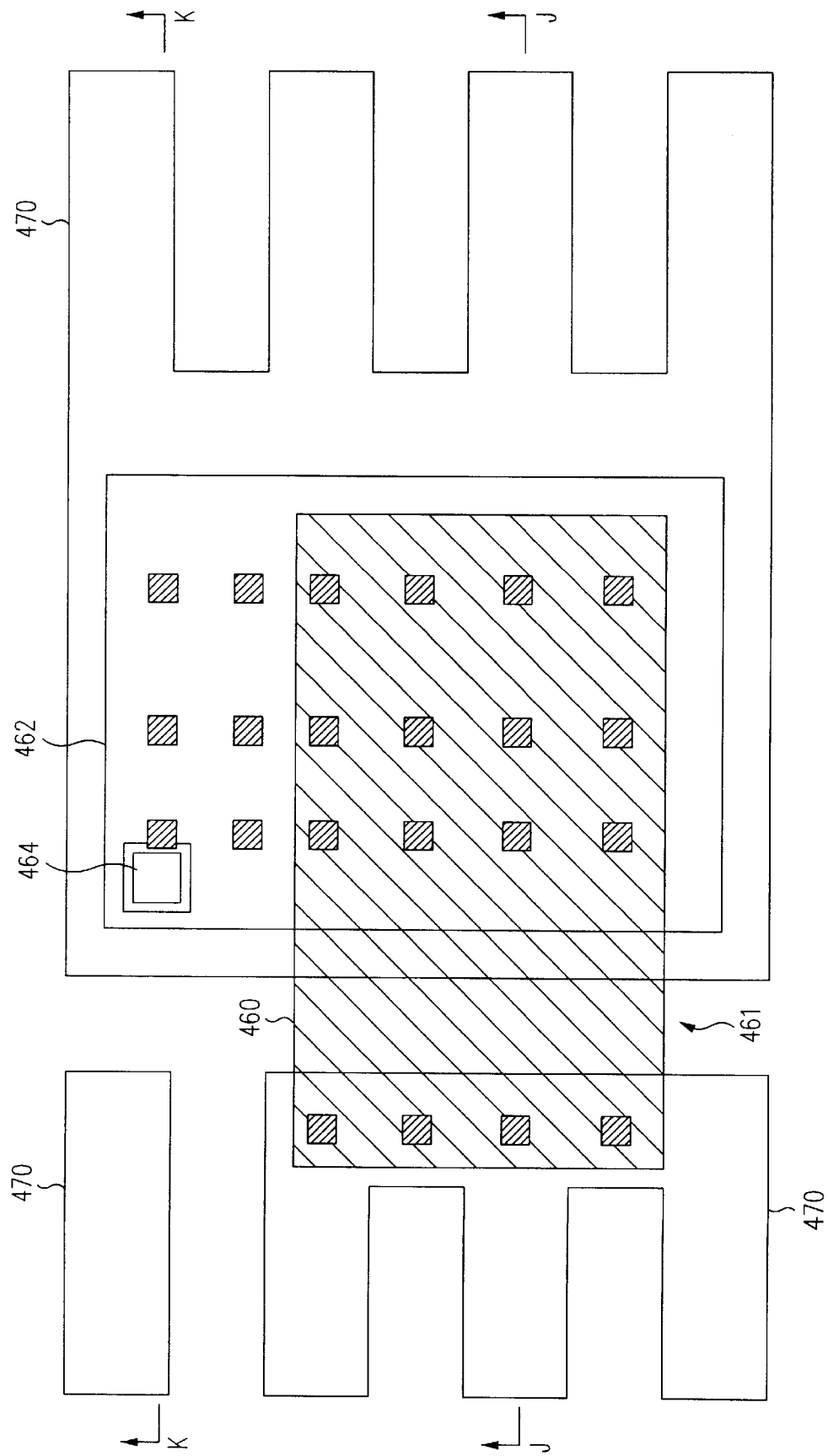
Figure 2J:
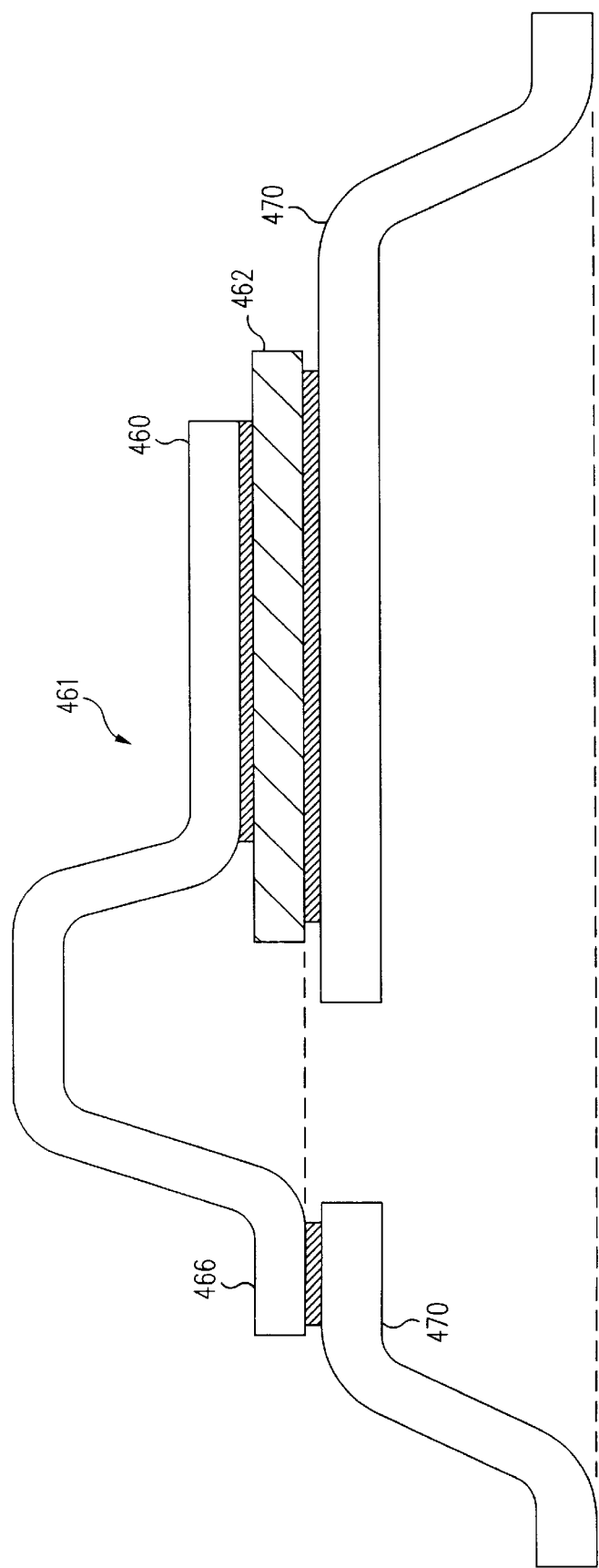
Figure 2K:
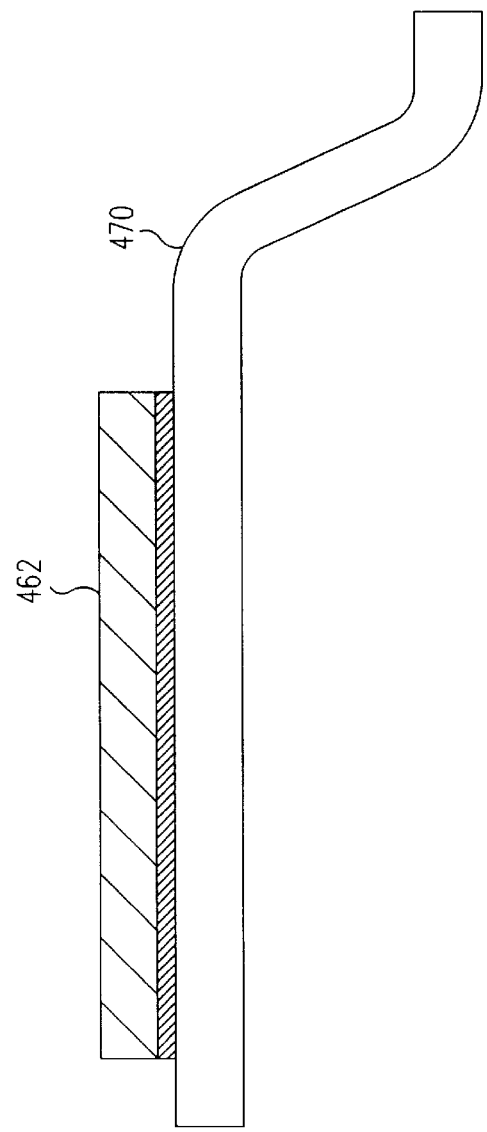
Figure 2L:
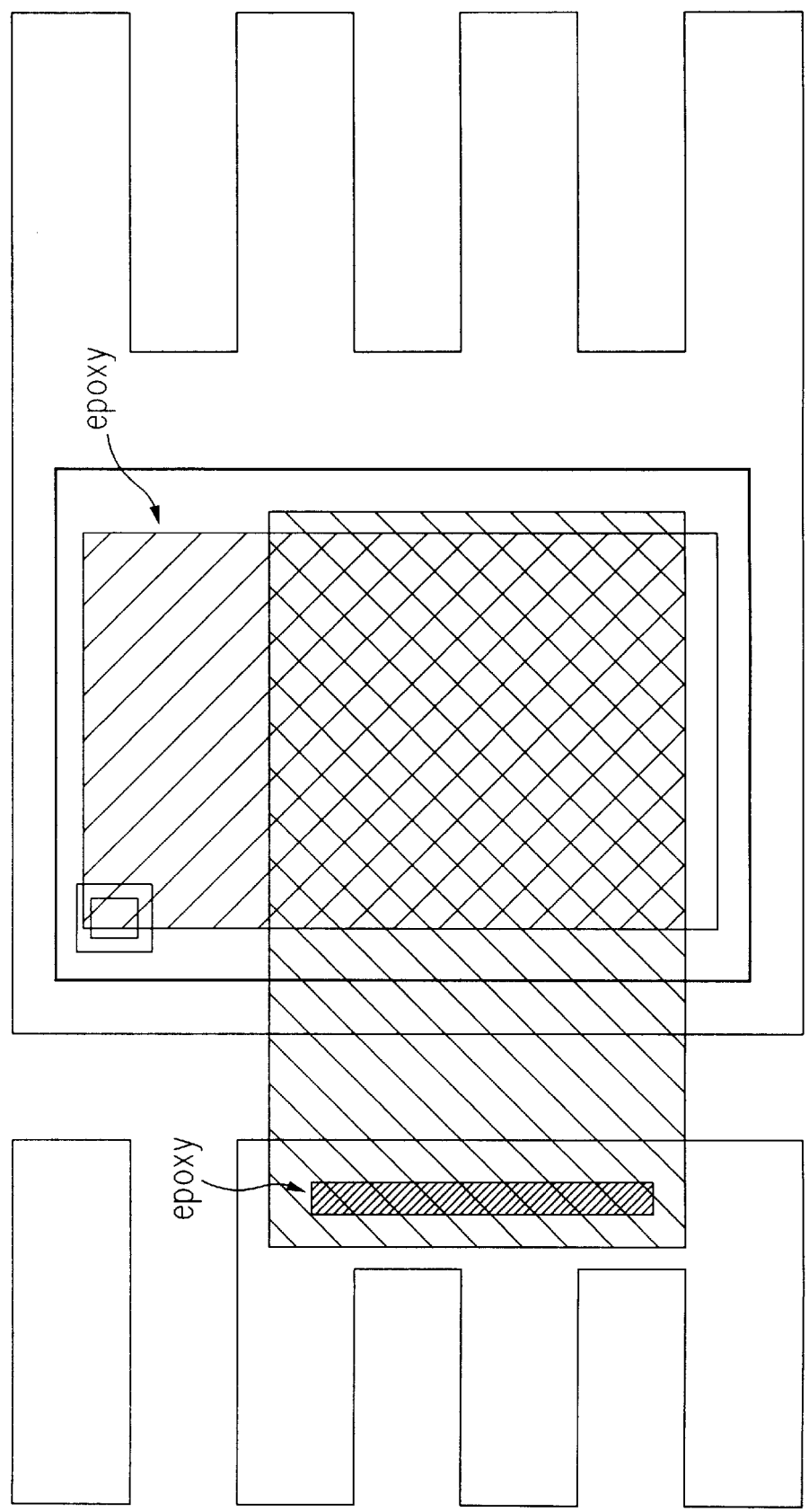
Figure 2M:
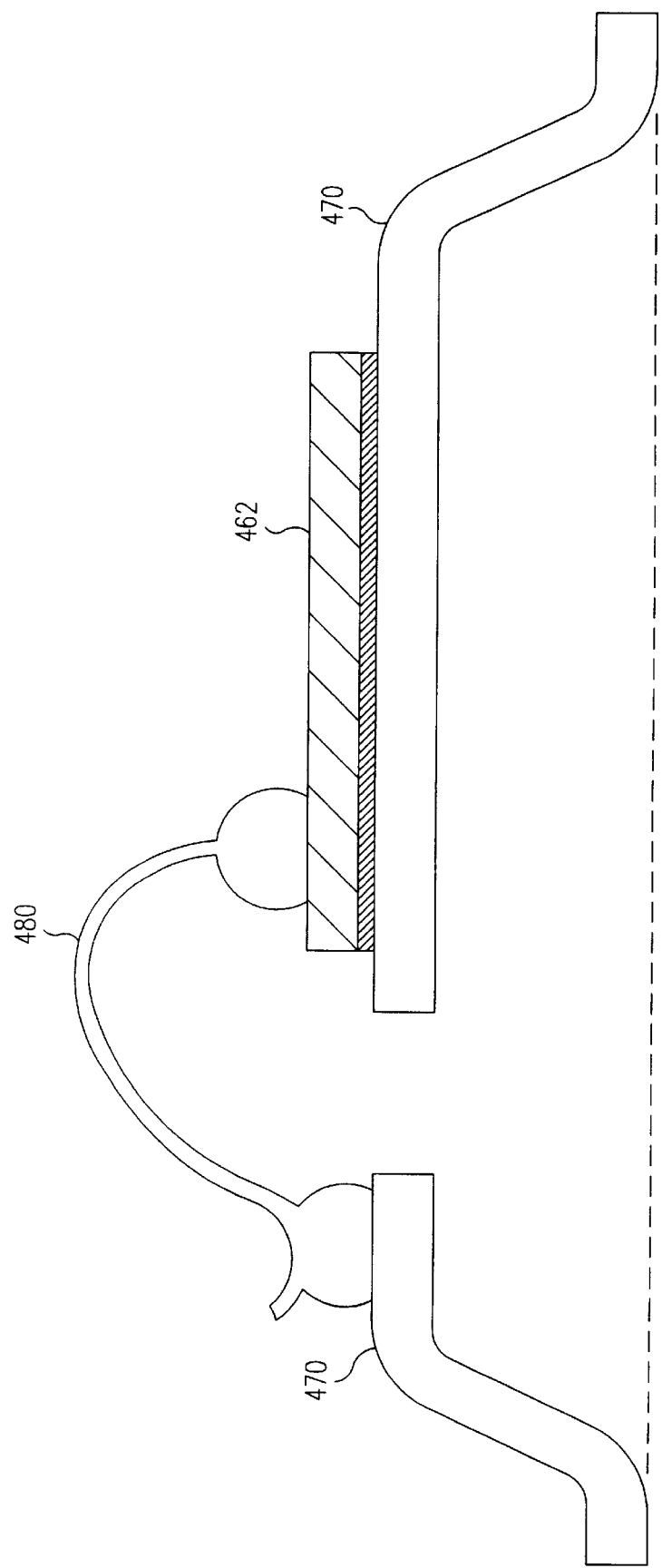
Figure 2N:
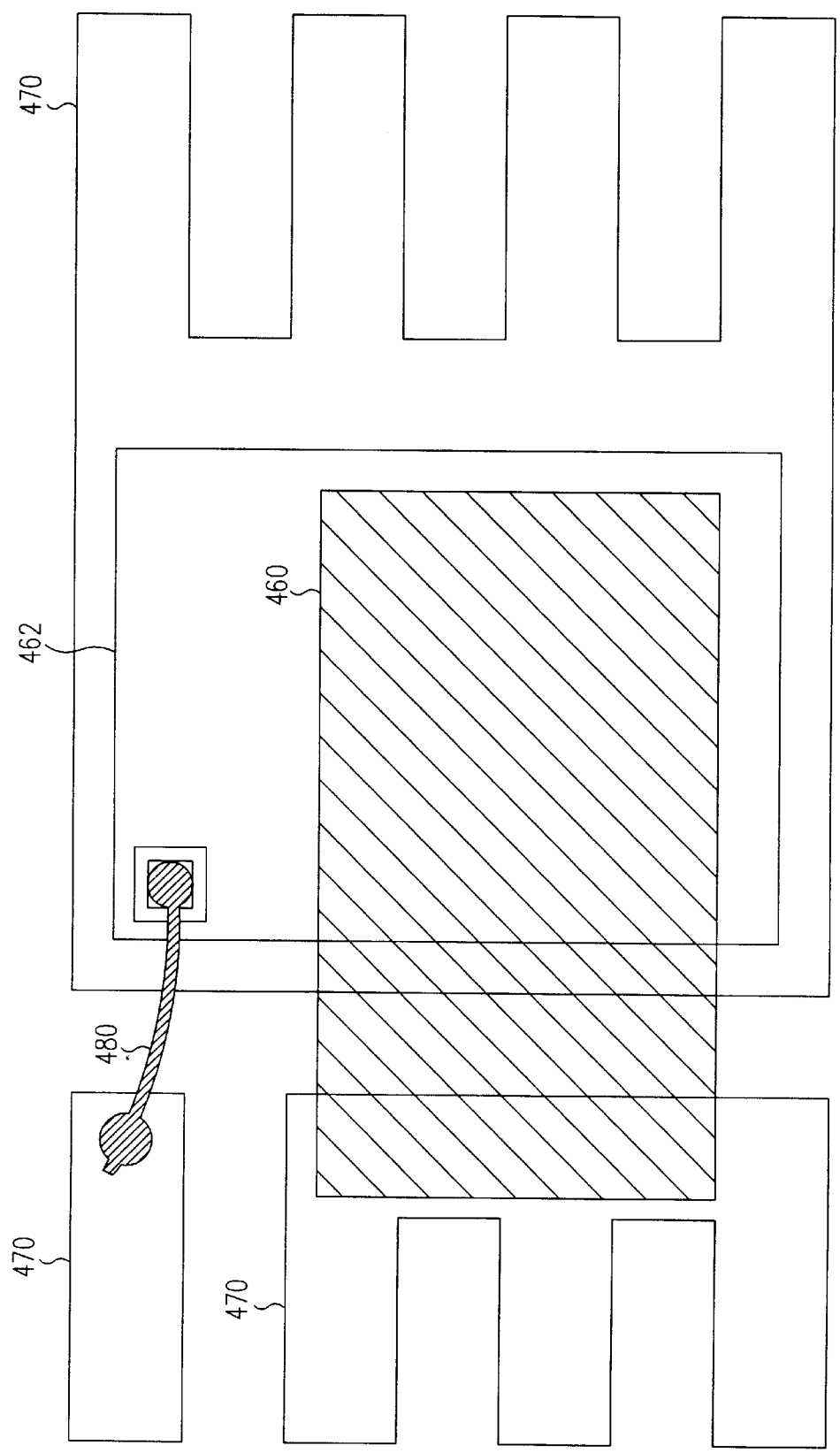
Figure 20:
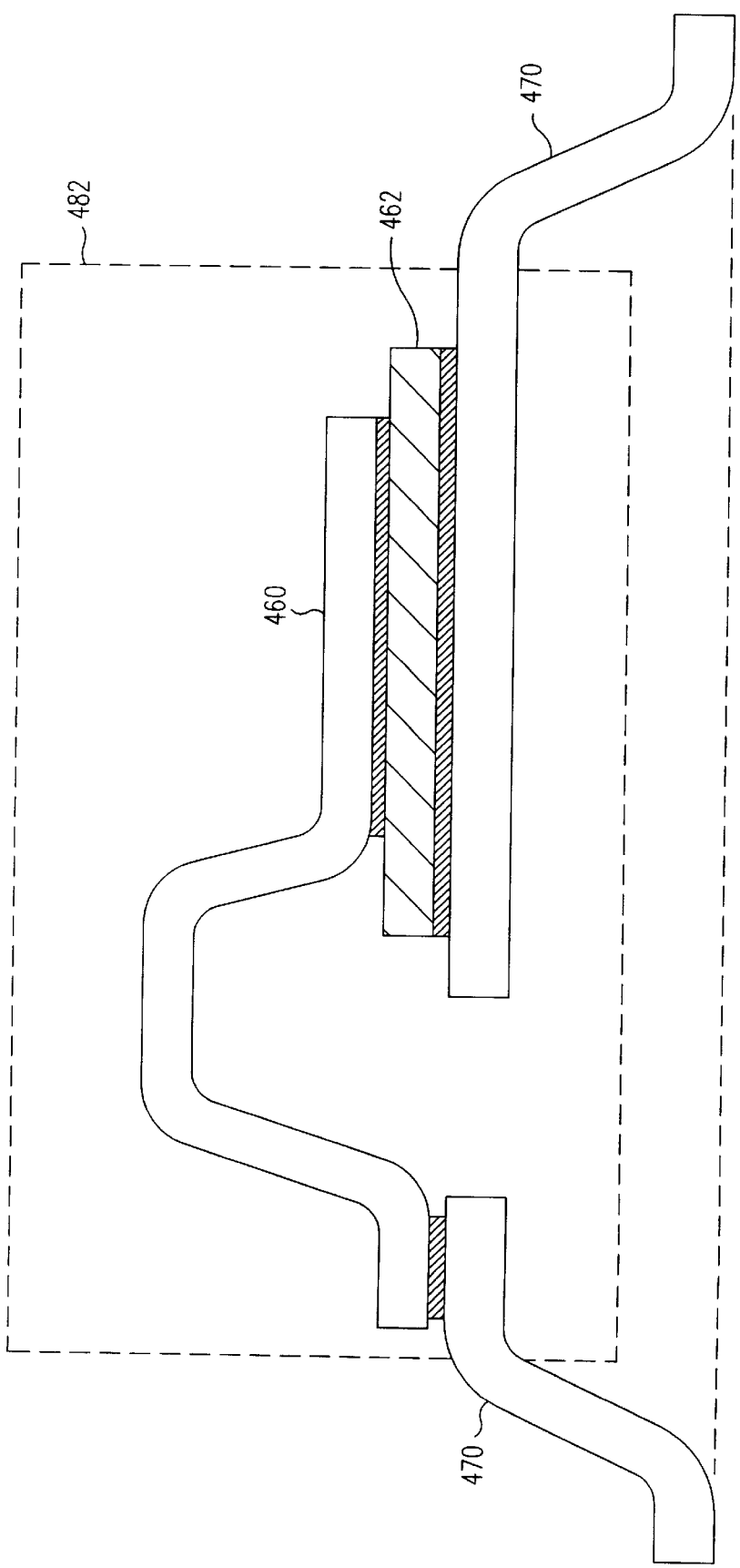
Figure 2P:
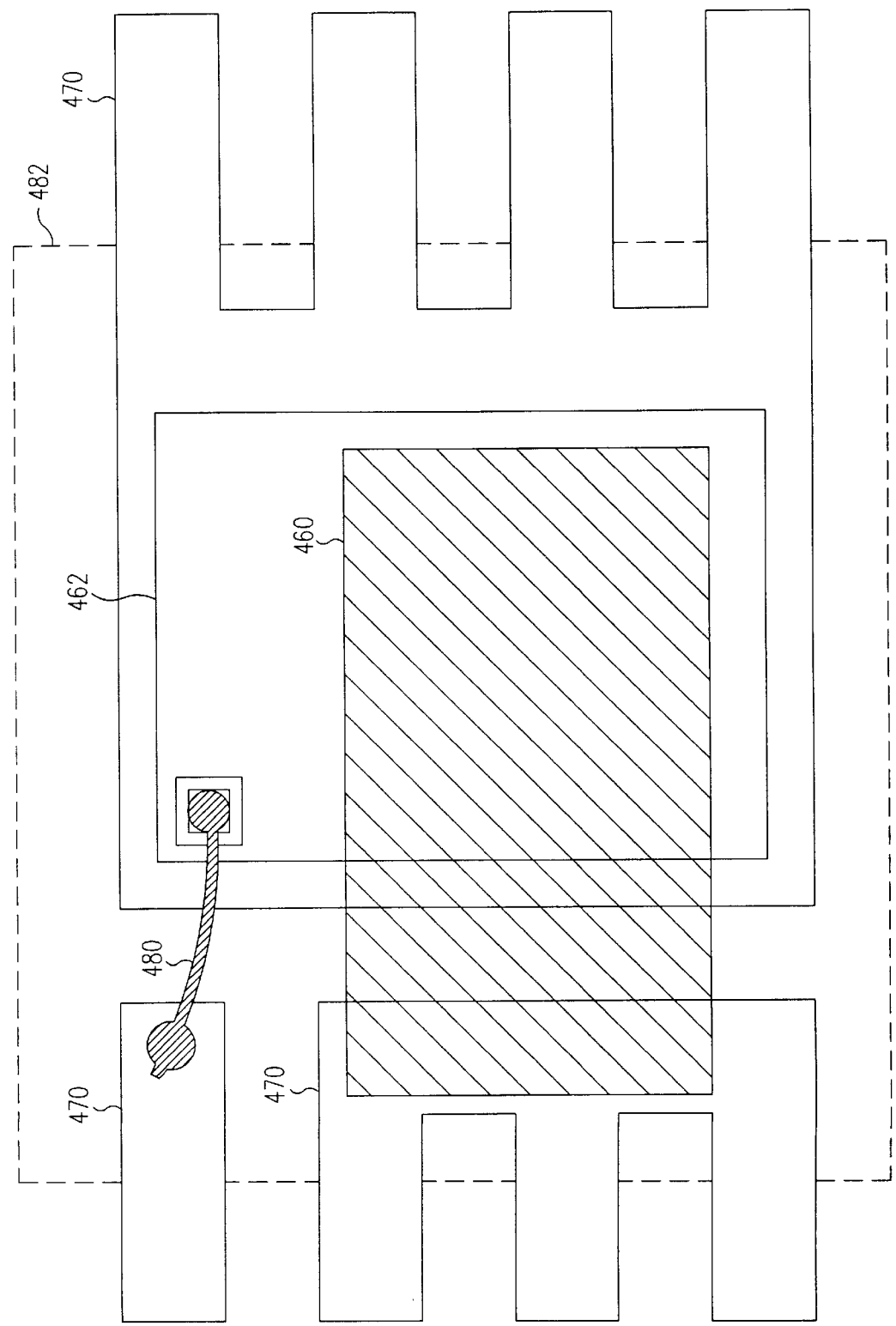
Figure 2Q:
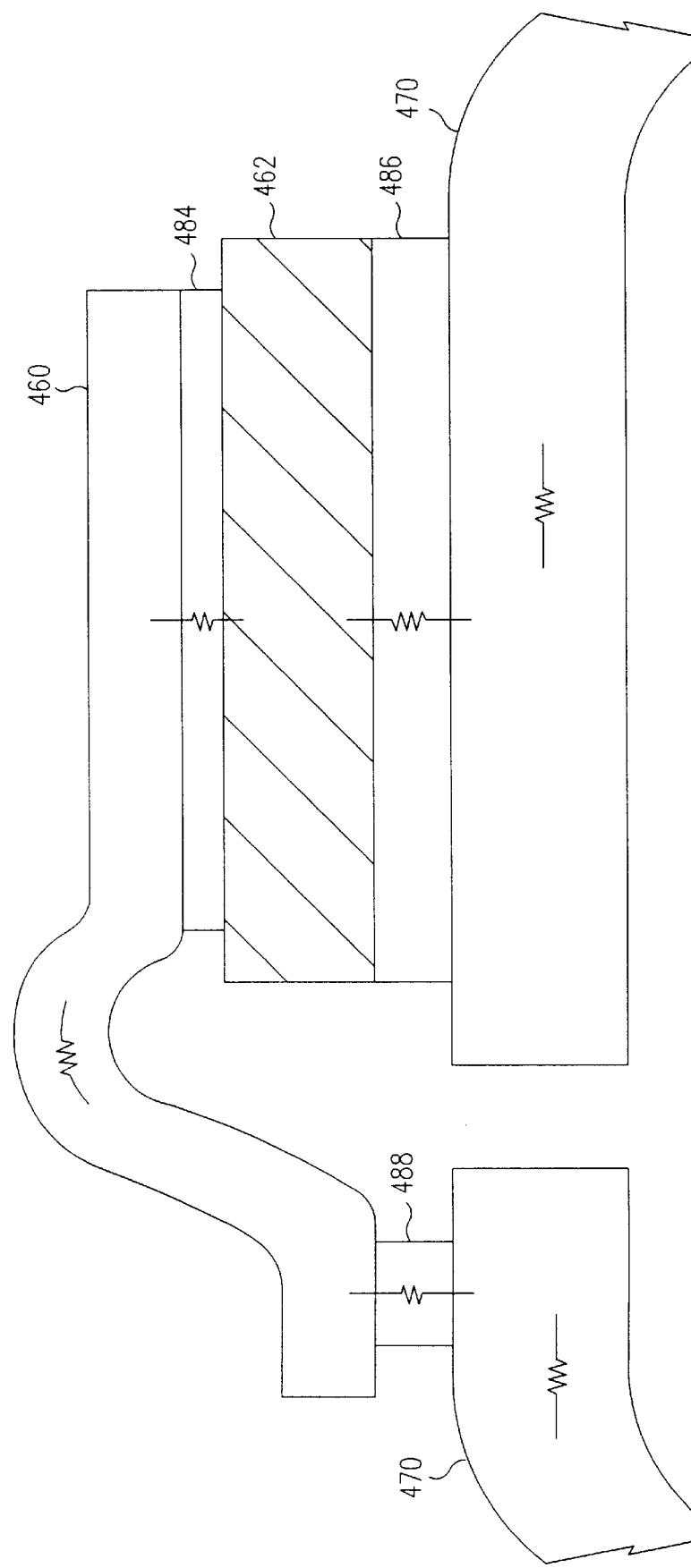
Figure 2R:
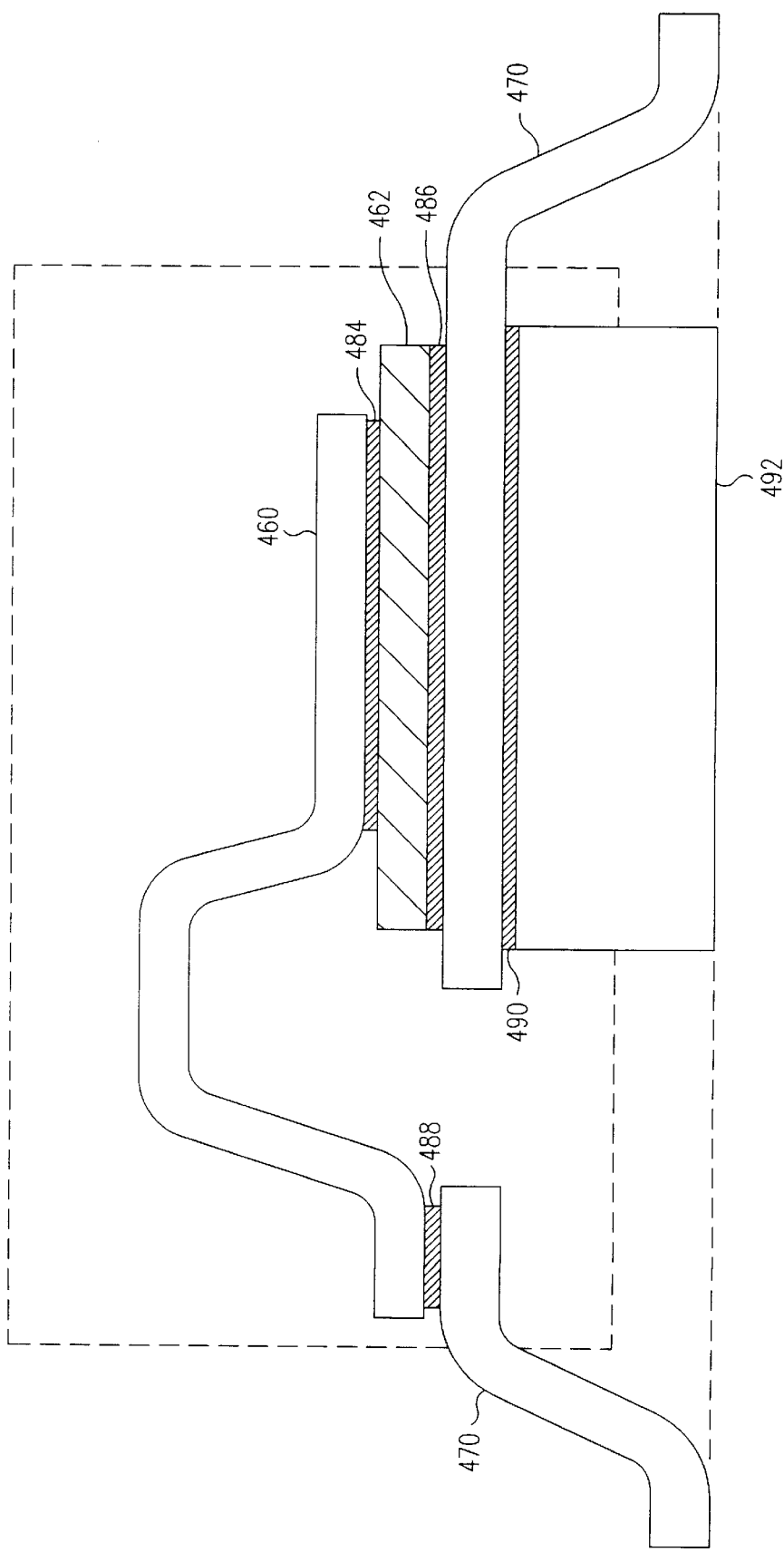
Figure 3A:
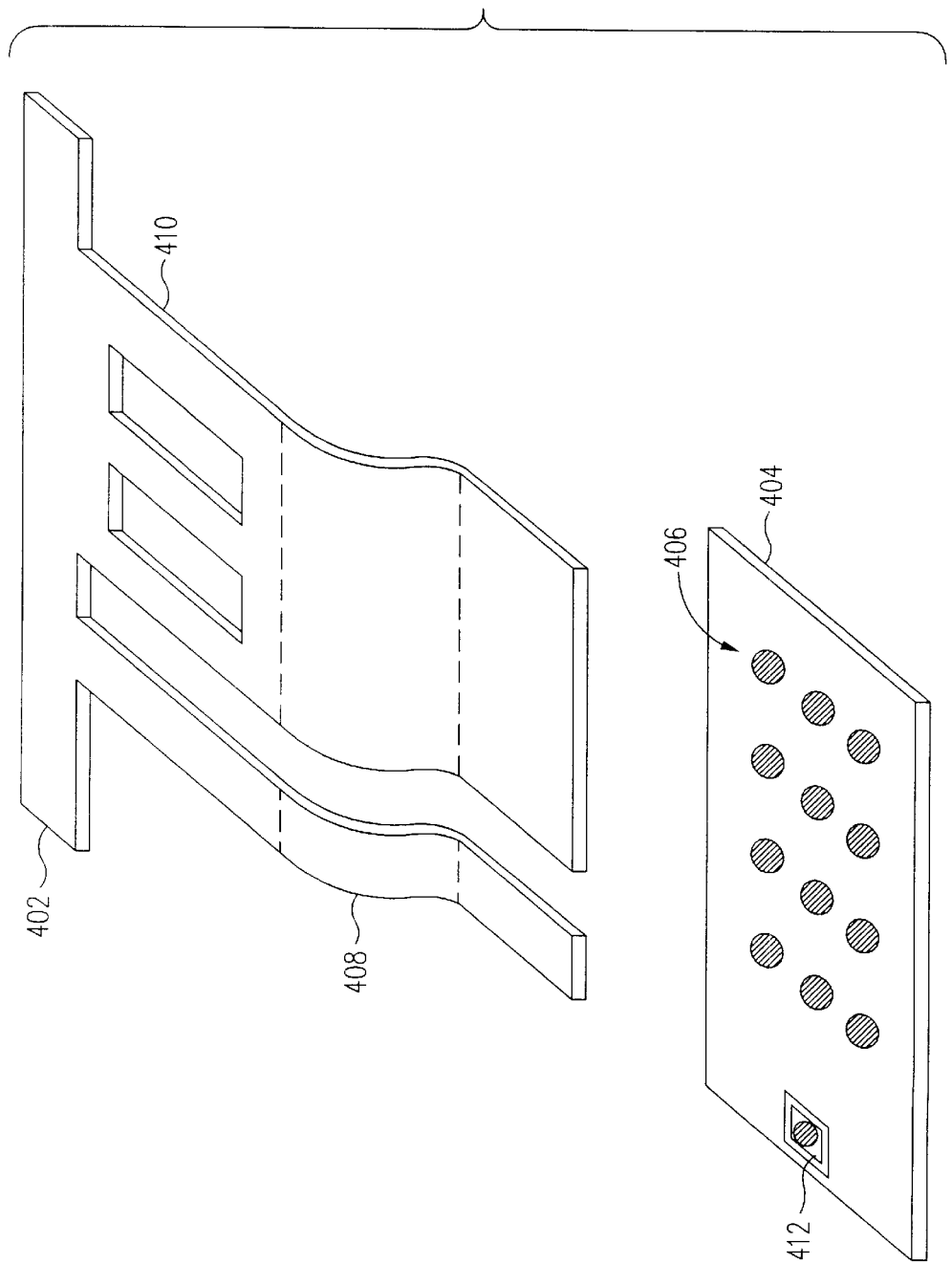
FIGS. 3A–3H illustrate the problem of lead coplanarity in package design.
Figure 3B:
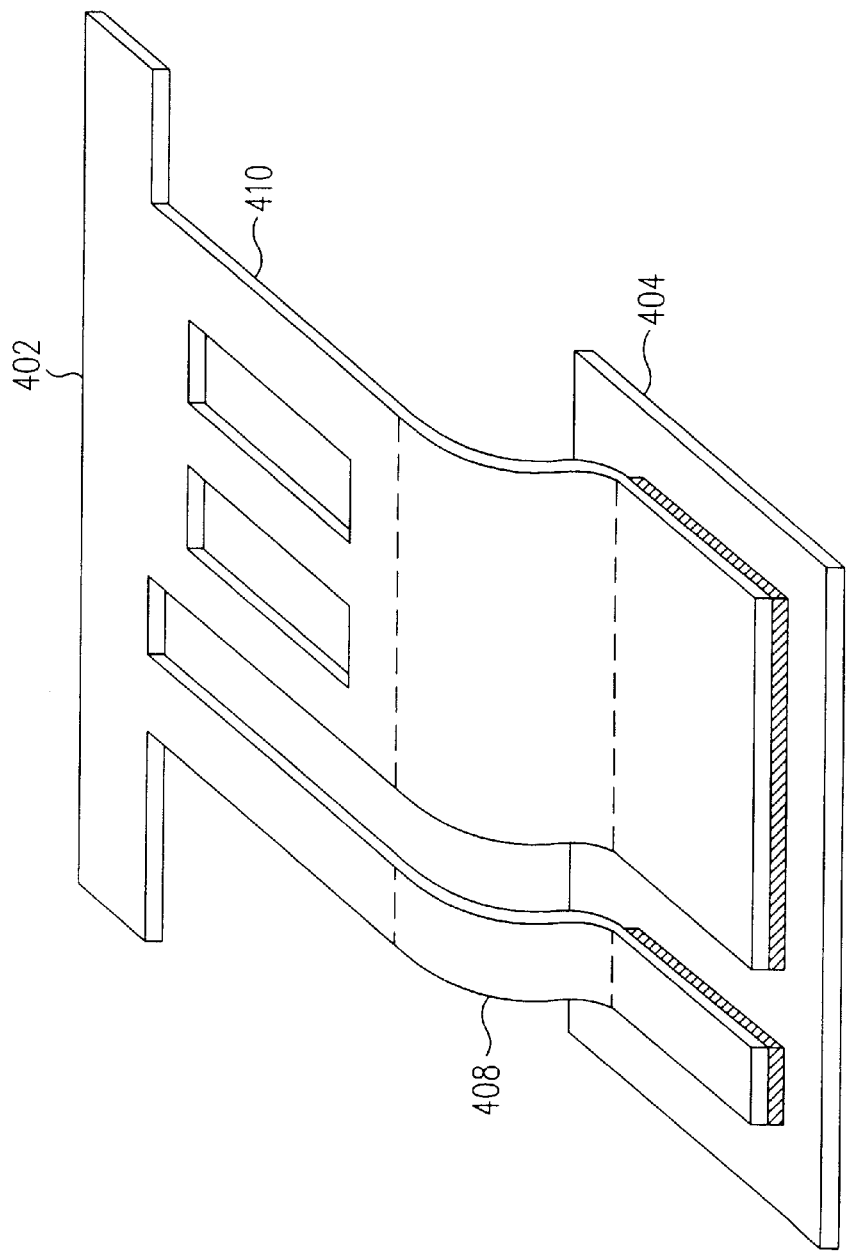
Figure 3C:
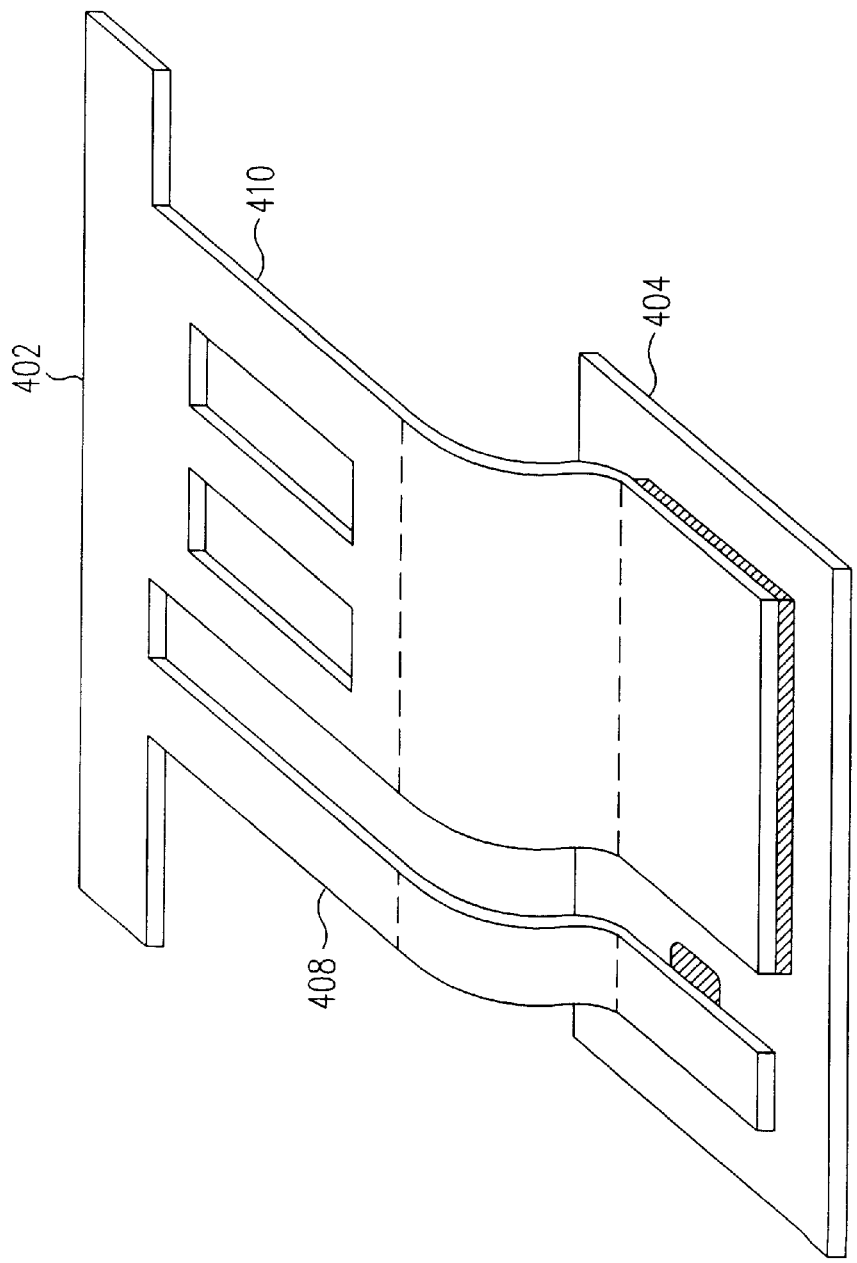
Figure 3E:
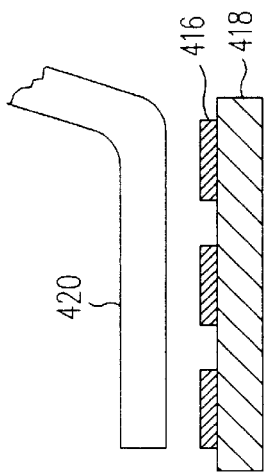
Figure 3D:
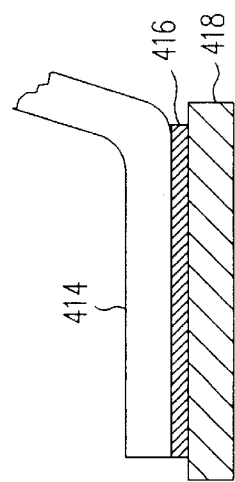
Figure 3H:
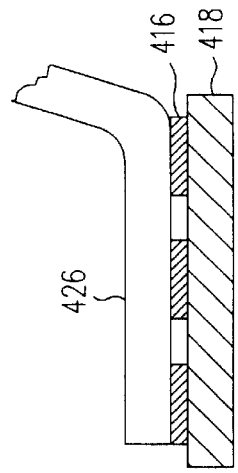
Figure 3G:
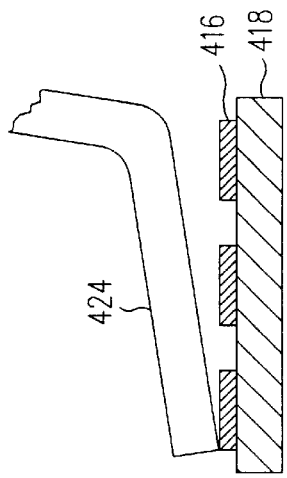
Figure 3F:
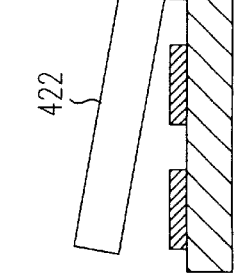
Figure 5:
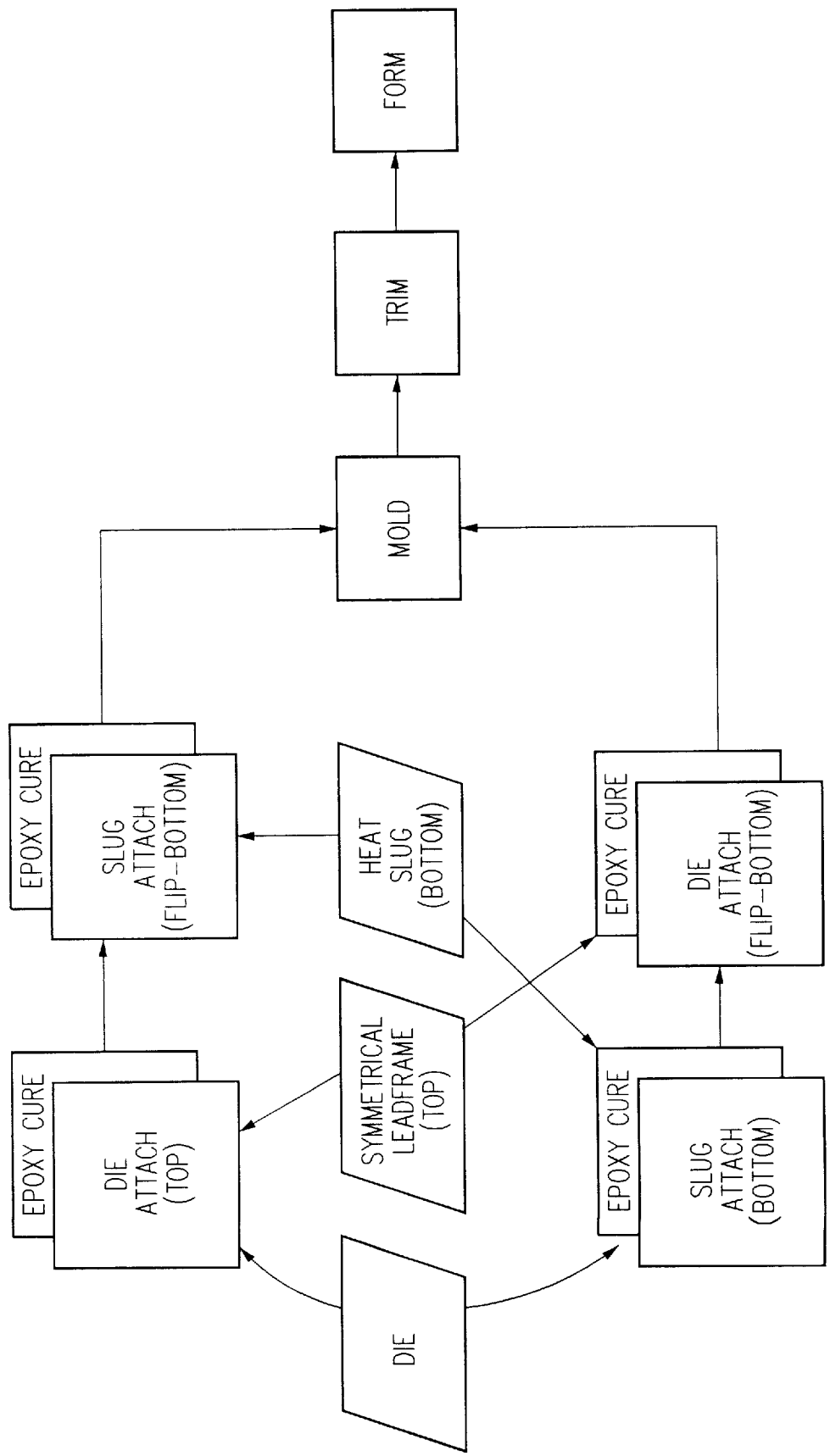
FIG. 5 is a flow chart of a process sequence for fabricating a semiconductor package in accordance with this invention.

FIG. 5 illustrates a process sequence for fabricating a semiconductor package including a symmetrical lead frame in accordance with this invention. The process uses essentially three components: a semiconductor die, a symmetrical lead frame and a heat sink which is attached to the bottom of the die. There are two alternative process flows. In the first process, the die is initially attached to the symmetrical lead frame, using a conductive epoxy or soft solder. If an epoxy is used, the epoxy must be cured. Then the heat sink is attached to the bottom of the die, again using epoxy or solder. Alternatively, the die is initially attached to the heat sink and then to the lead frame. In either case, the result is a sandwich including the heat sink, the die and the symmetrical lead frame.

A plastic capsule is then injection-molded around the die, the lead frame is trimmed to remove the outer tie bars, and the leads are bent or formed to allow them to be connected to a flat surface, such as circuit board.

FIGS. 6A–6F illustrate a preferred process. The process is used to package a three-terminal die, such as a power MOSFET. MOSFET 110 includes a source terminal 112, a gate terminal 114 and a drain terminal (not shown) which is on the bottom surface of die 110.

Figure 6A:
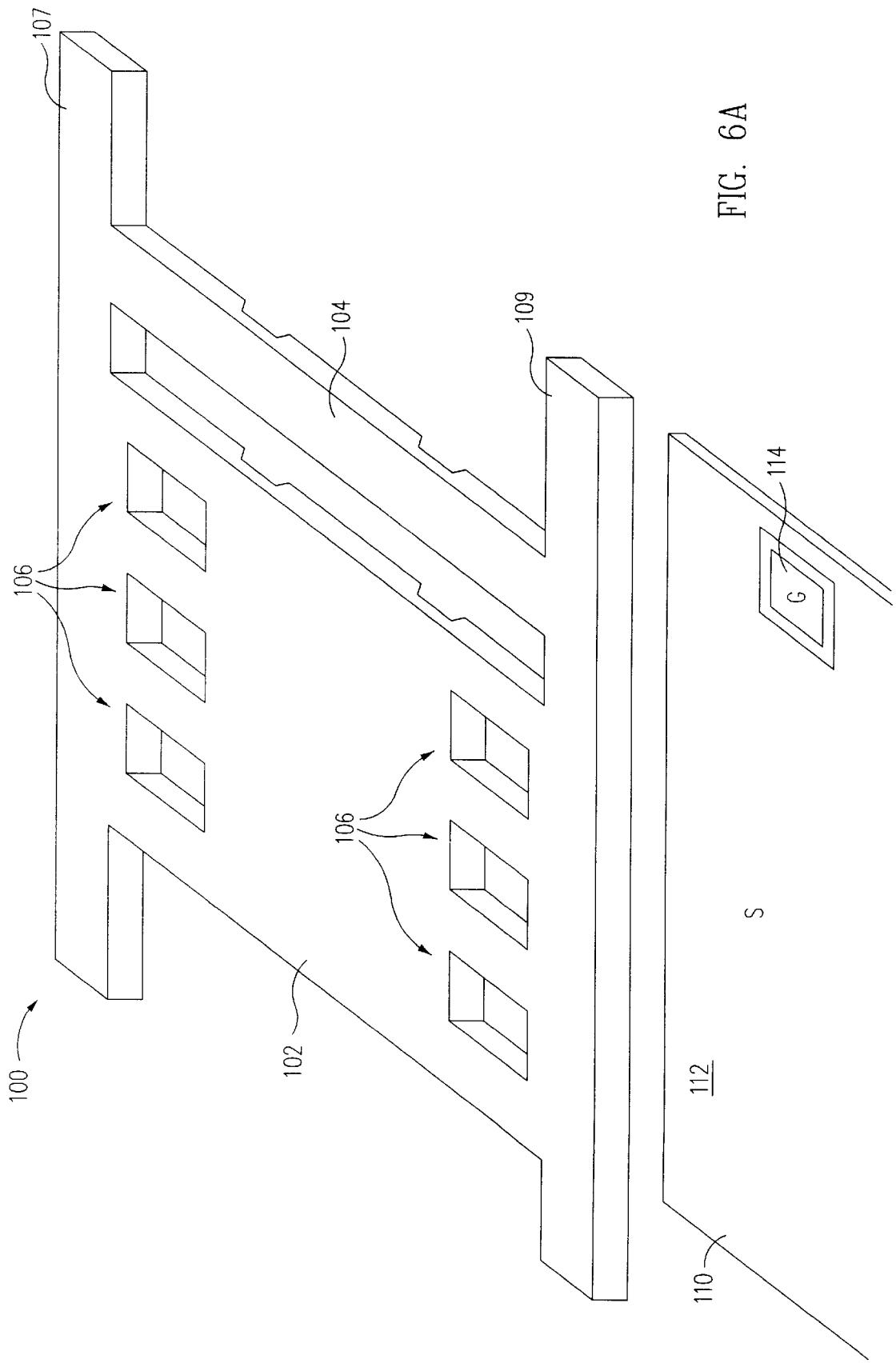
FIGS. 6A–6F illustrate the steps of a process described in FIG. 5.
Figure 6B:
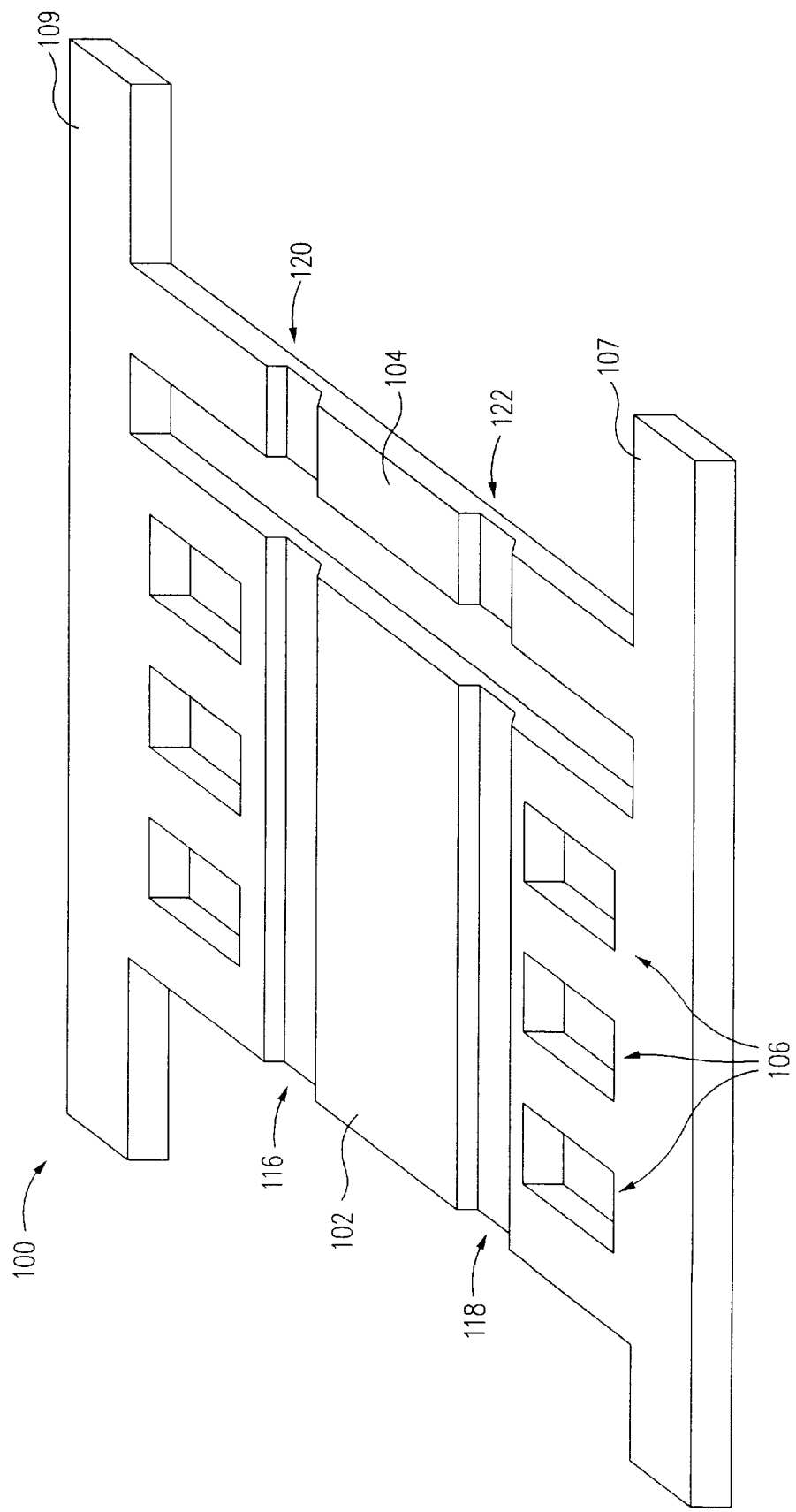

As shown in FIG. 6A, lead frame 100 includes a relatively large central portion 102 which will be attached to the source terminal 112 and a relatively thin lead 104 that will be attached to the gate terminal 114. Portion 102 and lead 104 are connected together by tie bars 107 and 109. Six cutouts 106 are formed in portion 102, creating a total of eight source leads. Leadframe 100 is typically formed from a sheet of a metal such as aluminum or copper and is from 3 to 15 mils thick, with 6–7 mils being a common thickness FIG. 6B shows the underside of lead frame 100. Notches 116 and 118 are formed in portion 102 in locations where portion 102 will overlie the edges of die 110. Similarly, notches 120 and 122 are formed in lead 104. Notches 116, 118, 120 and 122 could have depths ranging from 10% to 80% of the total thickness of lead frame 100. Typically, the depth of notches 116, 118, 120 and 122 would be approximately 20% of the thickness of lead frame 100. For example, if lead frame 100 is six or seven mils thick, the notches would be approximately 2 mils (50 μm) deep. Notches 116, 118, 120 and 122 could be etched from the lead frame, using the known "half etch" process, or they could be formed using a stamping machine which could also be used to form holes 106.

Notches 116, 118, 120 and 122 need to be wide enough to allow for errors in the placement of the die, plus variations in the width of the saw blade (called the "kerf") is used to separate the dice. Typically, the notches would be four mils wide and two mils deep.

Figure 6C:
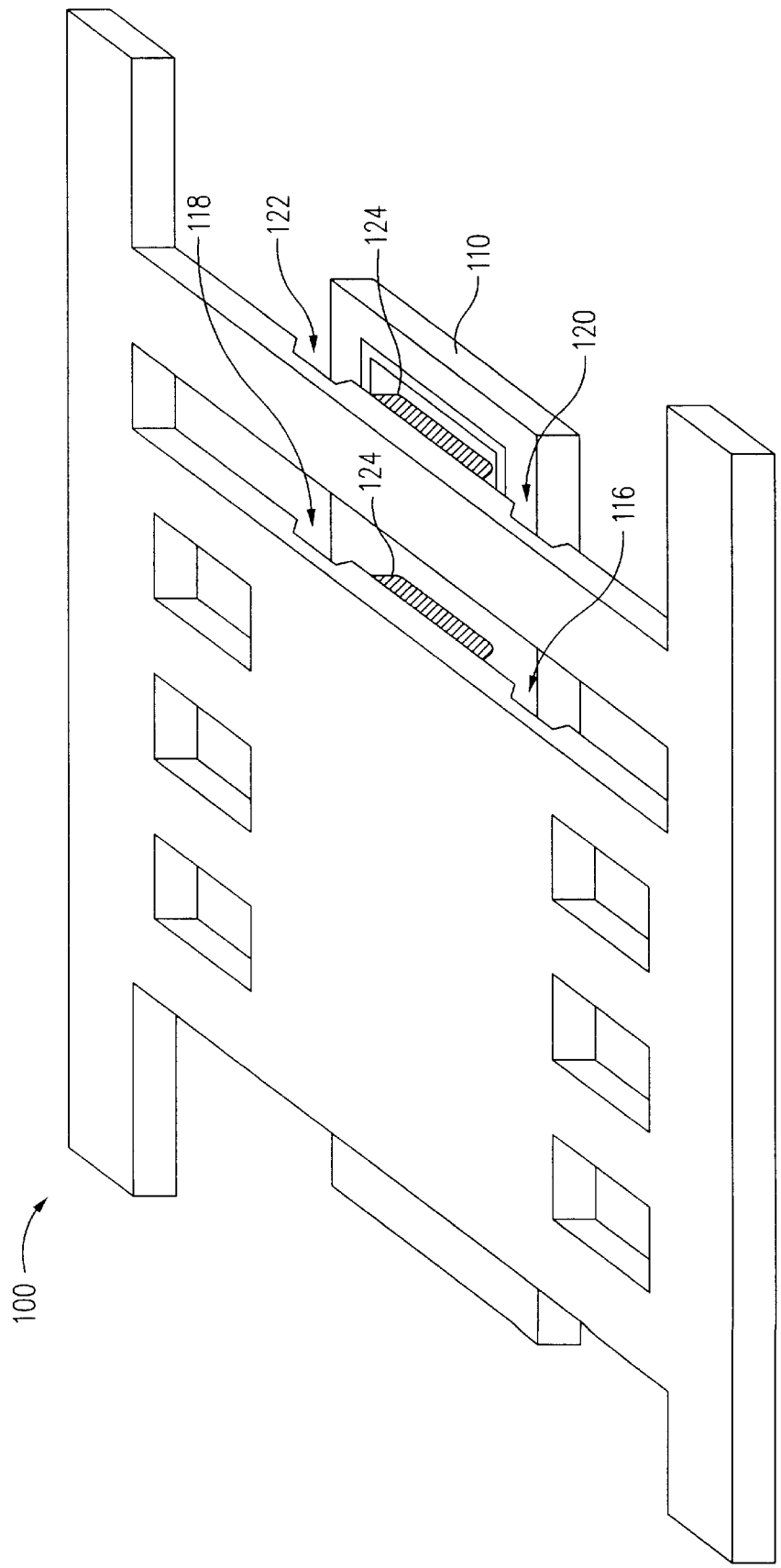

FIG. 6C shows lead frame 100 attached to die 110 by a layer of epoxy 124, with notches 116, 118, 120 and 122 overhanging the edges of die 110. This insures that lead frame 100 does not contact the edges of die 110 which, as noted above, may contain sensitive components such as an equipotential ring (EQR) that is biased at the potential of the backside of the die. The epoxy 124 can be applied to either the lead frame 100 or the die 110, although typically the epoxy is applied to the lead frame. The lead frame 100 and die 110 are then placed in a die-attachment machine where they are squeezed together. The epoxy is then partially or fully cured so that it chemically reacts to the points, areas or regions of contact on lead frame 100 and die 110.

Figure 6D:
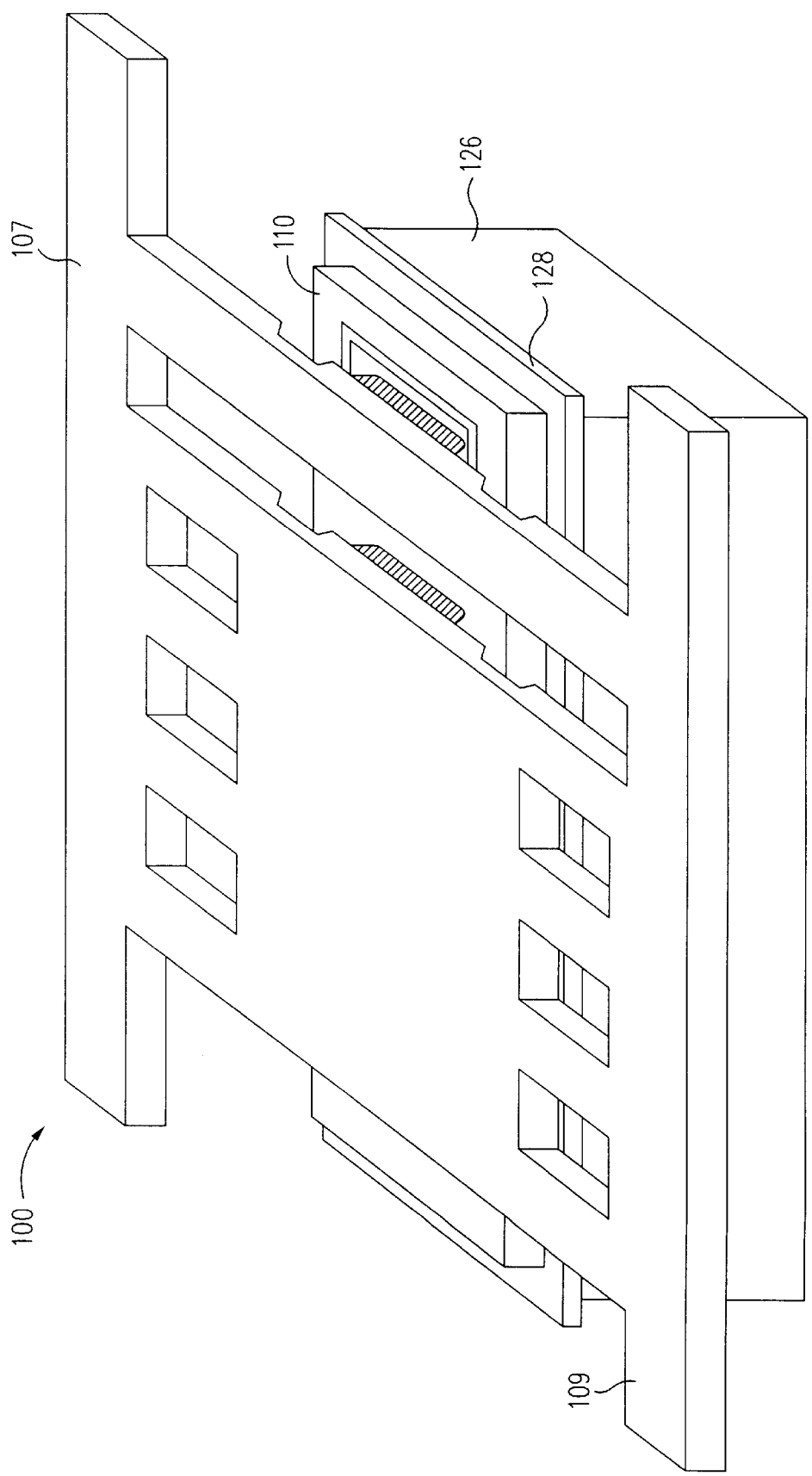

FIG. 6D shows the combination of lead frame 100 and die 110 with a heat sink 126 attached to the backside of die 110. Heat sink 126 is attached to die 110 with epoxy in the same manner as described above. Heat sink 126 may be formed of copper and contains a lip 128, the function of which is described below.

Figure 6E:
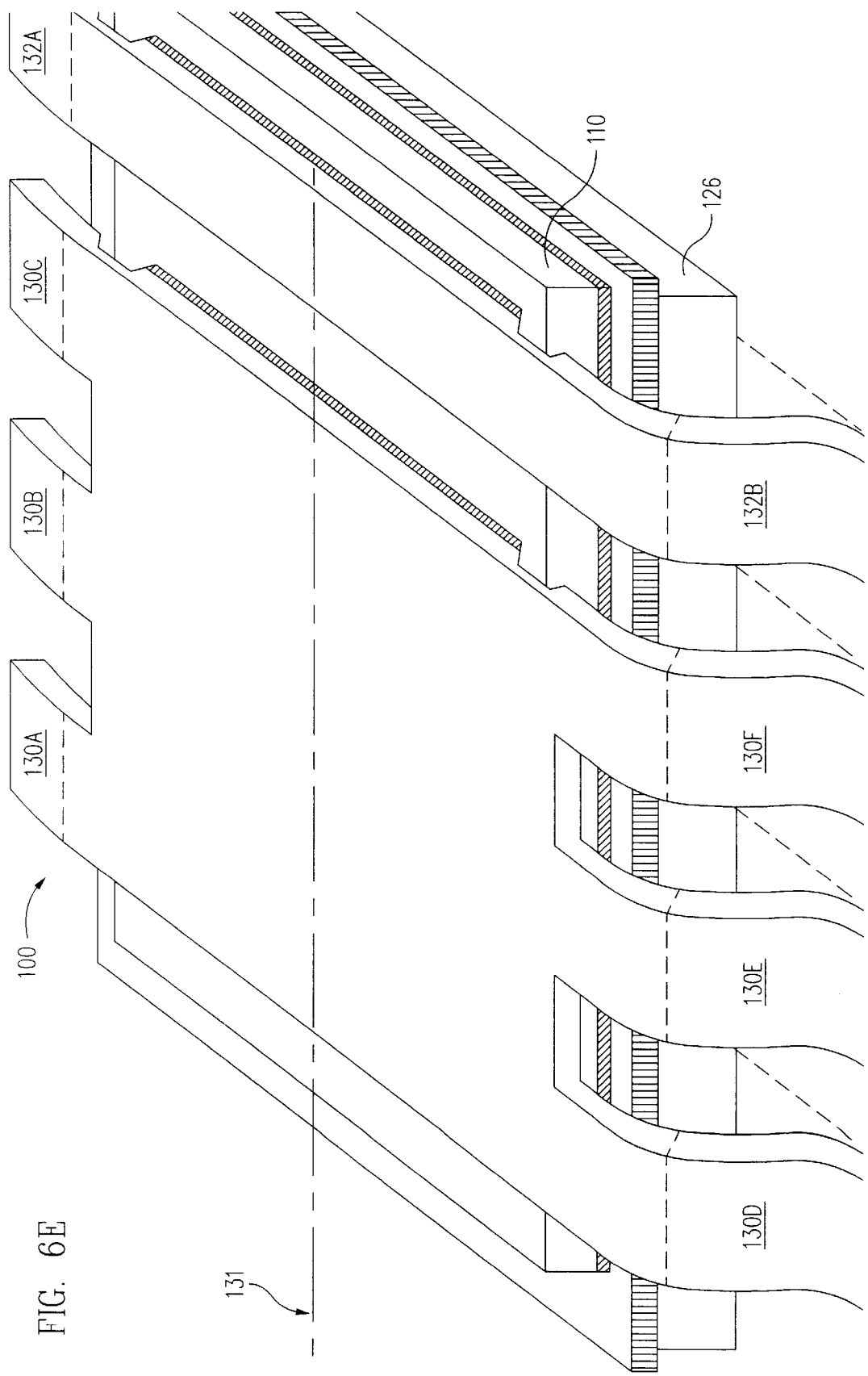

The structure is then encased in a capsule of injection-molded plastic (nor shown) and, as shown in FIG. 6E, tie bars 107 and 109 are trimmed, yielding six leads 130A–130F connected to the source terminal of die 110 and two leads 132A and 132B connected to the gate terminal of die 110. As is evident, leads 130A–130F and 132A and 132B form structures that are symmetrical about an axis 131 of die 110. Furthermore, until the leads are trimmed from the leadframe, the leads are held stable by only the outer tie bars 107 and 109 and did not require any central tie bars which produce the torque and twisting common to the asymmetrical designs described in the above-referenced application Ser. No. 09/322,127.

Figure 6F:
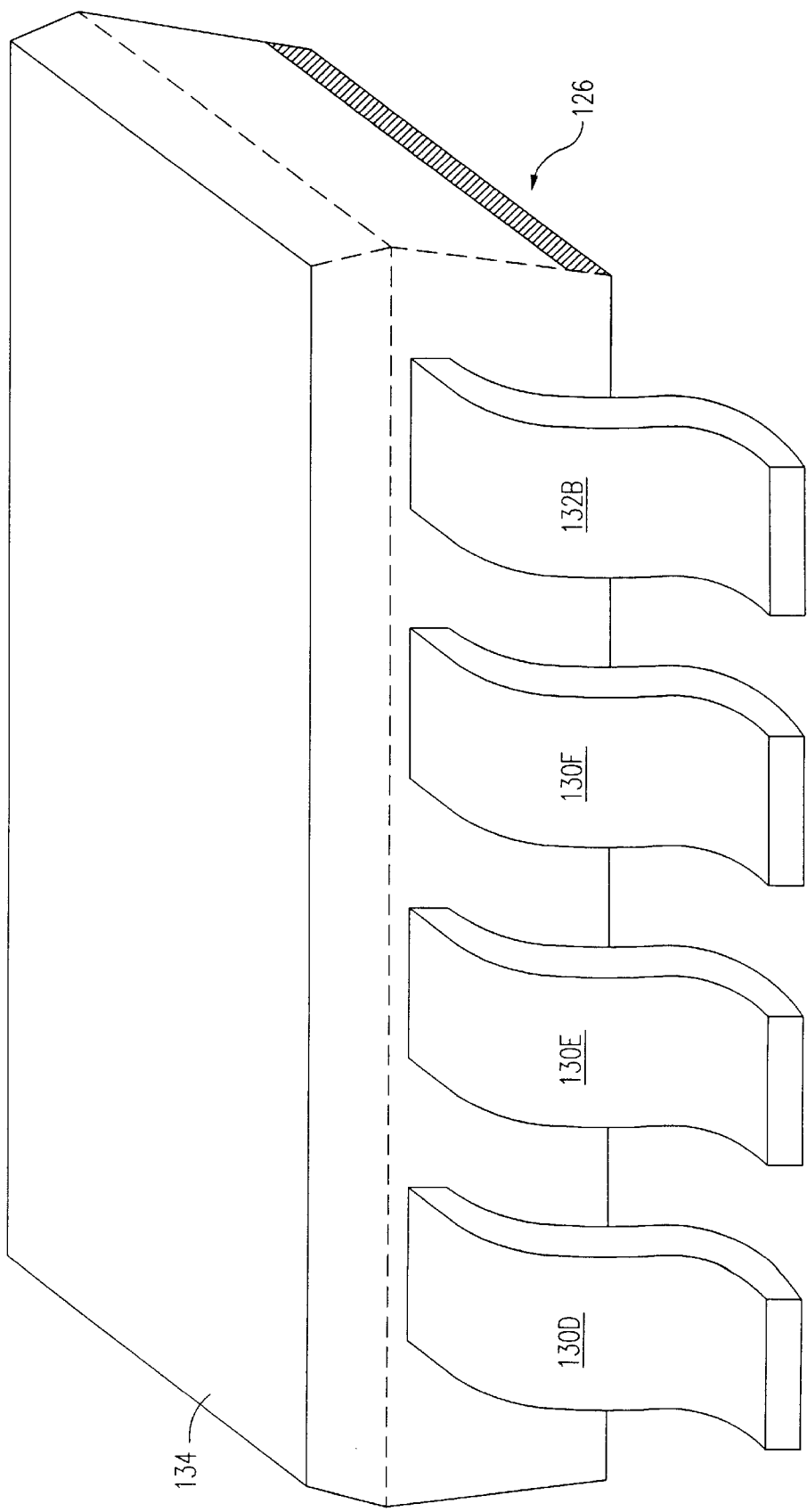

FIG. 6F shows the structure after the leads 130A–130F and 132A and 132B have been bent such that the bottoms of the outer portions of the leads are bent flat and are coplanar and can make contact with a flat surface, such as a printed circuit board. FIG. 6F also shows the plastic capsule 134 which encases the die 110. Plastic capsule 134 does not cover the bottom surface of heat sink 126, which is left exposed to provide an electrical contact with the backside of die 110. In FIG. 6F, an edge of heat sink 126 is also left exposed (as shown by the arrow) to allow a visual confirmation that the epoxy or solder used to make a connection between heat sink 126 and a printed circuit board has properly wetted and flowed (and in the case of epoxy, evenly distributed) so as to establish a good electrical connection.

As noted above, heat sink 126 is a block of a metal, such as copper. While heat sink 126 serves to conduct heat away from die 110, any block of metal could be used in place of heat sink 126, whether or not in the particular application it serves primarily as a "heat sink" or thermal conductor. In some applications, the metal block could serve primarily as a low-resistance connection to the backside of the die. Thus, as used herein, the term "heat sink" includes any block or piece of metal that is used to form an electrical and/or thermal connection to the backside (bottom) of the die.

Figure 7A:
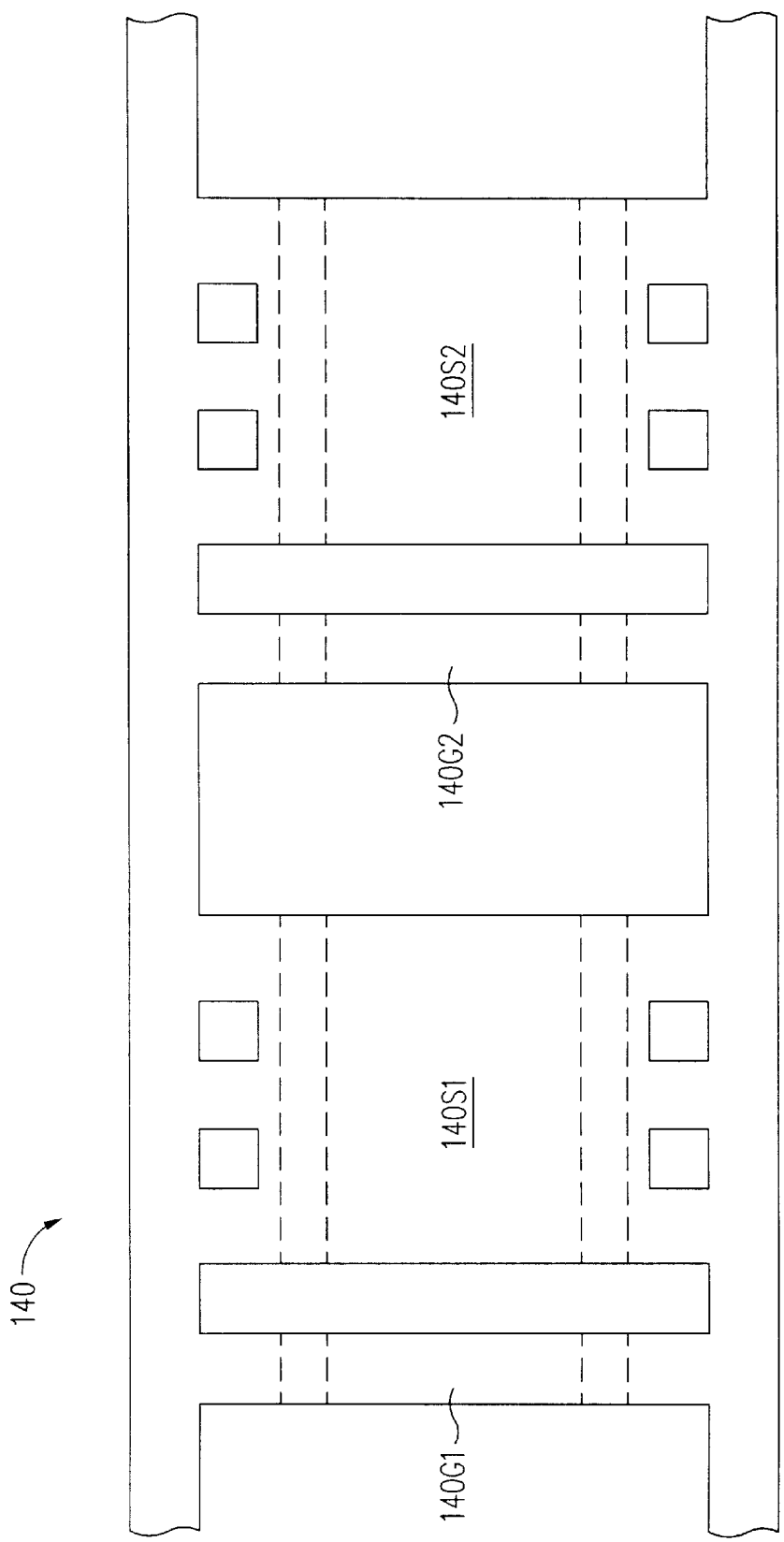
FIGS. 7A–7H illustrate the steps of a process of attaching at least two dice to a strip lead frame in accordance with this invention.
Figure 7B:
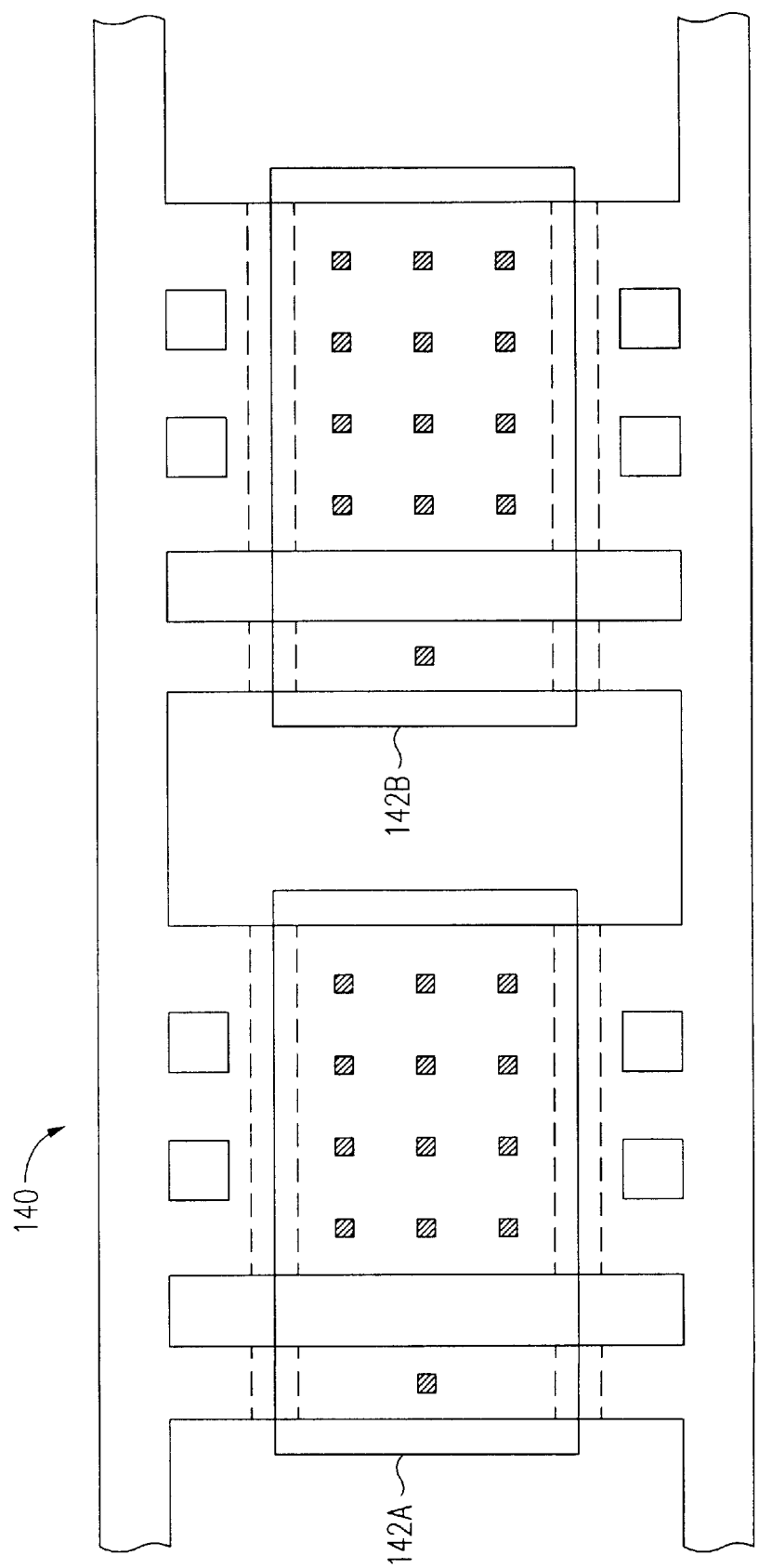
Figure 7C:
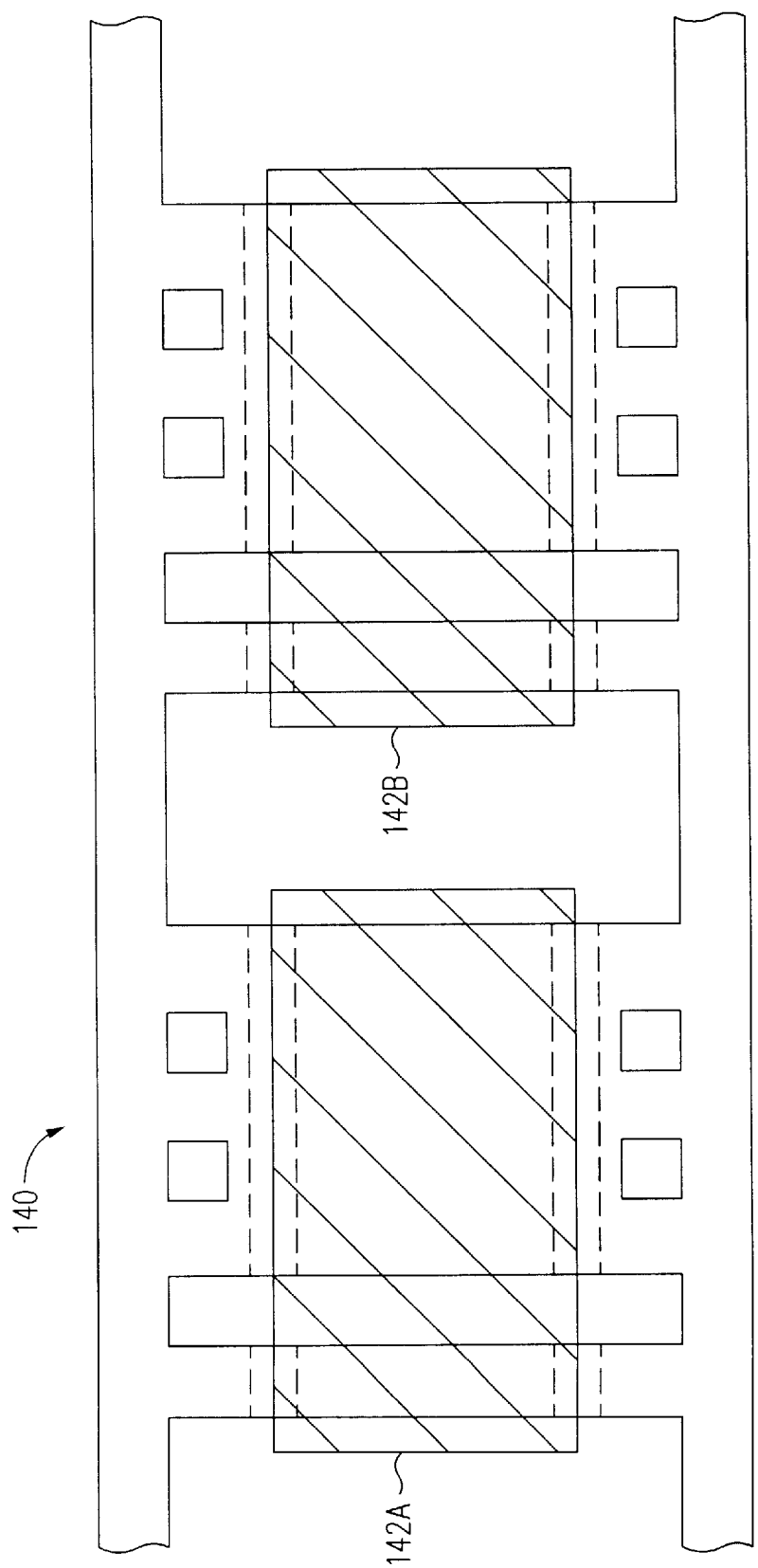
Figure 7D:
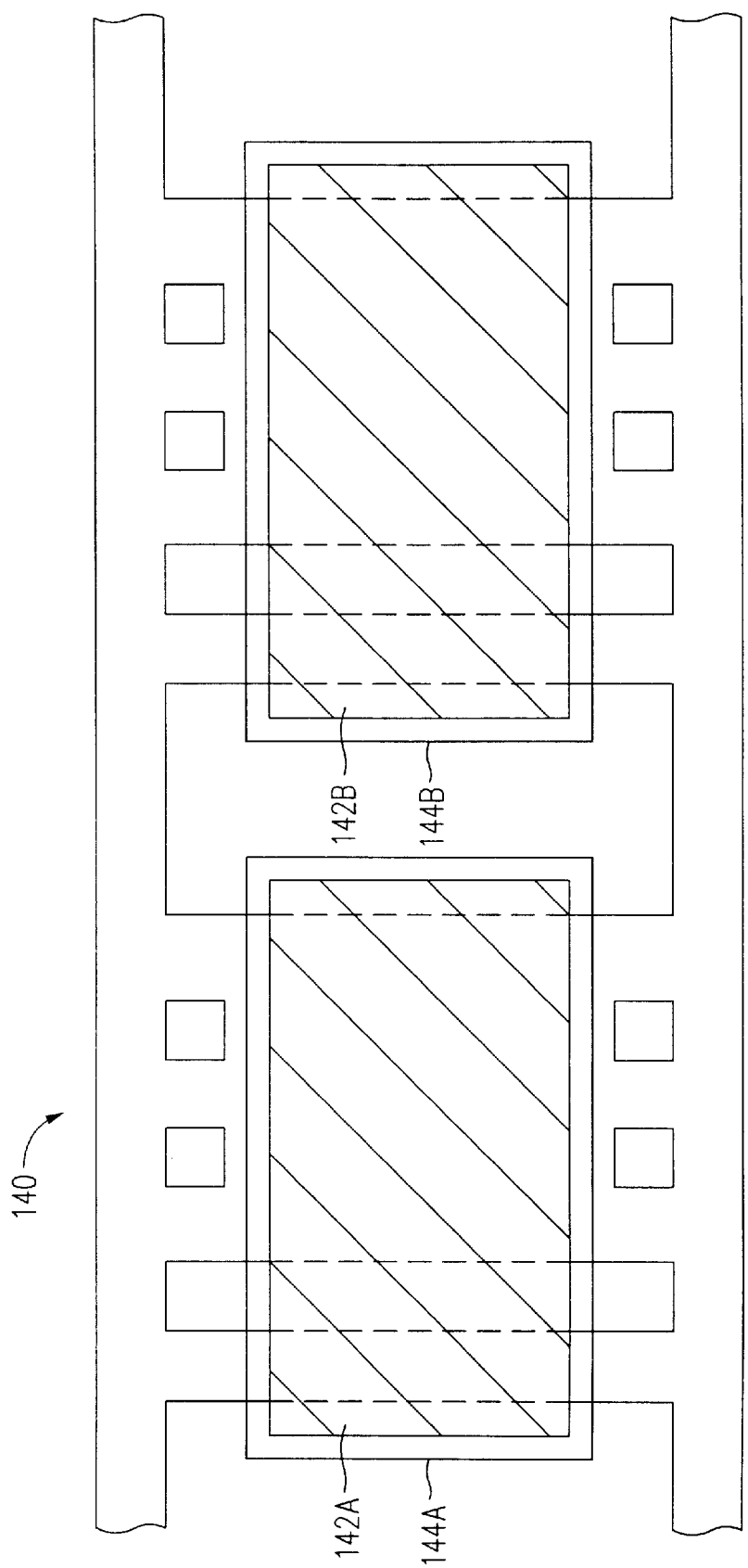
Figure 7E:
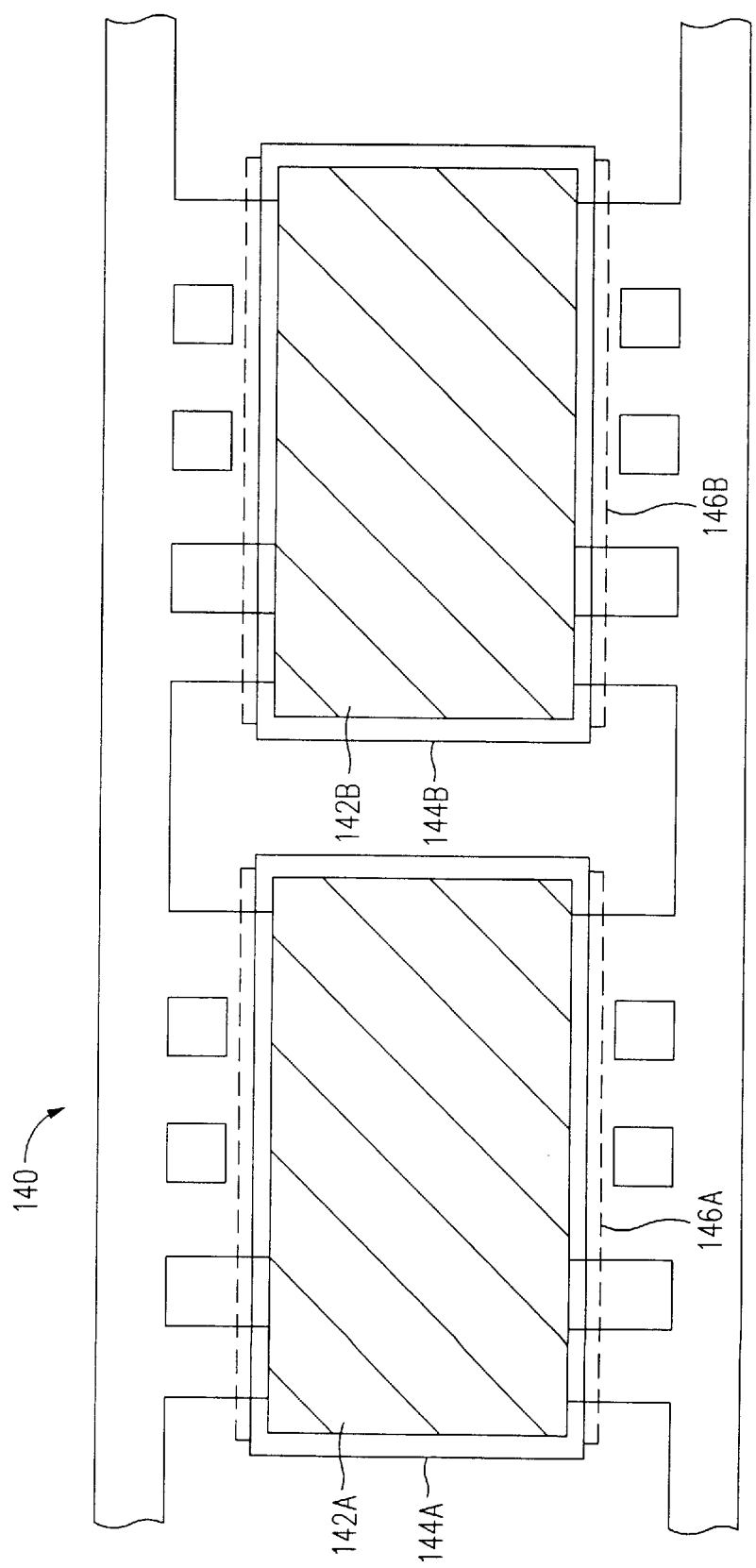

A single lead frame may contain numerous repetitions of the source and gate leads illustrated in FIG. 6A. For example, lead frame 140, shown in FIG. 7A includes gate leads 140G1 and 140G2 and source leads 140S1 and 140S2. FIG. 7B shows lead frame 140 with dice 142A and 142B positioned over the lead frame, and FIG. 7C shows dice 142A and 142B attached to lead frame 140. FIG. 7D shows heat sinks 144A and 144B attached to dice 142A and 142B, respectively. Finally, in FIG. 7E, dice 142A and 142B are enclosed in plastic capsules 146A and 146B, respectively.

Figure 7G:
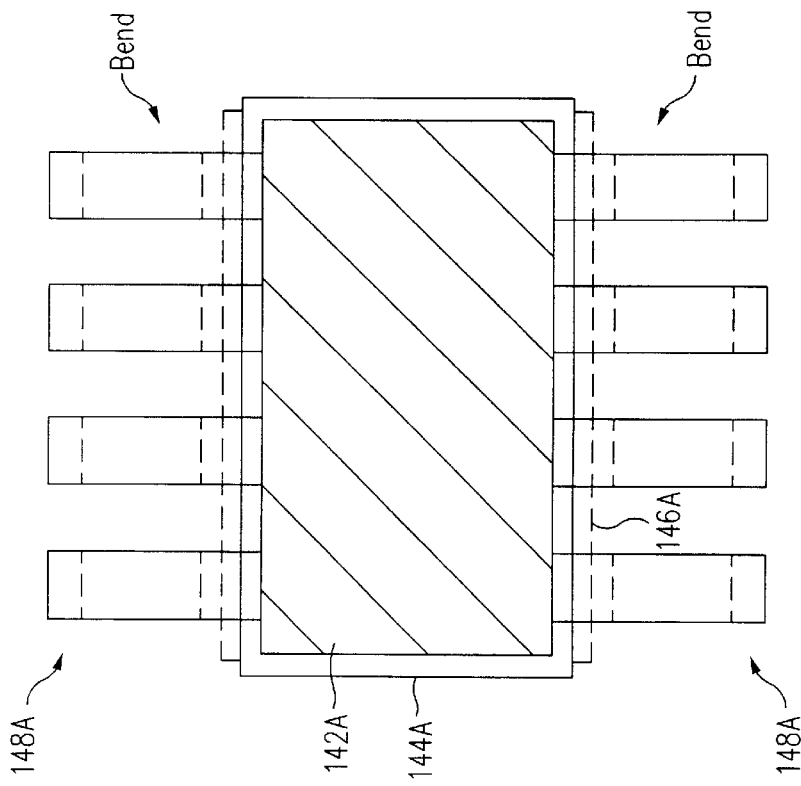
Figure 7F:
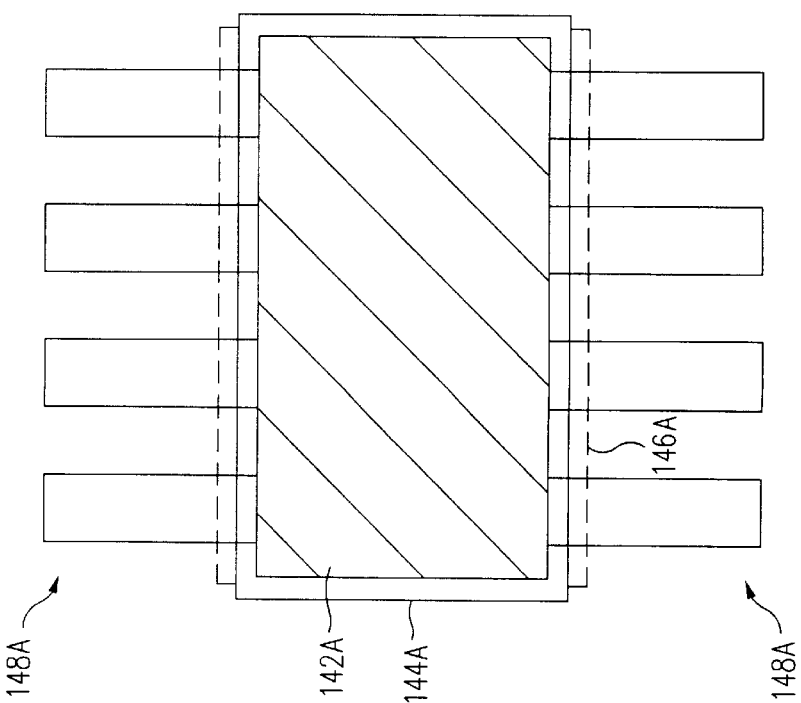

After the plastic has been molded, the tie bars are trimmed, leaving the structure illustrated in FIG. 7F with four leads protruding from each side of the package. As described above, six of the leads 148A are connected to the source terminal and two of the leads 148A are connected to the gate terminal. The leads 148A are then bent to form a surface mount package, as shown in FIG. 7G.

Figure 7H:
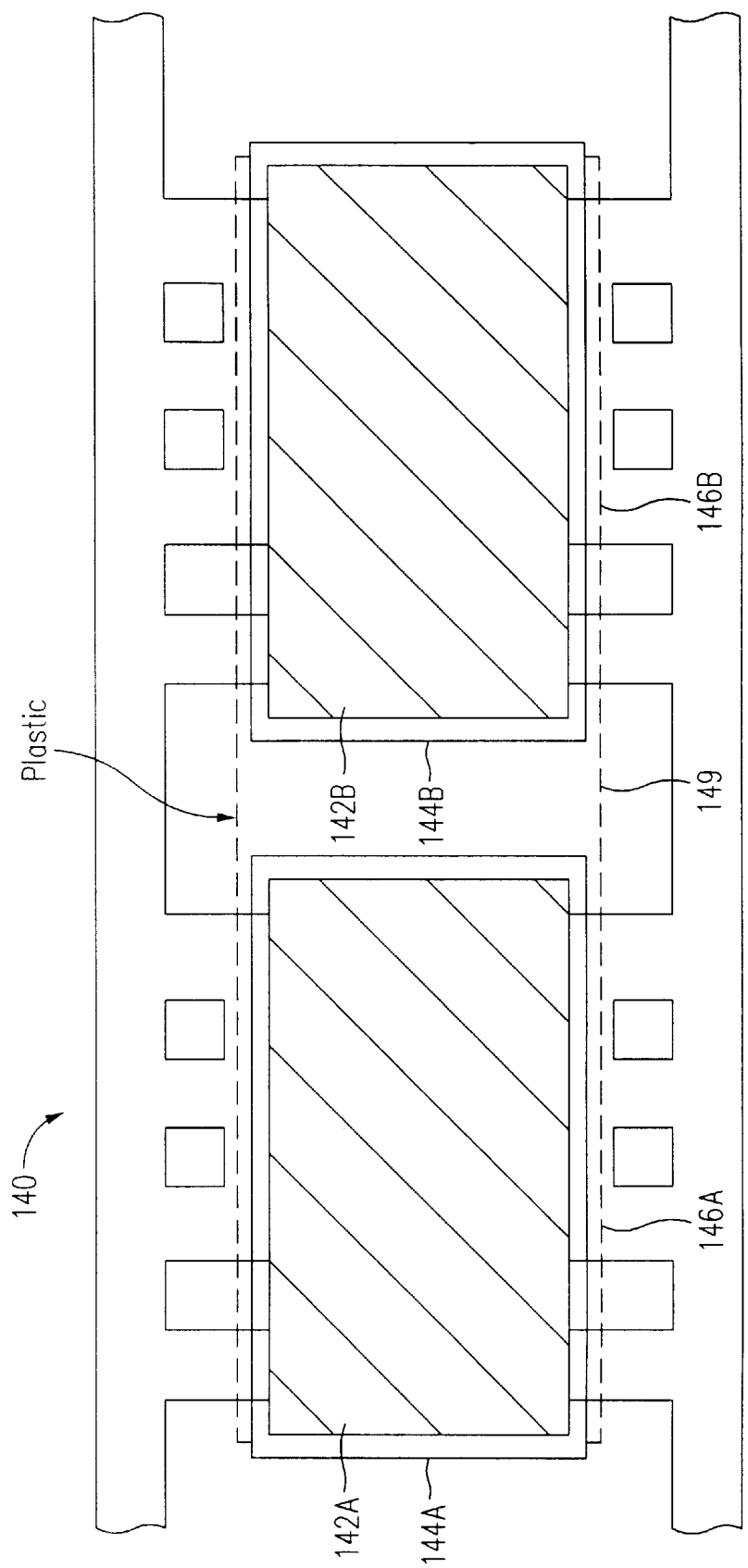

It is also possible to mold the entire structure into a multi-die plastic capsule 149 containing both dice 142A and 142B and having eight leads instead of four leads, as shown in FIG. 7H. This is particularly convenient with the lead-frames of this invention because in many embodiments there are no central tie bars that would create an electrical connection between the adjacent dice in the plastic capsule.

Figure 8E:
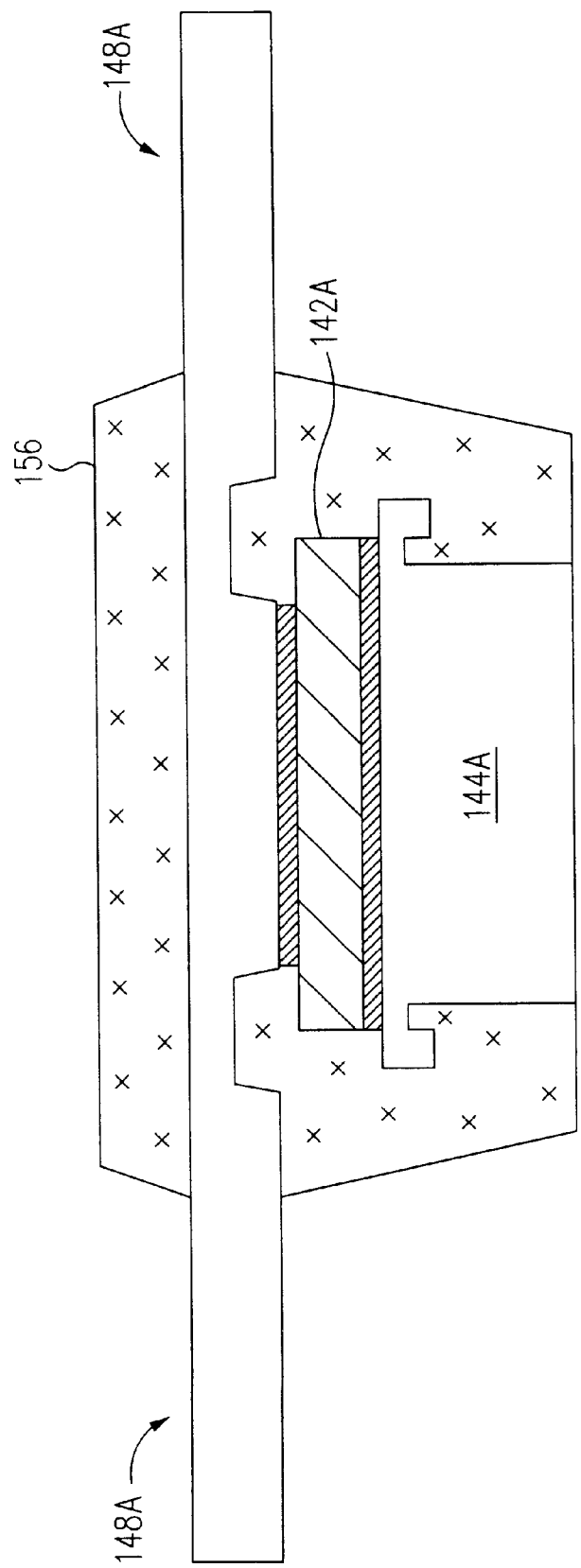
Figure 8F:
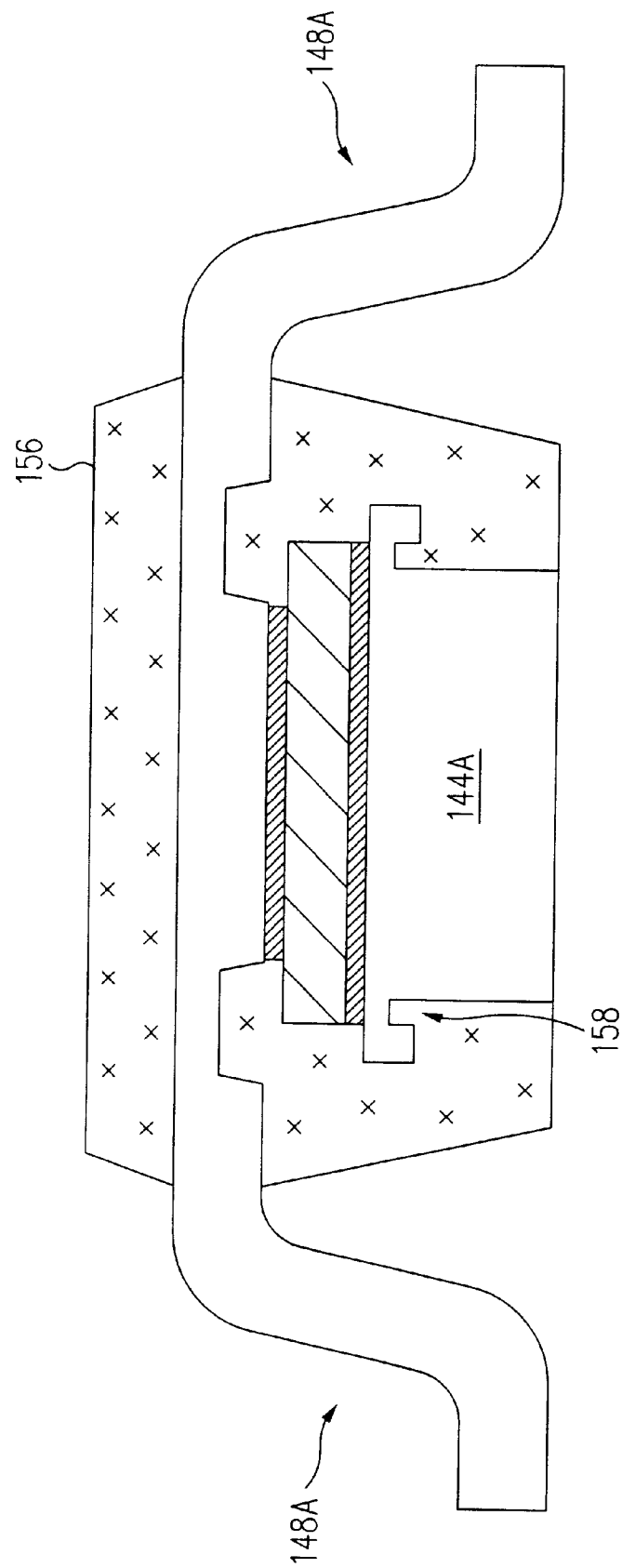
Figure 8G:
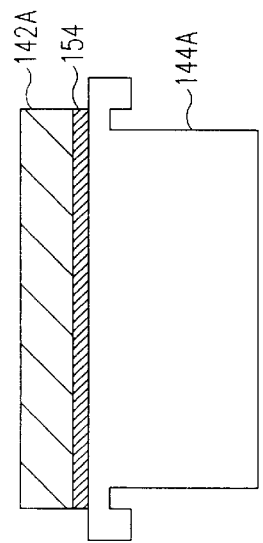
FIGS. 8G–8J illustrate the steps of a process wherein the die is initially attached to the heat sink and then to the lead frame.
Figure 8H:
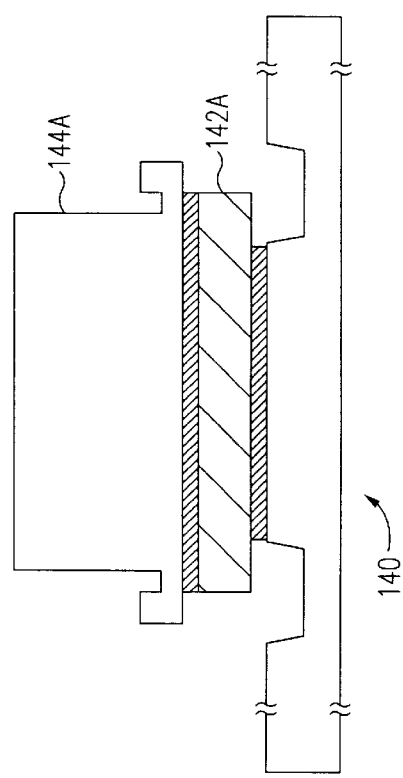
Figure 8I:
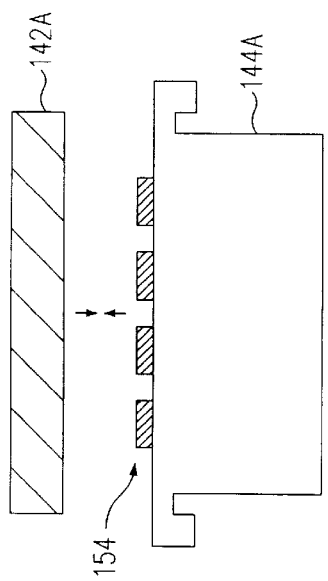
Figure 8J:
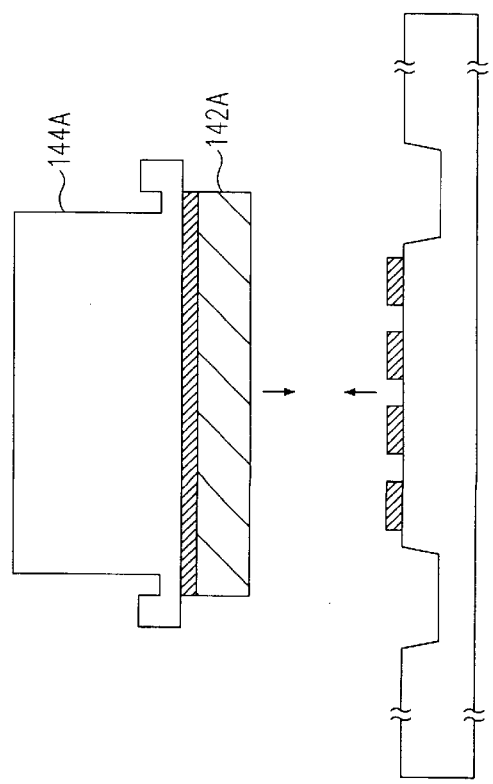

FIG. 8A shows cross-sectional view of lead frame 140 positioned over die 142A, with epoxy dots 150 on the surface of lead frame 140. FIG. 8B shows die 142 attached to lead frame 140. Epoxy dots 150 have spread out to form a single epoxy layer 152. Note that the notches in lead frame 140 overlie the edges of die 142A. FIG. 8C shows die 142A positioned over heat sink 144A, and FIG. 8D shows die 142A and heat frame 144A attached by an epoxy layer 154. FIG. 8E shows the structure after a plastic capsule 156 has been injection-molded around die 142A and heat sink 144A, with leads 148A protruding from either side. In FIG. 8F, leads 148A have been bent to form a surface mount package. Note that the bottom surface of heat sink 144A is exposed.

As shown in FIGS. 8G–8J, the attachment process can be reversed, with die 142A being attached first to heat sink 144A and then to lead frame 140.

Figure 9A:
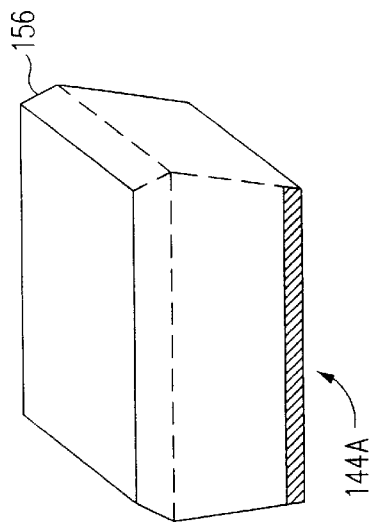
FIGS. 9A–9D illustrate prospective views of a plastic capsule in accordance with this invention, showing various ways in which the heat sink may be exposed.
Figure 9B:
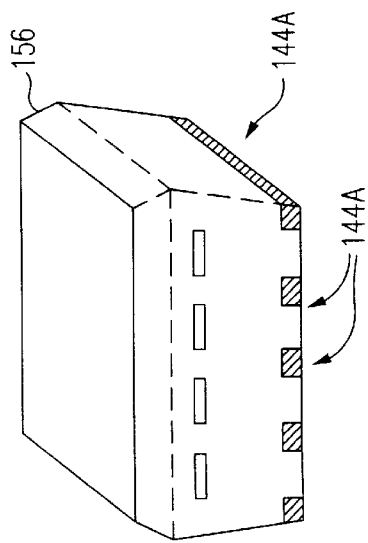
Figure 9C:
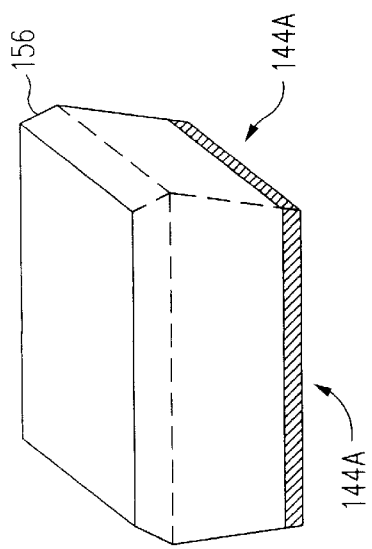
Figure 9D:
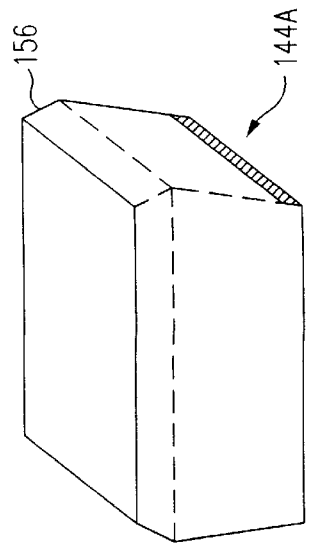
Figure 9G:
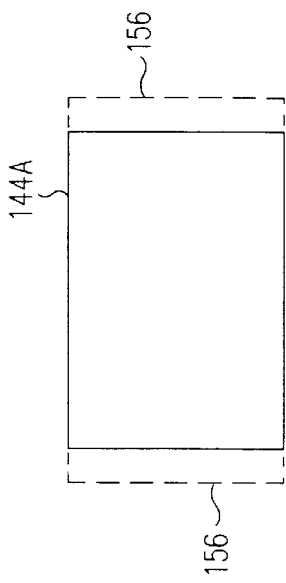
FIGS. 9E–9H illustrate bottom views of the plastic capsules illustrated in FIGS. 9A–9D.
Figure 9H:
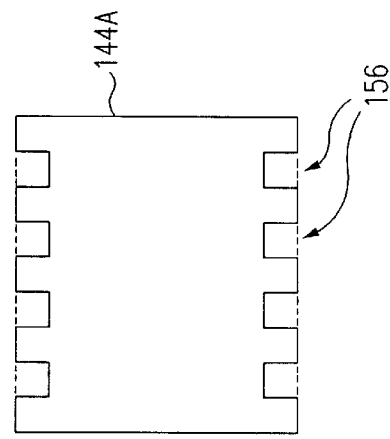
Figure 9E:
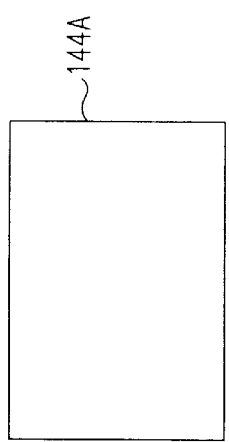
Figure 9F:
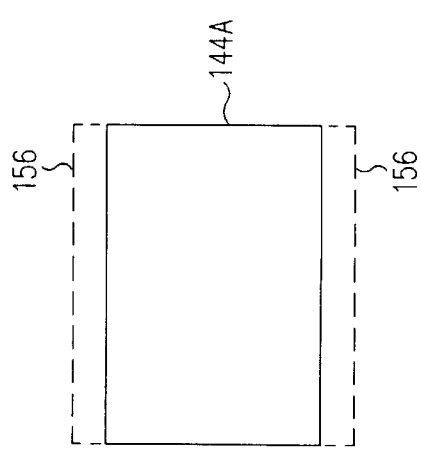

FIGS. 9A–9D are perspective views showing various ways of exposing one or more edges of the heat sink to allow a visual inspection of the attachment between the heat sink and the surface on which it is mounted. In FIG. 9A, the entire periphery of the heat sink 144A is exposed. In FIG. 9B, the opposite shorter edges of heat sink 144A are exposed. In FIG. 9C, the opposite longer edges heat sink 144A are exposed. In FIG. 9D, two opposite edges of heat sink 144A are exposed and plastic capsule 156 is notched to allow segments of the other edges to be exposed. FIGS. 9E–9H are bottom views of the structures illustrated in FIGS. 9A–9E, respectively, where the dashed line represents the edge of the edge of the plastic capsule.

Figure 10B:
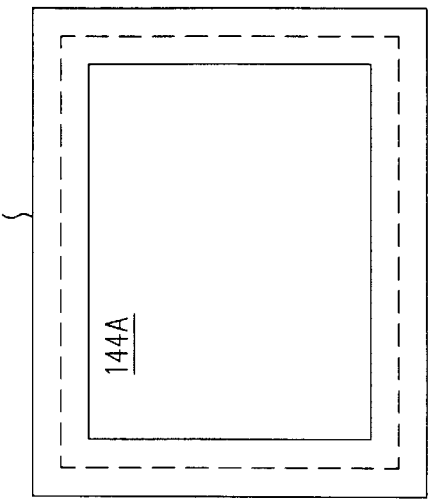
FIGS. 10A and 10B are cross-sectional and bottom views, respectively, of a capsule containing a notched, T-shaped heat sink having a rim to secure the heat sink in the capsule.
Figure 10A:
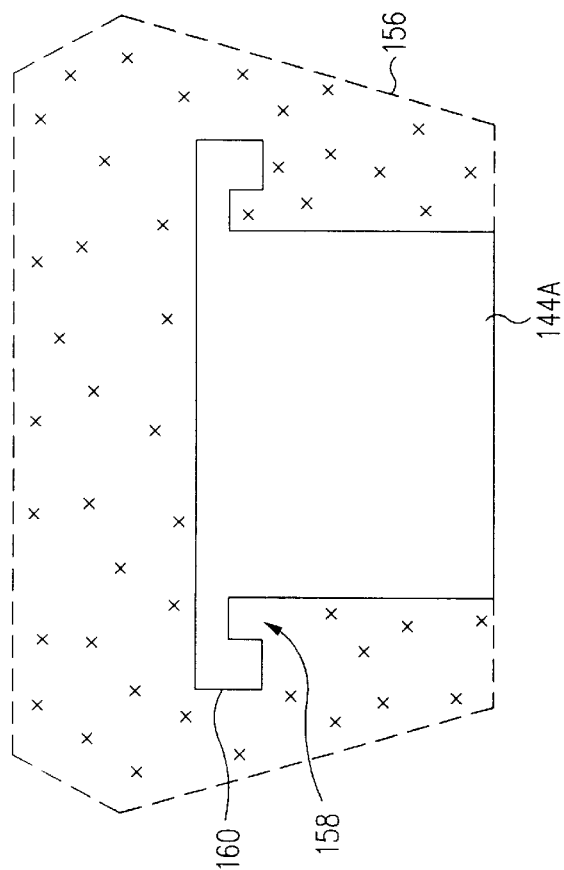

FIG. 10A illustrates a notched, T-shaped heat sink 144A which contains a rim 160, as described above, as well as notch 158 on the underside of rim 160. This arrangement "locks" the heat sink to the plastic capsule 156 and prevents delamination between the heat sink and the overlying die (not shown in FIG. 10A). FIG. 10B is a bottom view of the structure illustrated in FIG. 10A. FIG. 10C illustrates cross-sectional view of a variant in which the bottom of heat sink 144 protrudes slightly from the plastic 156.

Figure 10D:
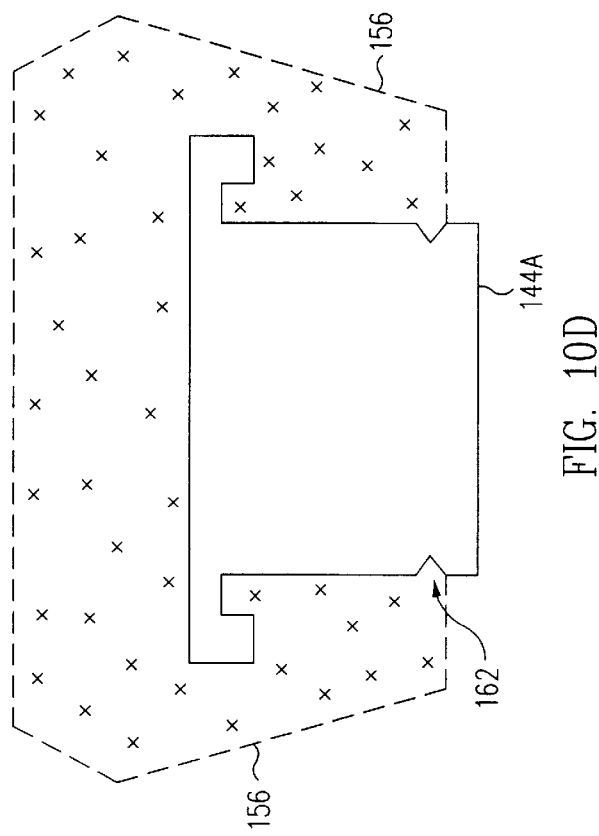
FIG. 10D is a cross-sectional view of a heat sink having a second notch along its side to further secure the heat sink inside the capsule.
Figure 10C:
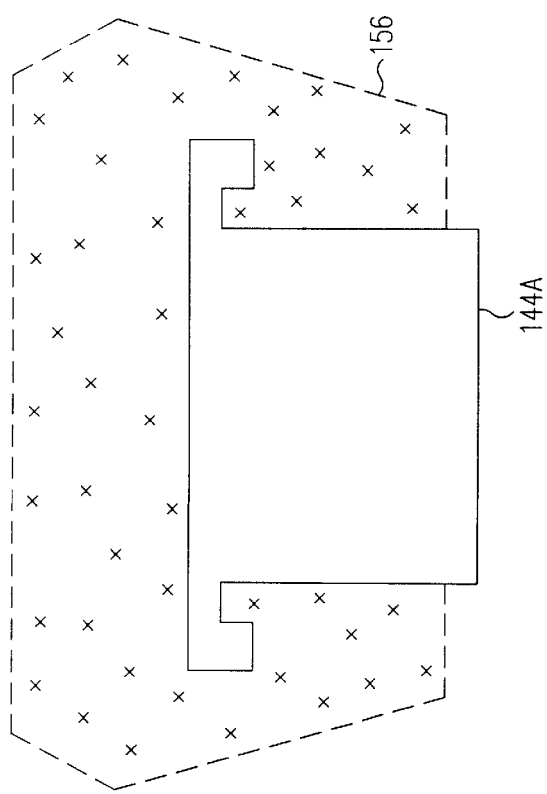
FIG. 10C is a cross-sectional view of a capsule similar to the one illustrated in FIGS. 10A and 10B, except that the heat sink protrudes from the bottom of the plastic capsule.
Figure 10G:
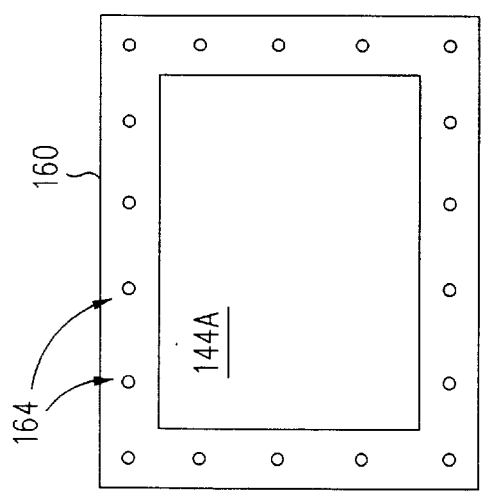
FIGS. 10F and 10G are cross-sectional and bottom views, respectively, of a heat sink having a rim and a series of holes formed in the rim.
Figure 10E:
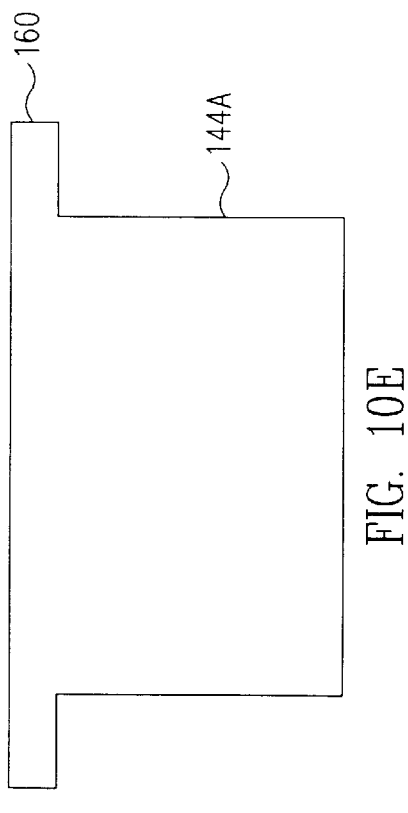
FIG. 10E is a cross-sectional view of a T-shaped heat sink having a rim but no notch.
Figure 10F:
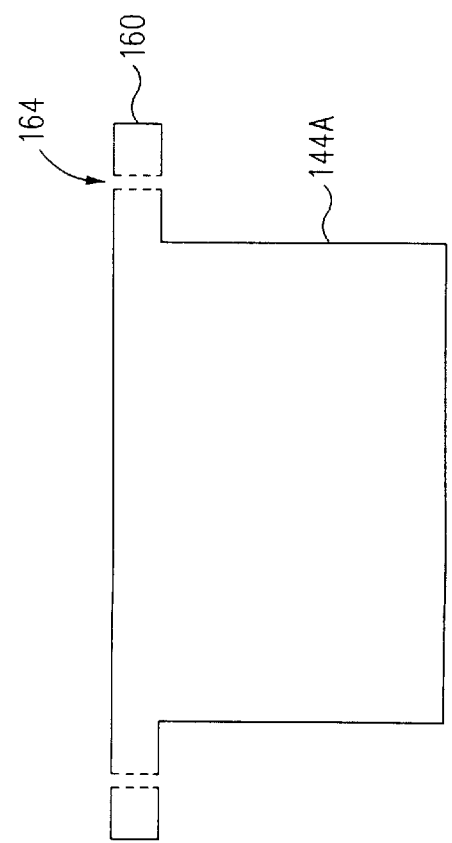

In the arrangement shown in FIG. 10D, a notch 162 is formed near the bottom of heat sink 144A, further strengthening the bond between the plastic and the heat sink. Notch 162 may run along all or portions of the sides of heat sink 144A. FIG. 10E is a cross-sectional view of another form of heat sink 14A containing a rim 160 but no notch. FIGS. 10F and 10G illustrate an alternative heat sink 144A with holes 164 formed at intervals around the rim 160. This further solidifies the attachment between the heat sink and surrounding plastic.

Figure 10I:
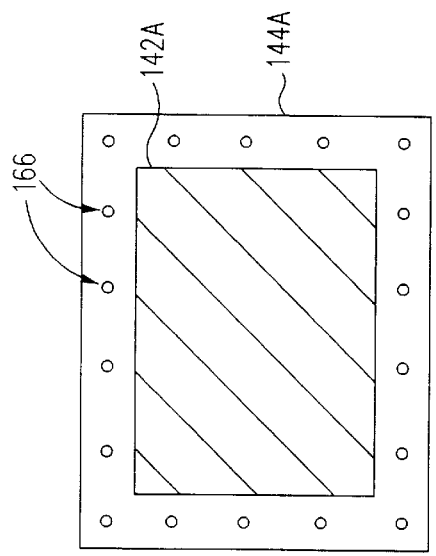
FIGS. 10H and 10I are cross-sectional and bottom views, respectively, of a heat sink having a series of holes or depressions formed around its periphery to further secure the plastic.
Figure 10K:
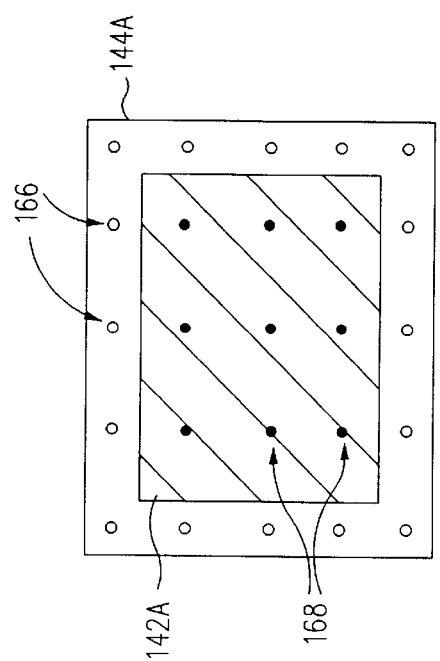
FIGS. 10J and 10K are cross-sectional and bottom views, respectively, of a heat sink and a die, the heat sink having an array of holes or depressions formed in its top surface.
Figure 10H:
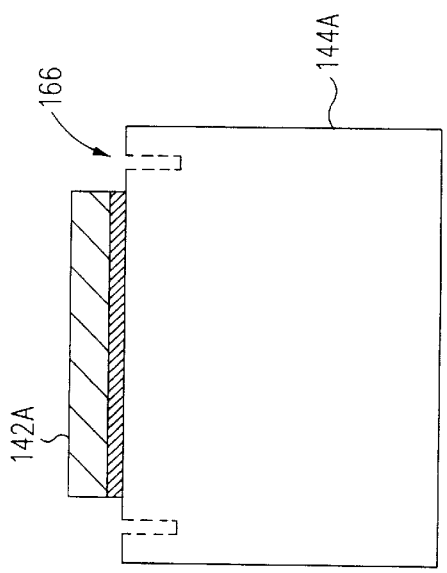
Figure 10J:
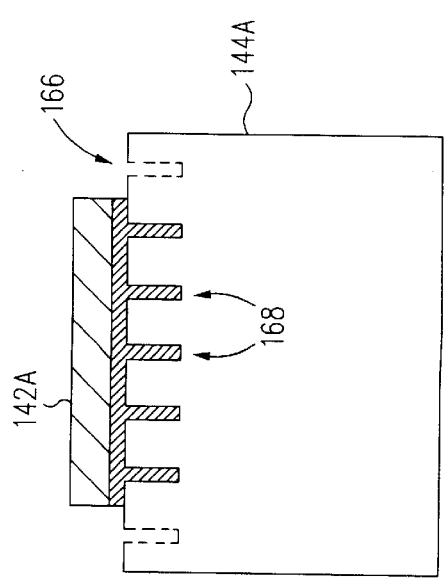

Yet another form of T-shaped heat sink 144 is illustrated in FIGS. 10H and 10I where a series of holes 166 are formed in the top surface of the heat sink. In the embodiment pictured in FIGS. 10J and 10K, holes 168 are also formed where the die 142A is to be located. Holes 168 provide receptacles for the epoxy or solder that is used to attach die 142A and heat sink 144A, thereby improving the bond between these components. Holes 166 and 168 could be 10 to 50 µm in diameter, for example.

Figure 10L:
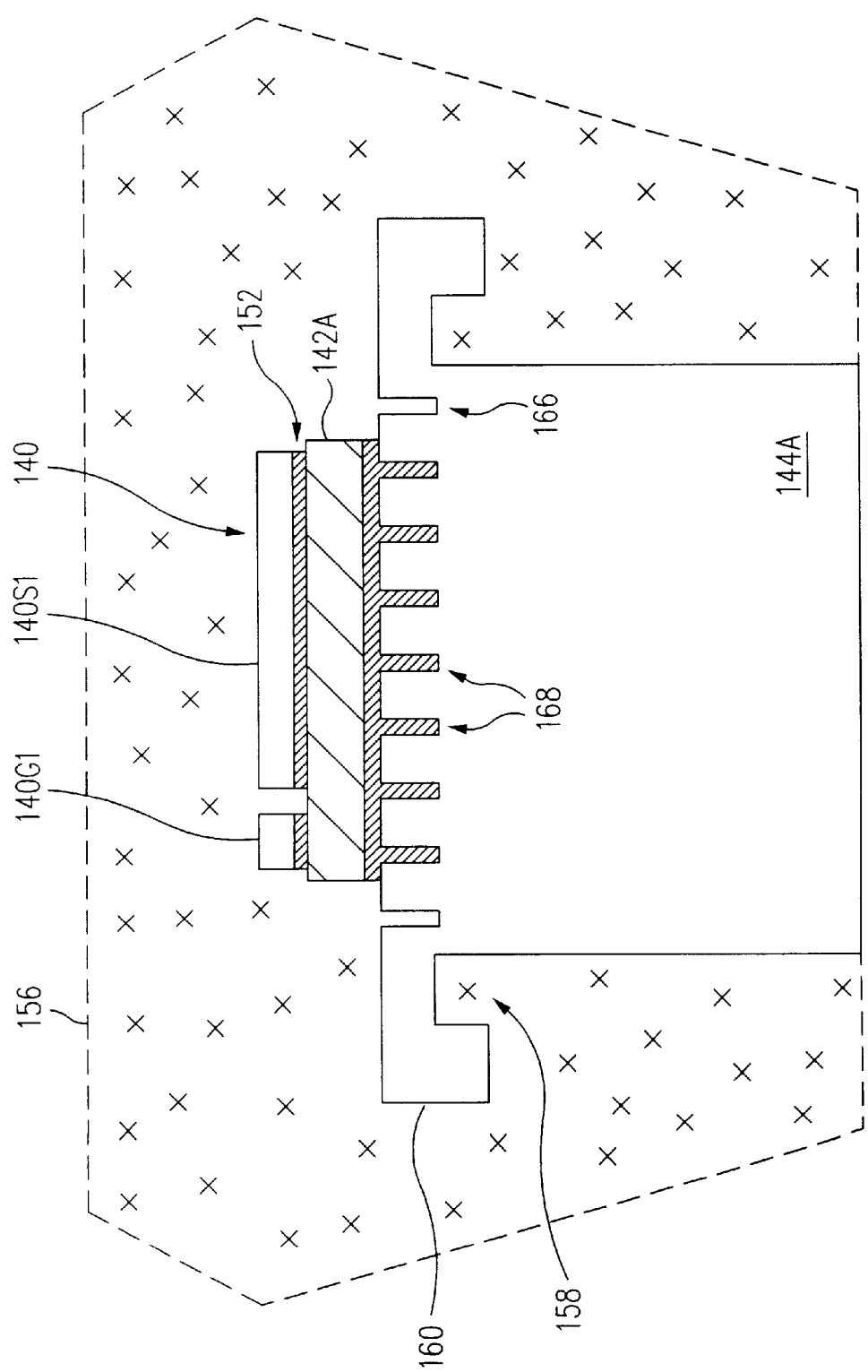
FIG. 10L is a cross-sectional view of a semiconductor package containing several of the features illustrated in FIGS. 10A–10K.

FIG. 10L illustrates an embodiment combining many of the features described above, including rim 160, notch 158, holes 166 filled with plastic and holes 168 filled with the die-attach epoxy or solder.

Figure 11A:
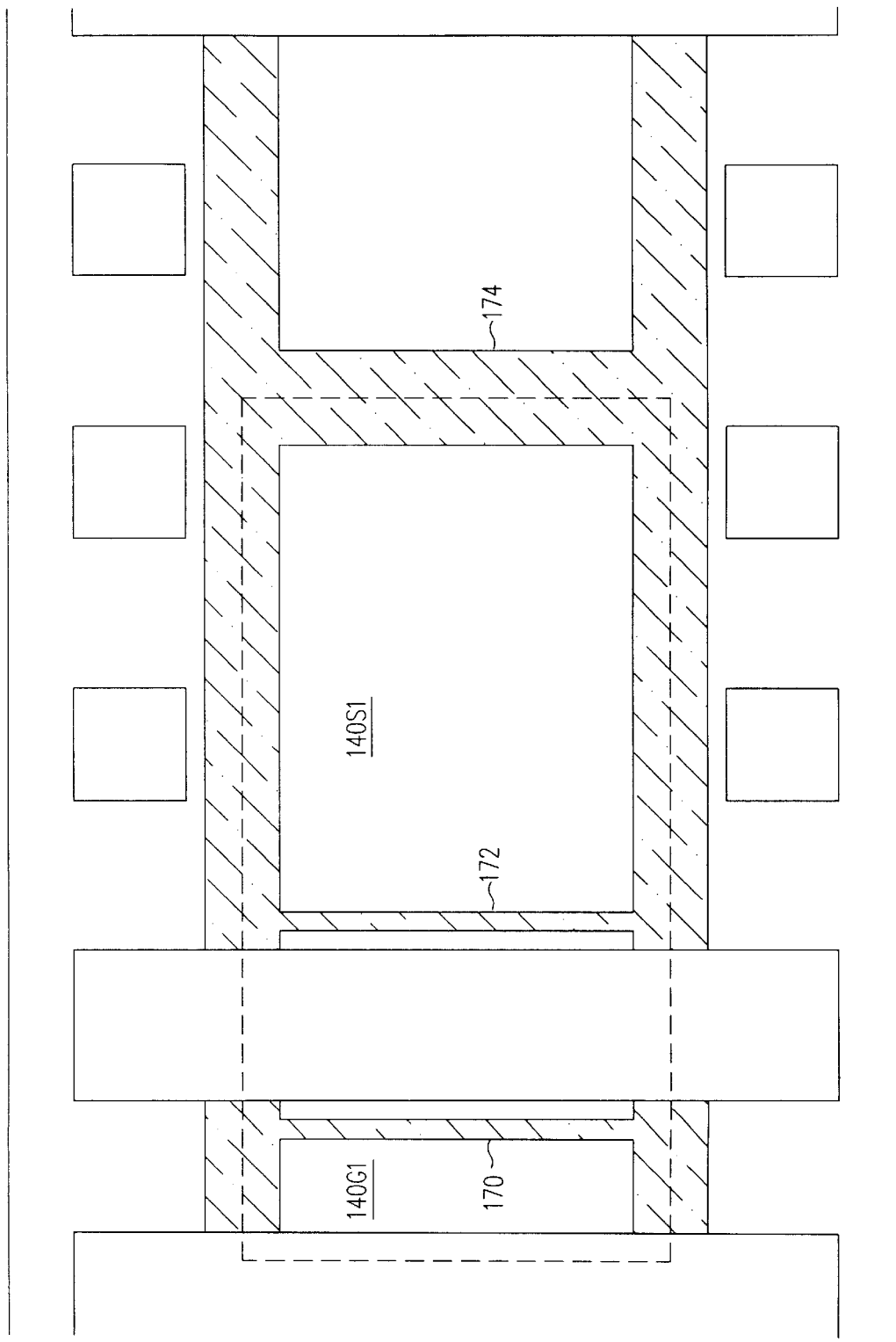

As noted above, a short between adjacent leads may occur as the liquid epoxy or solder spreads out from the pressure between the die and lead frame. A solution to this problem is illustrated in FIGS. 11A and 11B, where moats 170 and 172 are formed in the adjacent leads 140G1 and 140S1. Moats 170 and 172 provide volumes into which the epoxy may expand as lead frame 140 is pressed against die 142A. Moats 170 and 172 are shown as being narrower than the notch 174 overlying the edge of die 142A, but this need not be the case. For example, the moats can be 0.25 to 4 mils wide (typically 1 mil) and 1 to 4 mils deep. Preferably, the depth and width of the moats are equal.

Moats can be formed along the edges of any leads where there is a danger of a short from the spreading epoxy or solder.

Figure 12D:
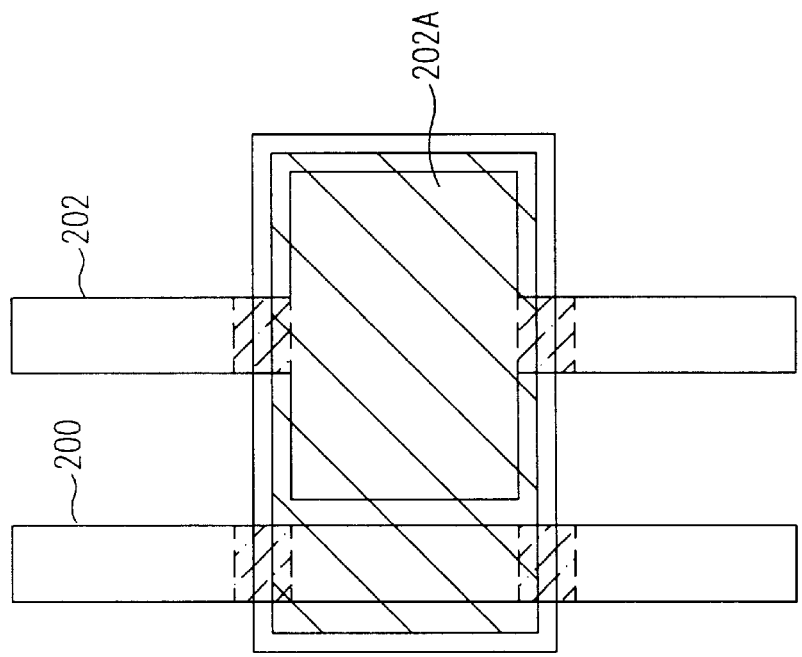
Figure 12C:
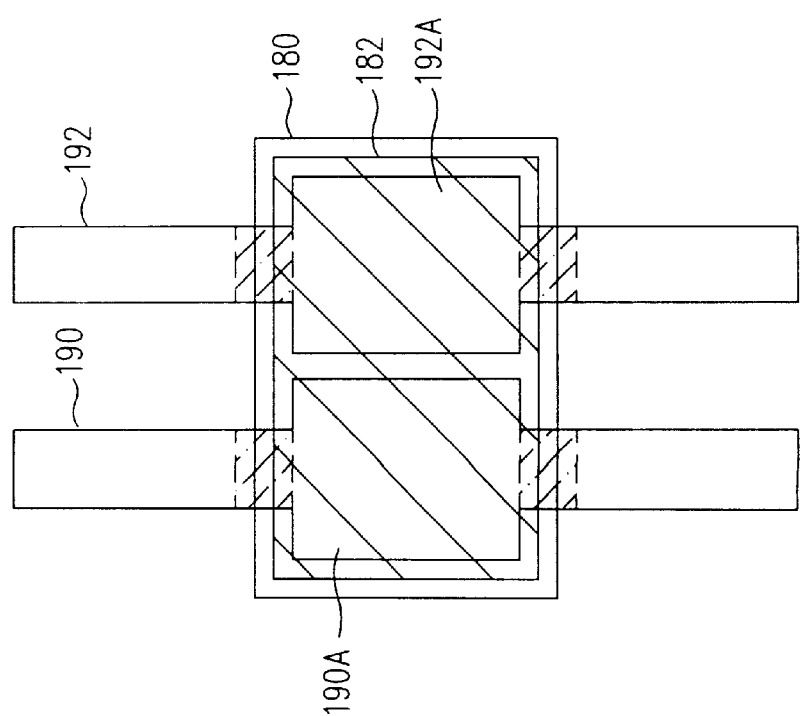
Figure 12F:
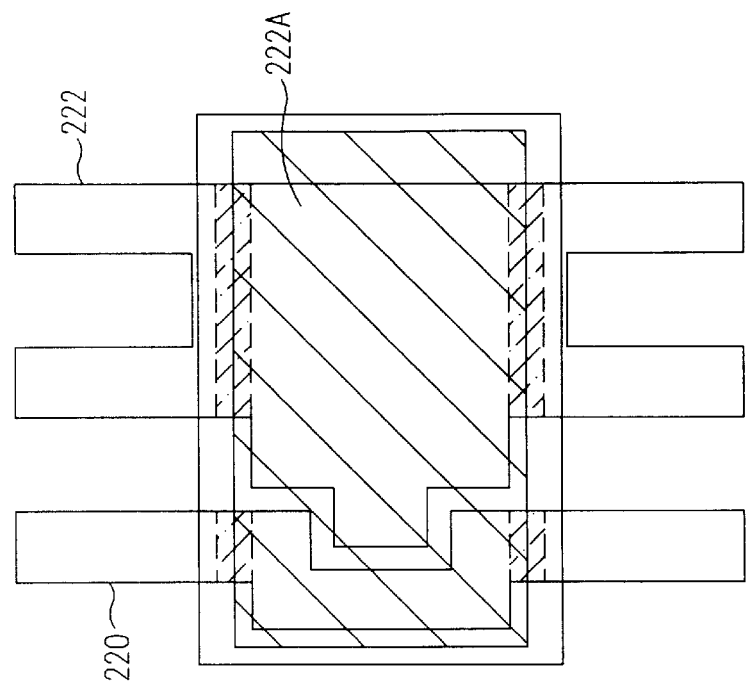
Figure 12E:
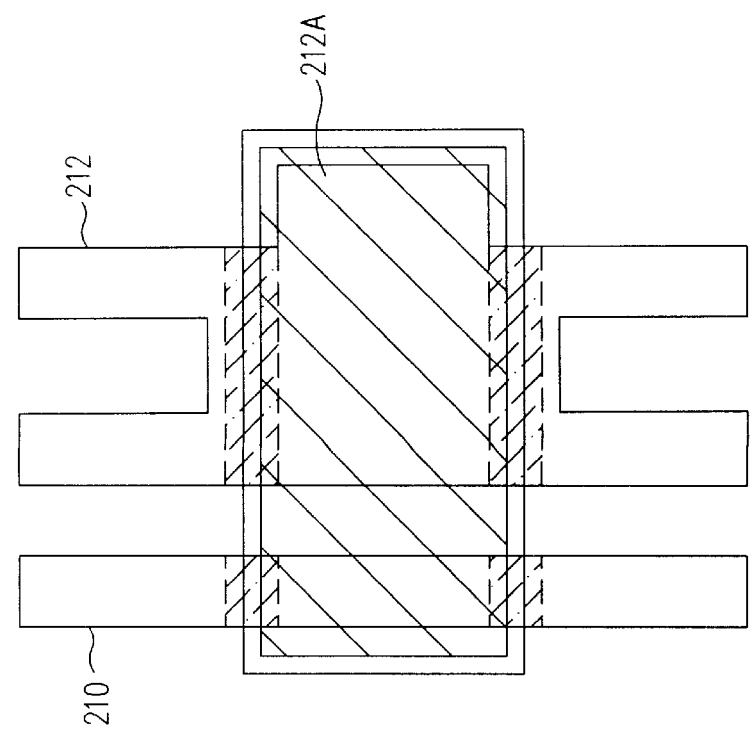

In lead frames according to this invention, the leads can take a wide variety of shapes and patterns. Several possibilities are illustrated in the plan views of FIGS. 12A–12F. FIG. 12A shows strip lead 184 attached to a die 182 and heat sink 180, a structure that is useful for packaging diodes and other two-terminal devices. In FIG. 12B, the lead 184 has a wider portion 184A which contacts the die. FIG. 12C shows leads 190 and 192 having wider portions 190A and 192A, respectively, attached to the die 182, a structure having three separate electrical terminals that is useful for packaging dual diodes, bipolar transistors, power MOSFETs, JFETs, and many other three-terminal devices. In FIG. 12D, a strip lead 200 is combined with a lead 202 having a wider portion 202A. FIG. 12E shows a strip lead 210 combined with a digitated lead 212 having a wider portion 212A, a structure useful for packaging devices having three electrical connections where more than three pins are desired. Finally, FIG. 12F shows a strip lead 220 with an offset portion combined with a digitated lead 222.

Figure 13A:
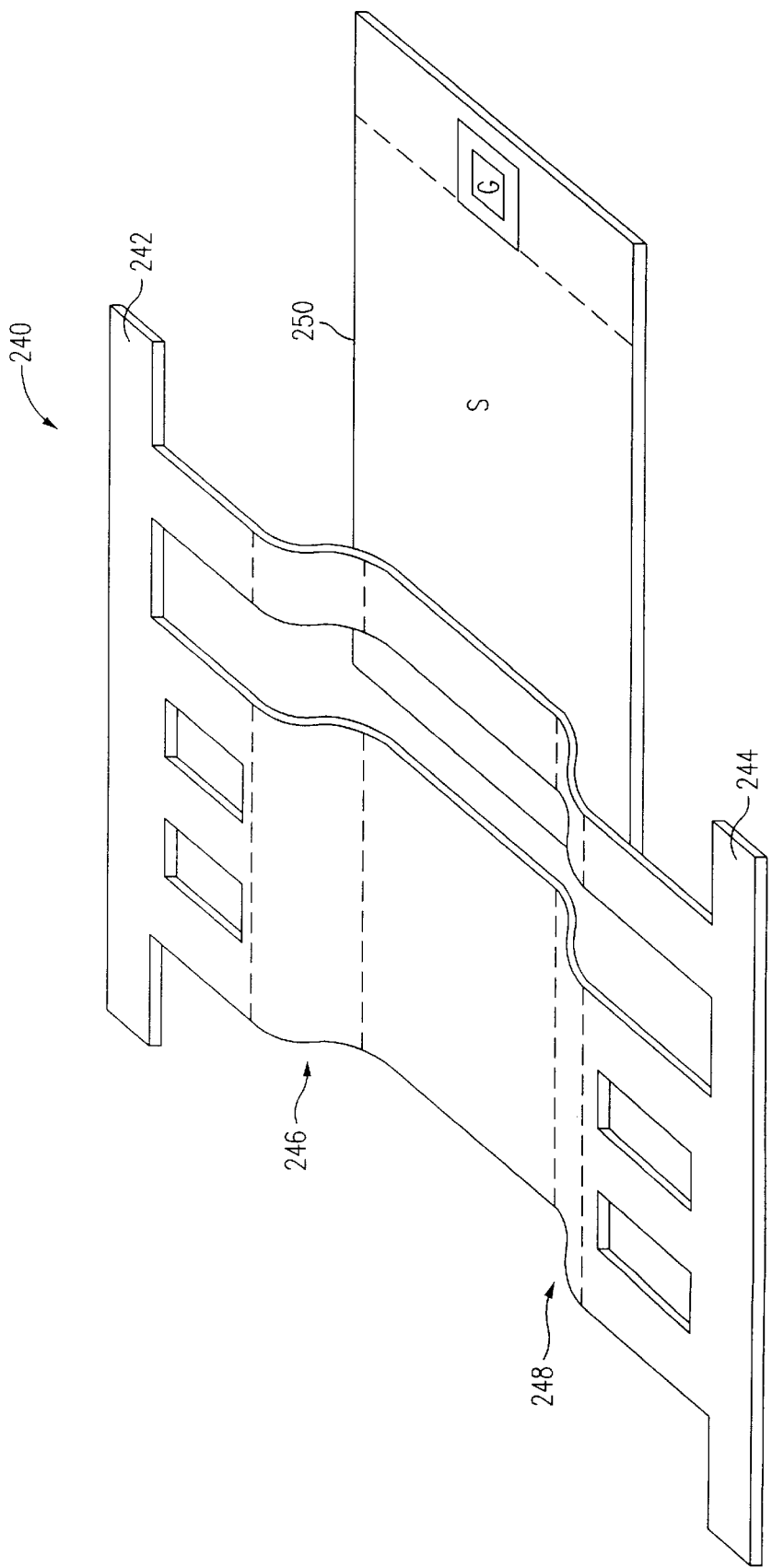
FIGS. 13A–13F illustrate an alternative embodiment in which the lead frame is bent to ensure that it is spaced from the edge of the die.
Figure 13B:
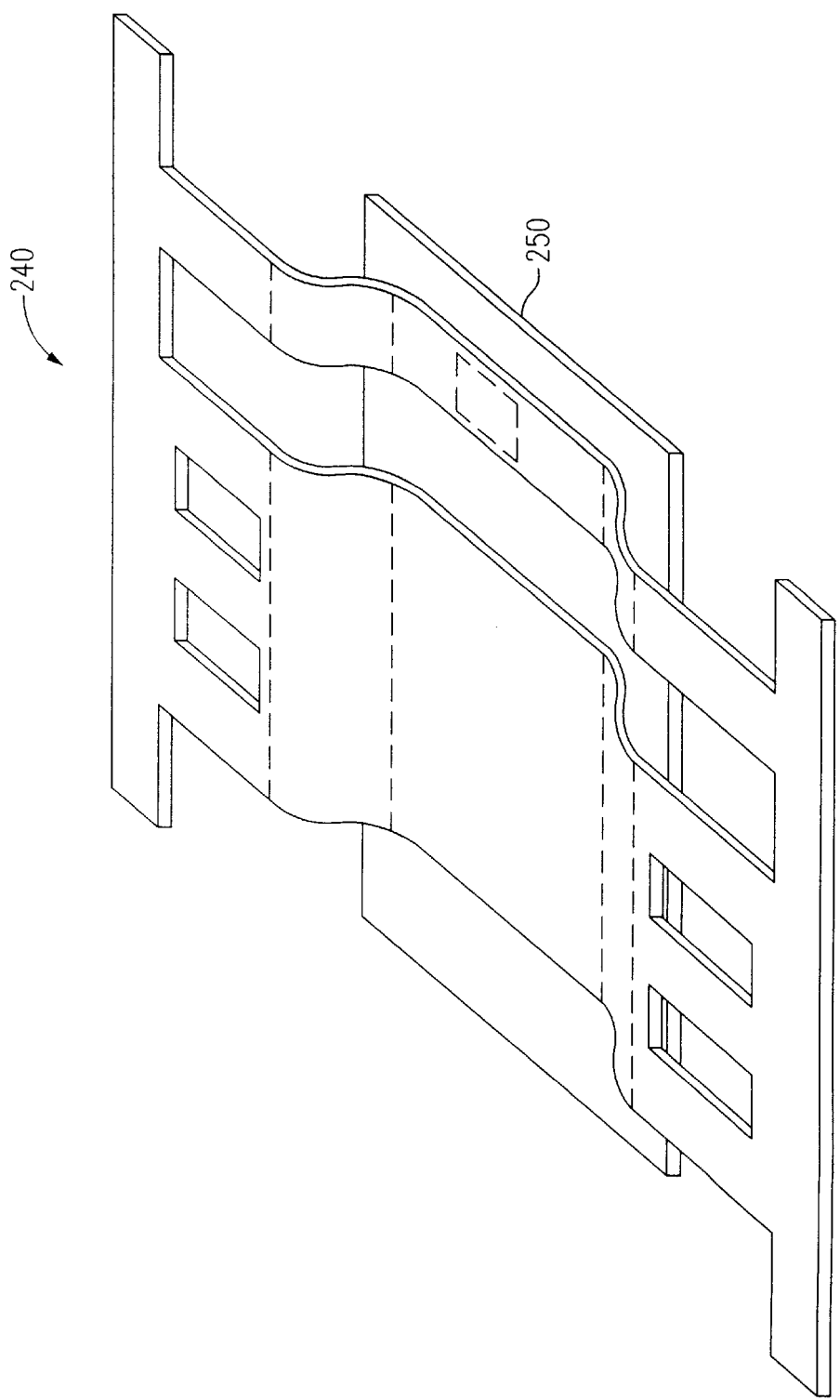
Figure 13C:
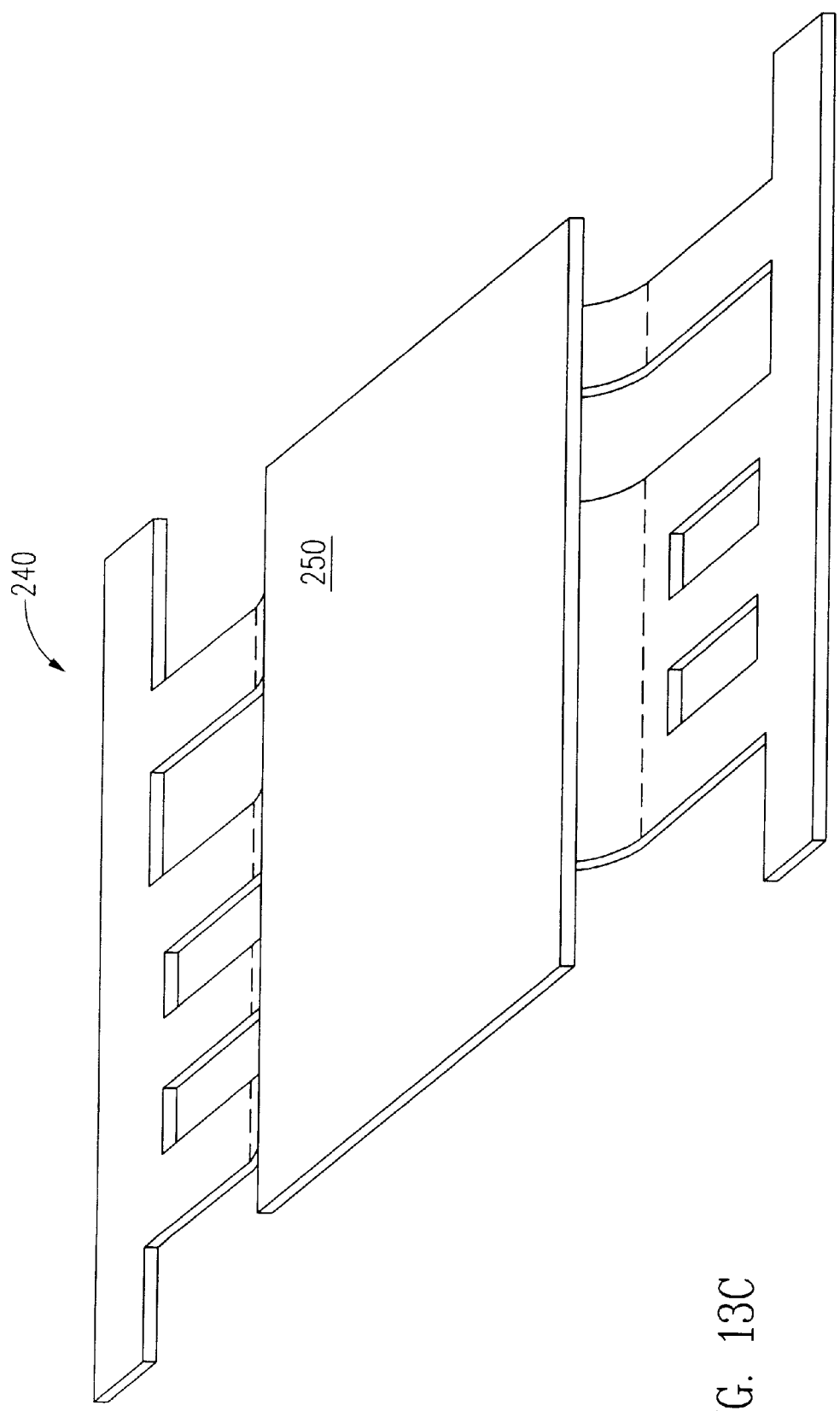
Figure 13D:
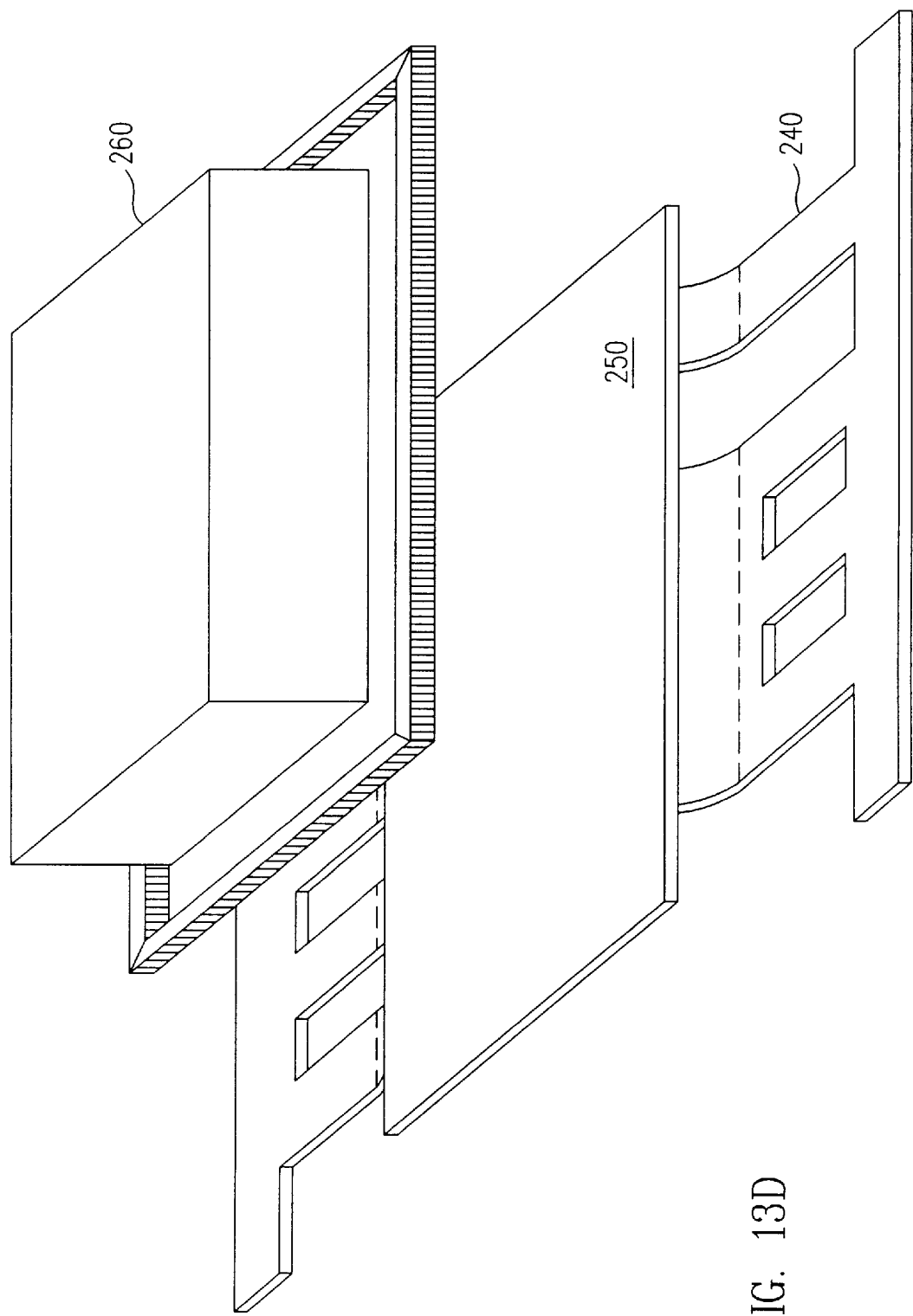
Figure 13E:
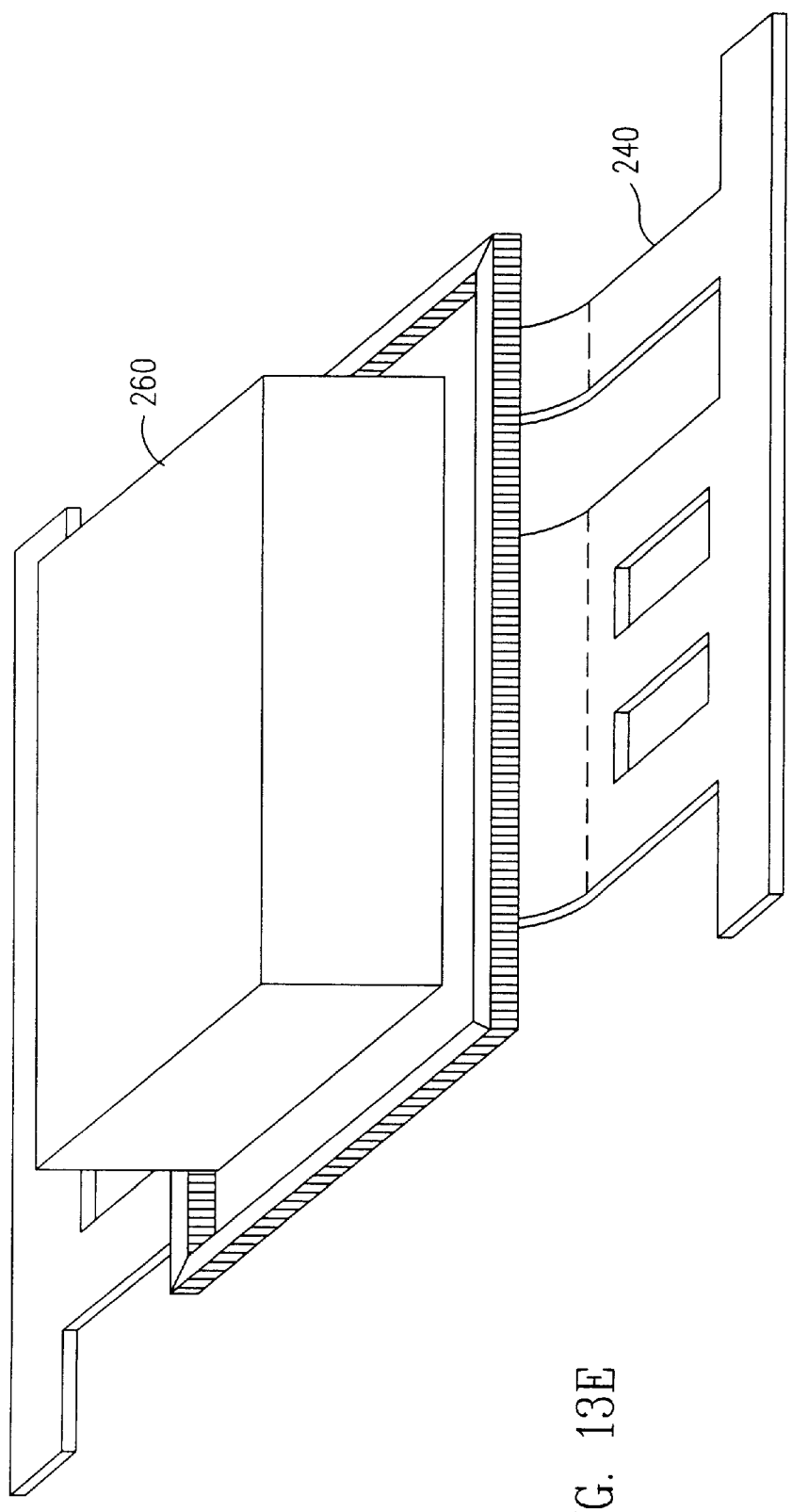
Figure 13F:
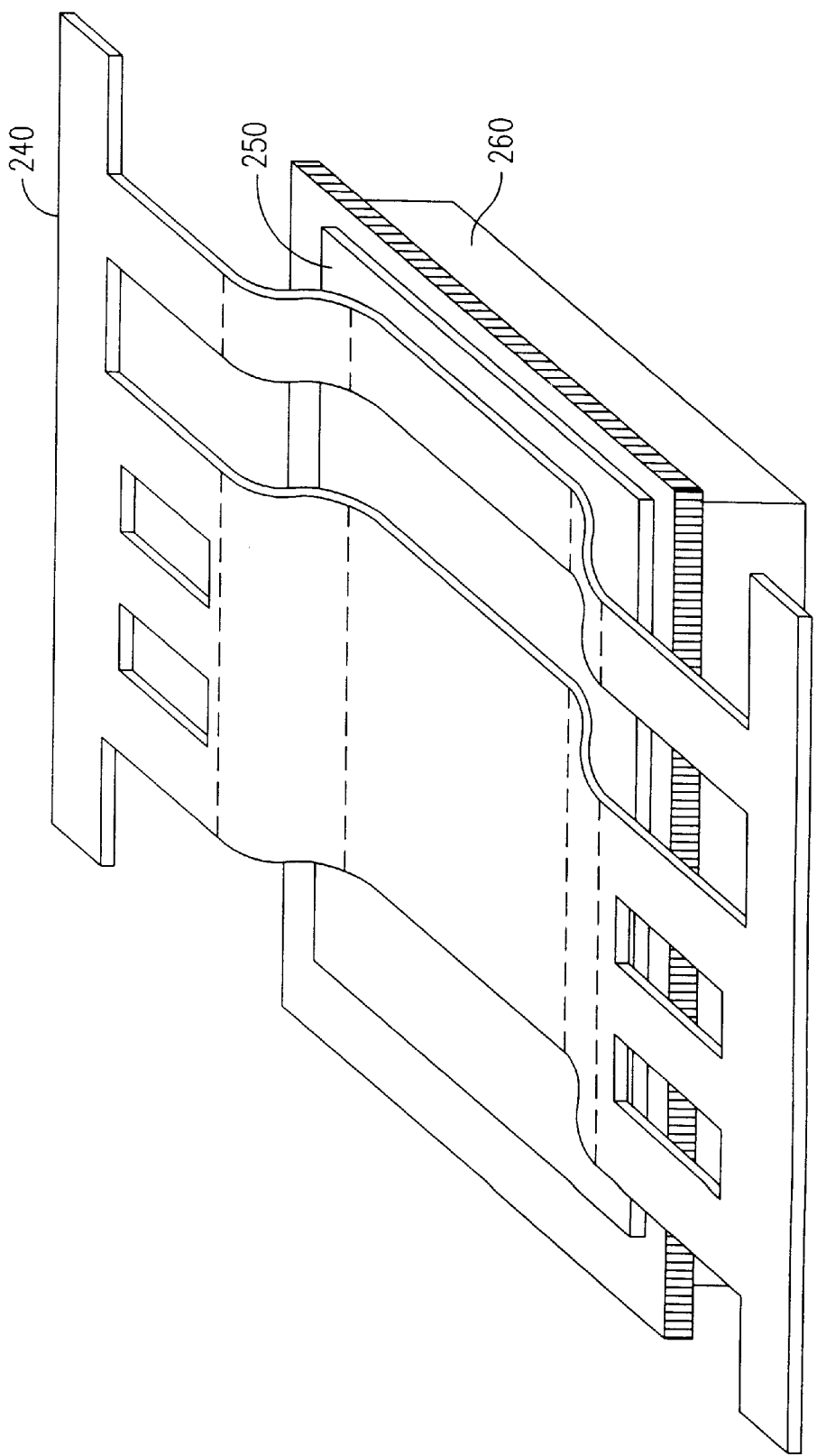

As an alternative to notches overlying the edge of the die, in other embodiments of this invention the lead frame is bent to provide clearance where the lead frame passes over the edge of a die. For example, in FIG. 13A, lead frame 240 contains bends 246 and 248 which provide a spacing between lead frame 240 and the edges of a die 250. FIG. 13B shows lead frame 240 attached to die 250 and FIG. 13C shows the same structure viewed from the bottom of the die. In FIG. 13D, heat sink 260 is attached to the bottom of the die 250. The completed structure is illustrated from the bottom of the heat sink 260 in FIG. 13E and from the top of the lead frame 240 in FIG. 13F.

The disclosure herein is illustrative and not limiting. While particular embodiments in accordance with this invention have been described, it will be apparent to those skilled in the art that the broad principles of this invention include a wide range of alternative embodiments.

What is claimed is:

1. A method of fabricating a semiconductor die package comprising:

providing a semiconductor die having first and second major surfaces;

providing a lead frame, said lead frame comprising a plurality of leads, at least two notches being formed in at least one of said leads;

bonding said lead frame to said first major surface of said die, said at least one of said leads being positioned such that each of said at least two notches overlies an edge of said die;

forming a capsule that encloses said die and a portion of said lead frame, leaving portions of said leads protruding from said capsule;

bending end portions of said leads such that respective surfaces of said end portions of said leads are substantially coplanar.

2. The method of claim 1 comprising attaching a heat sink to said second major surface of said die before forming a capsule.

3. The method of claim 2 wherein attaching a heat sink to said second major surface of said die is performed before bonding said lead frame to said first major surface of said die.

4. The method of claim 2 wherein bonding said lead frame to said first major surface of said die is performed before attaching a heat sink to said second major surface of said die.

5. The method of claim 1 wherein bonding said lead frame to said first major surface of said die comprises bonding said lead frame such that said lead frame is symmetrical about an axis of said die.

6. The method of claim 1 wherein bonding said lead frame to said first major surface of said die comprises applying epoxy to at least one of said first major surface and said lead frame.

7. The method of claim 4 wherein applying epoxy comprises applying epoxy dots.

* * * * *